US010978505B2

(12) United States Patent
Sato et al.

(10) Patent No.: US 10,978,505 B2
(45) Date of Patent: Apr. 13, 2021

(54) SOLID-STATE IMAGING DEVICE INCLUDING A SENSOR SUBSTRATE AND A LOGIC SUBSTRATE

(71) Applicant: RENESAS ELECTRONICS CORPORATION, Tokyo (JP)

(72) Inventors: Hidenori Sato, Ibaraki (JP); Koji Iizuka, Ibaraki (JP); Takeshi Kamino, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 32 days.

(21) Appl. No.: 16/278,941

(22) Filed: Feb. 19, 2019

(65) Prior Publication Data
US 2019/0273108 A1   Sep. 5, 2019

(30) Foreign Application Priority Data

Mar. 2, 2018 (JP) .............................. JP2018-037439

(51) Int. Cl.
*H01L 27/14*   (2006.01)
*H01L 27/146*  (2006.01)
*H01L 23/00*   (2006.01)

(52) U.S. Cl.
CPC ........ *H01L 27/14634* (2013.01); *H01L 24/03* (2013.01); *H01L 24/06* (2013.01); *H01L 24/08* (2013.01); *H01L 24/09* (2013.01); *H01L 24/27* (2013.01); *H01L 24/32* (2013.01); *H01L 24/92* (2013.01); *H01L 24/94* (2013.01); *H01L 27/1469* (2013.01); *H01L 27/14632* (2013.01); *H01L 27/14636* (2013.01); *H01L 27/14687* (2013.01); *H01L 27/1464* (2013.01); *H01L 2224/03616* (2013.01); *H01L 2224/06153* (2013.01); *H01L 2224/08145* (2013.01); *H01L 2224/09153* (2013.01); *H01L 2224/27616* (2013.01); *H01L 2224/32145* (2013.01); *H01L 2224/9211* (2013.01)

(58) Field of Classification Search
CPC ............... H01L 27/14634; H01L 2224/80895
See application file for complete search history.

(56) References Cited

U.S. PATENT DOCUMENTS 8,786,055 B2    7/2014  Kawashima
2013/0105667 A1* 5/2013 Kobayashi ........ H01L 27/14634
                                                250/208.1
2018/0138223 A1* 5/2018 Kotoo .................... H01L 25/07

FOREIGN PATENT DOCUMENTS

JP    2011-114261 A    6/2011

* cited by examiner

Primary Examiner — Lex H Malsawma
Assistant Examiner — Laura M Dykes
(74) Attorney, Agent, or Firm — McDermott Will & Emery LLP

(57) ABSTRACT

A hybrid-bonding-type solid-state imaging device is provided that prevents moisture from entering through the bonded interface and other areas. The solid-state imaging device includes a first interconnect structure over a sensor substrate and a second interconnect structure over a logic substrate, and the first and second interconnect structures are bonded together. At the bonded surface between the first and second interconnect structures, bonding pads formed in the first interconnect structure are bonded to bonding pads formed in the second interconnect structure. Eighth layer portions of a first seal ring formed in the first interconnect structure are bonded to eighth layer portions of a second seal ring formed in the second interconnect structure.

11 Claims, 48 Drawing Sheets

SOLID-STATE IMAGING DEVICE INCLUDING A SENSOR SUBSTRATE AND A LOGIC SUBSTRATE

CROSS-REFERENCE TO RELATED APPLICATIONS

The disclosure of Japanese Patent Application No. 2018-037439 filed on Mar. 2, 2018 including the specification, drawings and abstract is incorporated herein by reference in its entirety.

BACKGROUND

This invention relates to solid-state imaging devices and methods for manufacturing the solid-state imaging devices, and is suitably applicable to, for example, a solid-state imaging device with a sensor substrate and a logic substrate bonded to each other.

Among the solid-state imaging devices are backside illumination solid-state imaging devices that receive light incident from the back surface of the semiconductor substrate (see Japanese Unexamined Patent Application Publication No. 2011-114261). One of this type of the solid-state imaging devices uses a sensor substrate where sensors (photoelectric conversion units) are formed, and a logic substrate where logic circuitry is formed. To manufacture such solid-state imaging devices, firstly, the sensor substrate and logic substrate are created separately in the form of wafers.

Over a surface of the sensor substrate, interconnects are formed to transmit pixel signals generated by the photoelectric conversion units. The interconnects include a plurality of interconnect layers, vias electrically coupling the interconnect layers, and bonding pads. Over a surface of the logic substrate, interconnects are formed to transmit the pixel signals to signal processing circuits. The interconnects include a plurality of interconnect layers, vias electrically coupling the interconnect layers, and bonding pads.

Next, the sensor substrate and logic substrate are bonded to each other with an adhesive (wafer bonding). Subsequently, the sensor substrate and logic substrate in the form of wafers are diced to take out individual solid-state imaging devices. Bonding the bonding pads to each other electrically couples the photoelectric conversion units with the signal processing circuits where the pixel signals are processed.

Each of the solid-state imaging devices taken out by dicing has a seal ring that is preformed in the sensor substrate to prevent moisture from entering a device region where sensors and other components are formed. The seal ring is formed simultaneously with formation of interconnect layers and vias making up the interconnects in the same process. The seal ring is formed by successively stacking interconnect materials, which will be interconnect layers, and via materials, which will be vias. Like the sensor substrate, the logic substrate also has a seal ring preformed by successively stacking interconnect materials, which will be interconnect layers, and via materials, which will be vias, in order to prevent entry of moisture.

SUMMARY

In manufacture of the aforementioned solid-state imaging device, wafer-to-wafer bonding is performed to bond the sensor substrate and logic substrate. During the wafer-to-wafer bonding, the interconnects including the seal ring of the sensor substrate are bonded to the interconnects including the seal ring of the logic substrate. The solid-state imaging device manufactured through the wafer-to-wafer bonding is required to prevent moisture from entering through the bonded interface and other areas.

Other problems and novel features will become apparent from the following description in the specification and the accompanying drawings.

A solid-state imaging device according to an embodiment includes a first substrate, a device region, a first seal ring region, photoelectric conversion units, a first interconnect structure, a second substrate, a circuit region, a second seal ring region, signal processing circuit units, and a second interconnect structure. The first substrate has a first main surface and a second main surface opposed to each other. The device region is defined over the first main surface of the first substrate. The first seal ring region is defined over the first main surface of the first substrate so as to enclose a pixel region. The photoelectric conversion units are formed in the pixel region, and perform photoelectric conversion on incident light to generate pixel signals. The first interconnect structure is formed over the first main surface of the first substrate, and includes a first seal ring disposed in the first seal ring region so as to enclose the device region in plan view. The second substrate has a third main surface and a fourth main surface opposed to each other. The circuit region is defined over the third main surface of the second substrate. The second seal ring region is defined over the third main surface of the second substrate so as to enclose the circuit region. The signal processing circuit units are formed in the circuit region, and process the pixel signals. The second interconnect structure is formed over the third main surface of the second substrate, and includes a second seal ring disposed in the second seal ring region so as to enclose the circuit region in plan view. The first interconnect structure and the second interconnect structure are bonded to each other with the first seal ring and the second seal ring bonded to each other.

The solid-state imaging device according to another embodiment includes a first substrate, a device region, a first seal ring region, photoelectric conversion units, a first interconnect structure, a second substrate, a circuit region, a second seal ring region, signal processing circuit units, and a second interconnect structure. The first substrate has a first main surface and a second main surface opposed to each other. The device region is defined over the first main surface of the first substrate. The first seal ring region is defined over the first main surface of the first substrate so as to enclose a pixel region. The photoelectric conversion units are formed in the pixel region, and perform photoelectric conversion on incident light to generate pixel signals. The first interconnect structure is formed over the first main surface of the first substrate, and includes first bonding pads disposed in the device region in plan view, and a first seal ring disposed in the first seal ring region so as to enclose the device region in plan view. The second substrate has a third main surface and a fourth main surface opposed to each other. The circuit region is defined over the third main surface of the second substrate. The second seal ring region is defined over the third main surface of the second substrate so as to enclose the circuit region. The signal processing circuit units are formed in the circuit region, and process the pixel signals. The second interconnect structure is formed over the third main surface of the second substrate, and includes second bonding pads disposed in the circuit region in plan view, and a second seal ring disposed in the second seal ring region so as to enclose the circuit region in plan view. The first interconnect structure and the second interconnect structure are bonded to each other with the first bonding pads and the second bonding pads bonded to each other. The bonded interface between the first interconnect structure and the second interconnect structure is separated from the first seal ring by a distance corresponding to the thickness of the first bonding pads. The bonded interface is separated from the second seal ring by a distance corresponding to the thickness of the second bonding pads.

A method for manufacturing a solid-state imaging device according to still another embodiment includes the following steps. A device region, which includes a pixel region, and a first seal ring region, which encloses the device region, are defined over a first main surface of a first substrate having the first main surface and a second main surface opposed to each other. Photoelectric conversion units, which perform photoelectric conversion on incident light to generate pixel signals, are formed in the pixel region of the first substrate. A first interconnect structure, which includes first interconnects electrically coupled to the photoelectric conversion units, is formed over the first main surface of the first substrate. A circuit region and a second seal ring region, which encloses the circuit region, are defined over a third main surface of a second substrate having the third main surface and a fourth main surface opposed to each other. Signal processing circuit units, which process the pixel signals, are formed in the circuit region. A second interconnect structure, which includes second interconnects electrically coupled to the signal processing circuit units, is formed over the third main surface of the second substrate. The first interconnect structure and the second interconnect structure are bonded to each other. The step of forming the first interconnect structure includes a step of forming the first seal ring in the first seal ring region simultaneously with formation of the first interconnects. The step of forming the second interconnect structure includes a step of forming the second seal ring in the second seal ring region simultaneously with formation of the second interconnects. In the step of bonding the first interconnect structure and the second interconnect structure, the first interconnect structure and the second interconnect structure are bonded to each other with the first seal ring and the second seal ring bonded to each other.

The solid-state imaging device according to one of the embodiments can prevent moisture from entering through the bonded interface and other areas.

The solid-state imaging device according to the other embodiment can prevent moisture from entering through the bonded interface and other areas.

The method for manufacturing the solid-state imaging device according to still the other embodiment can manufacture a solid-state imaging device capable of preventing moisture from entering through the bonded interface and other areas.

DETAILED DESCRIPTION

First Embodiment

An exemplary solid-state imaging device according to the first embodiment will be described. The solid-state imaging device described herein is in the form of a wafer for the convenience of description.

Figure 1:
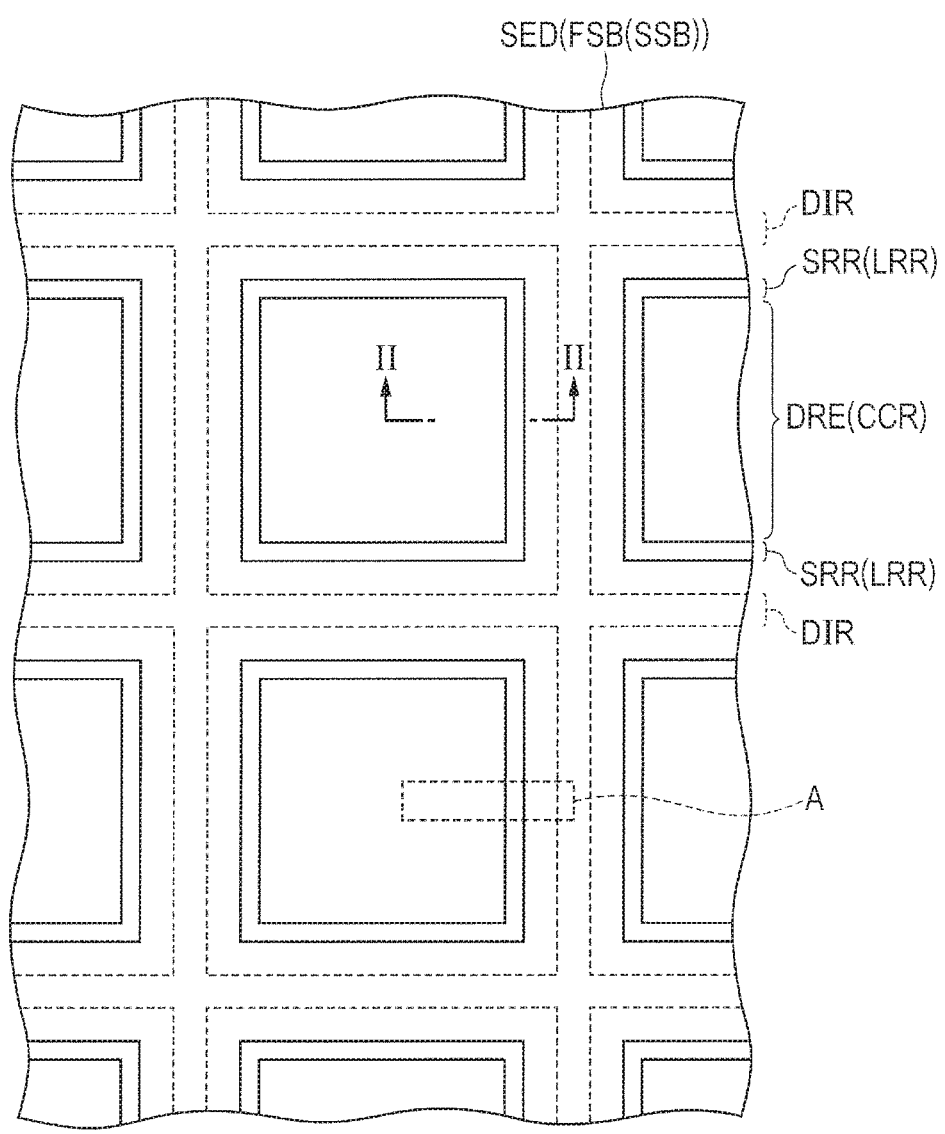
FIG. 1 is a partial plan view showing an exemplary planar pattern of a solid-state imaging device according to embodiments.
Figure 2:
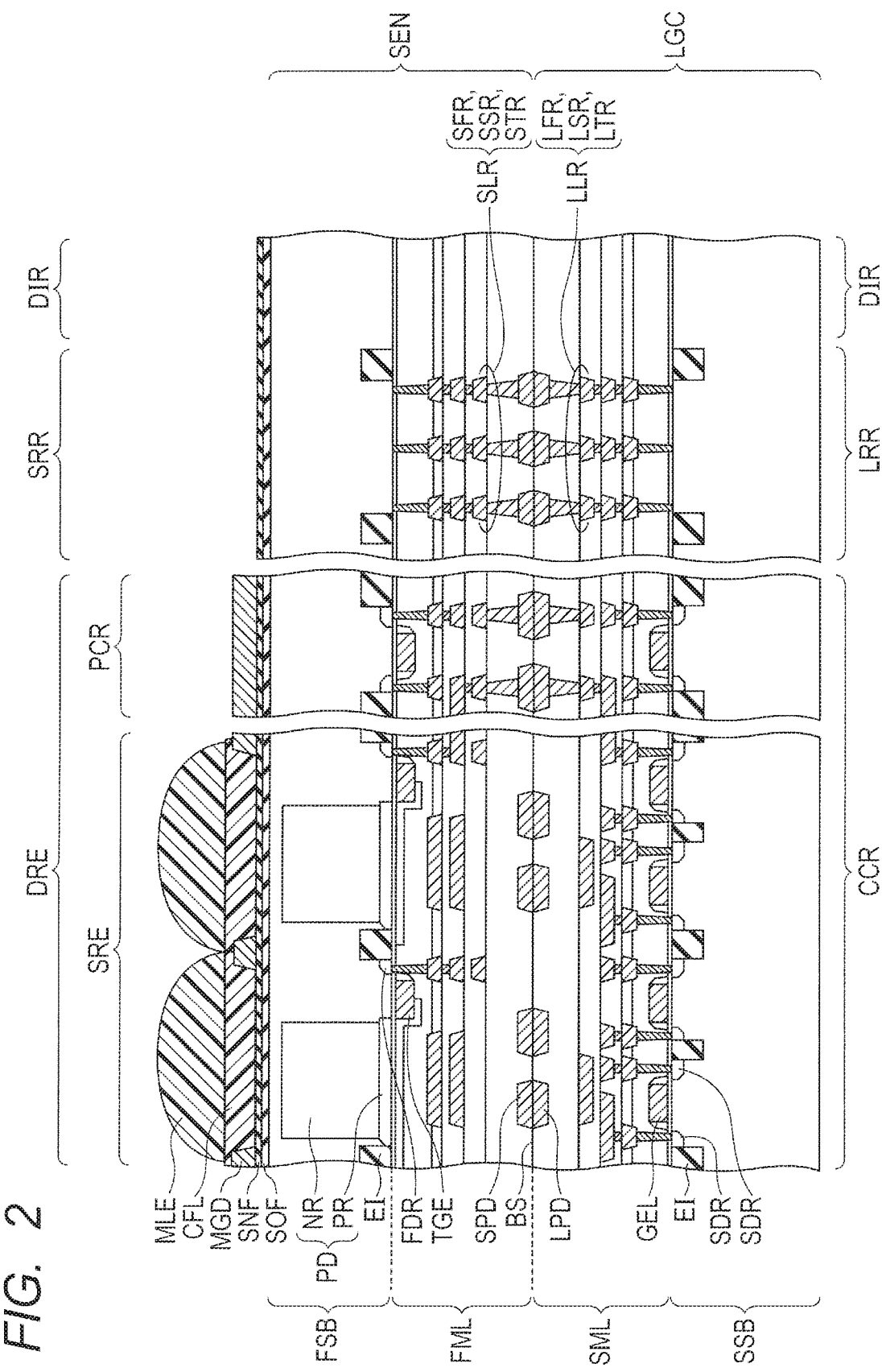
FIG. 2 is a cross-sectional view of a solid-state imaging device, taken along a cross-sectional line II-II in FIG. 1, according to the first embodiment.
Figure 3:
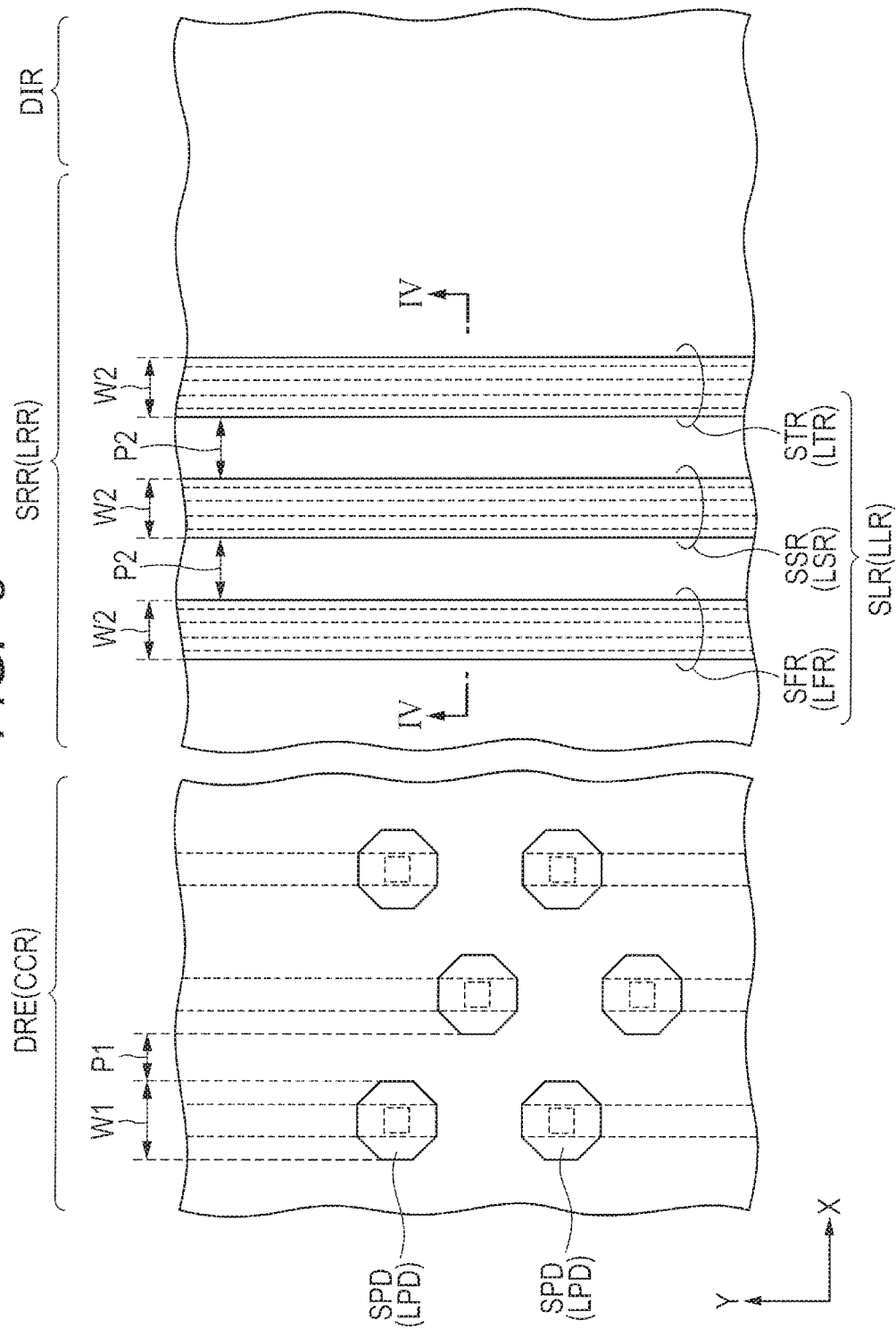
FIG. 3 is a partially-enlarged plan view showing an exemplary planar pattern at a bonded interface of the solid-state imaging device according to the first embodiment, the bonded interface being cut out along a dotted frame A shown in FIG. 1.

As shown in FIGS. 1, 2 and 3, the solid-state imaging device has a device region DRE, a first seal ring region SRR, and a dicing region DIR that are defined on a surface (first main surface) side of a first semiconductor substrate FSB with device isolation insulating films EI. The device region DRE includes a sensor region SRE and a peripheral circuit region PCR defined therein. In the sensor region SRE, photodiodes PD (photoelectric conversion units) are formed.

Furthermore, a first interconnect structure FML is formed over the surface (first main surface) of the first semiconductor substrate FSB to transmit pixel signals generated by the photodiodes PD. The first interconnect structure FML includes a plurality of interconnect layers, vias electrically coupling the interconnect layers, bonding pads SPD, and a first seal ring SLR. The size (X direction) of the bonding pads SPD is set to a size W1. The pitch (X direction) between the bonding pads SPD is set to a pitch P1. The first semiconductor substrate FSB and the first interconnect structure FML make up a sensor substrate SEN.

On a surface (third main surface) side of a second semiconductor substrate SSB, a circuit region CCR, a second seal ring region LRR, and a dicing region DIR are defined with device isolation insulating films EI. In the circuit region CCR formed are metal oxide semiconductor (MOS) transistors each including a gate electrode GEL and source/drain diffusion layers SDR, and some other components. A MOS transistor and the other components make up a signal processing circuit that processes a pixel signal.

Furthermore, a second interconnect structure SML is formed over the surface (third main surface) of the second semiconductor substrate SSB to transmit pixel signals to the signal processing circuits. The second interconnect structure SML includes a plurality of interconnect layers, vias electrically coupling the interconnect layers, and bonding pads LPD. The size (X direction) of the bonding pads LPD is set to a size W1. The pitch (X direction) between the bonding pads LPD is set to a pitch P1. The second semiconductor substrate SSB and the second interconnect structure SML make up a logic substrate LGC.

The following describes the seal rings. As shown in FIGS. 1 and 2, the first seal ring SLR is formed in the first seal ring region SRR of the sensor substrate SEN. The first seal ring SLR is formed so as to continuously enclose the device region DRE in plan view. The first seal ring SLR includes, for example, a first seal ring's first section SFR, a first seal ring's second section SSR, and a first seal ring's third section STR.

The first seal ring's second section SSR is arranged apart from the first seal ring's first section SFR so as to enclose the first seal ring's first section SFR. The first seal ring's third section STR is arranged apart from the first seal ring's second section SSR so as to enclose the first seal ring's second section SSR. The width of the first seal ring's first section SFR, first seal ring's second section SSR, and first seal ring's third section STR is set to a width W2. The distance between the sections of the first seal ring SLR is set to a distance P2.

The second seal ring LLR is formed in the second seal ring region LRR of the logic substrate LGC. The second seal ring LLR is formed so as to continuously enclose the circuit region CCR in plan view. The second seal ring LLR includes, for example, a second seal ring's first section LFR, a second seal ring's second section LSR, and a second seal ring's third section LTR.

The second seal ring's second section LSR is arranged apart from the second seal ring's first section LFR so as to enclose the second seal ring's first section LFR. The second seal ring's third section LTR is arranged apart from the second seal ring's second section LSR so as to enclose the second seal ring's second section LSR. The width of the second seal ring's first section LFR, second seal ring's second section LSR, and second seal ring's third section LTR is set to a width W2. The distance between the sections of the second seal ring LLR is set to a distance P2.

The size W1 of the bonding pads SPD (bonding pads LPD) is set to, for example, a value equal to or greater than the width W2 of the first seal ring SLR (second seal ring LLR) (size W1≥width W2). The distance P2 between the sections of the first seal ring SLR (second seal ring LLR) is set to, for example, a value equal to or greater than the pitch P1 of the bonding pads SPD (bonding pads LPD) (distance P2≥pitch P1).

Figure 4:
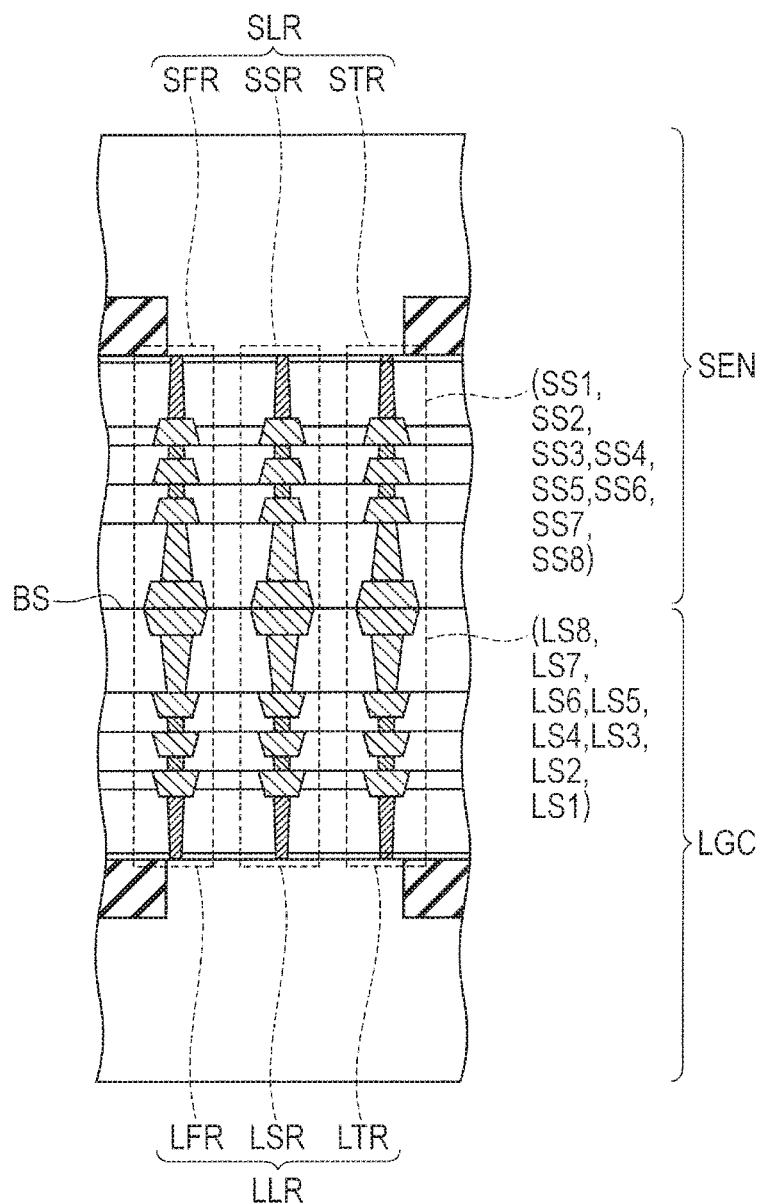
FIG. 4 is a partial cross-sectional view of the solid-state imaging device, taken along a cross-sectional line IV-IV in FIG. 3, according to the first embodiment.

In addition, as shown in FIG. 4, each of the first seal ring's first section SFR, first seal ring's second section SSR, and first seal ring's third section STR is made up of a first layer portion SS1, a second layer portion SS2, a third layer portion SS3, a fourth layer portion SS4, a fifth layer portion SS5, a sixth layer portion SS6, a seventh layer portion SS7, and an eighth layer portion SS8. As will be described later, the first layer portions SS1 to eighth layer portions SS8 are formed simultaneously with formation of the interconnect layers or vias in the process of forming the first interconnect structure FML.

Each of the second seal ring's first section LFR, second seal ring's second section LSR, and second seal ring's third section LTR is made up of a first layer portion LS1, a second layer portion LS2, a third layer portion LS3, a fourth layer portion LS4, a fifth layer portion LS5, a sixth layer portion LS6, a seventh layer portion LS7, and an eighth layer portion LS8. As will be described later, the first layer portions LS1 to eighth layer portions LS8 are formed simultaneously with formation of the interconnect layers or vias in the process of forming the second interconnect structure SML.

In the solid-state imaging device SED, the sensor substrate SEN and logic substrate LGC are bonded to each other. At the bonded interface BS between the sensor substrate SEN and logic substrate LGC, the bonding pads SPD of the sensor substrate SEN are bonded to the bonding pads LPD of the logic substrate LGC. Bonding the bonding pads SPD to the bonding pads LPD electrically couples the photodiodes PD to the signal processing circuit units, thereby processing pixel signals.

In addition, at the bonded interface BS, the eighth layer portions SS8 of the first seal ring SLR are bonded to the eighth layer portions LS8 of the second seal ring LLR. Bonding the eighth layer portions SS8 to the eighth layer portions LS8 can prevent entry of moisture. Other areas except at least the bonding pads SPD, LPD and eighth layer portions SS8, LS8, insulating films (interlayer insulating films) are bonded to each other. The scheme to bond the bonding pads, other components, and insulating films all together is called hybrid bonding. The solid-state imaging device SED in the form of a wafer is configured as described above.

Figure 5:
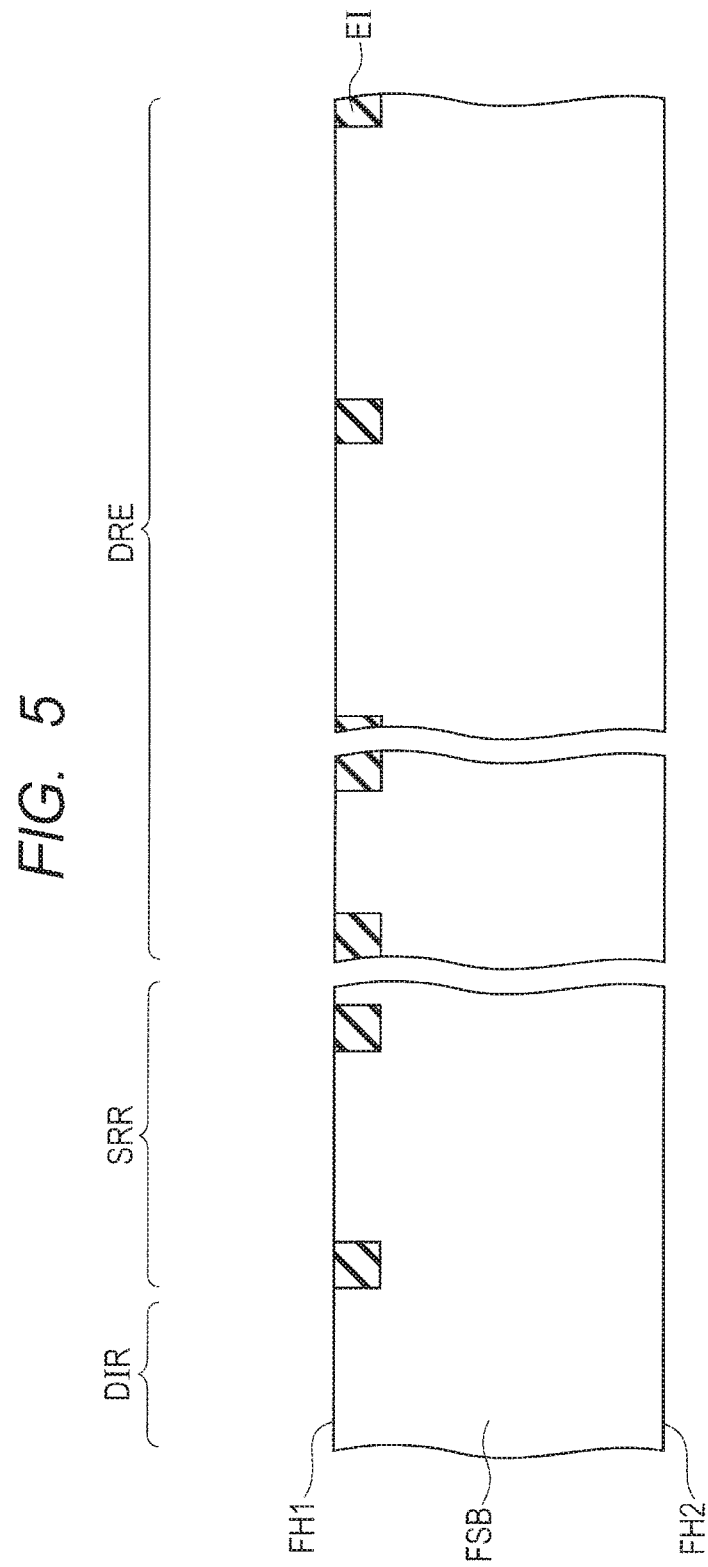
FIG. 5 is a cross-sectional view showing a process step for manufacturing the solid-state imaging device according to the first embodiment.

Next, an exemplary method for manufacturing the aforementioned solid-state imaging device will be described. Firstly, a description will be given about a method for manufacturing a sensor substrate. As shown in FIG. 5, a first semiconductor substrate FSB having a first main surface FH1 and a second main surface FH2 opposed to each other is provided. Then, device isolation insulating films EI are formed on the first main surface FH1 side of the first semiconductor substrate FSB to define a device region DRE, a first seal ring region SRR, and a dicing region DIR.

Figure 6:
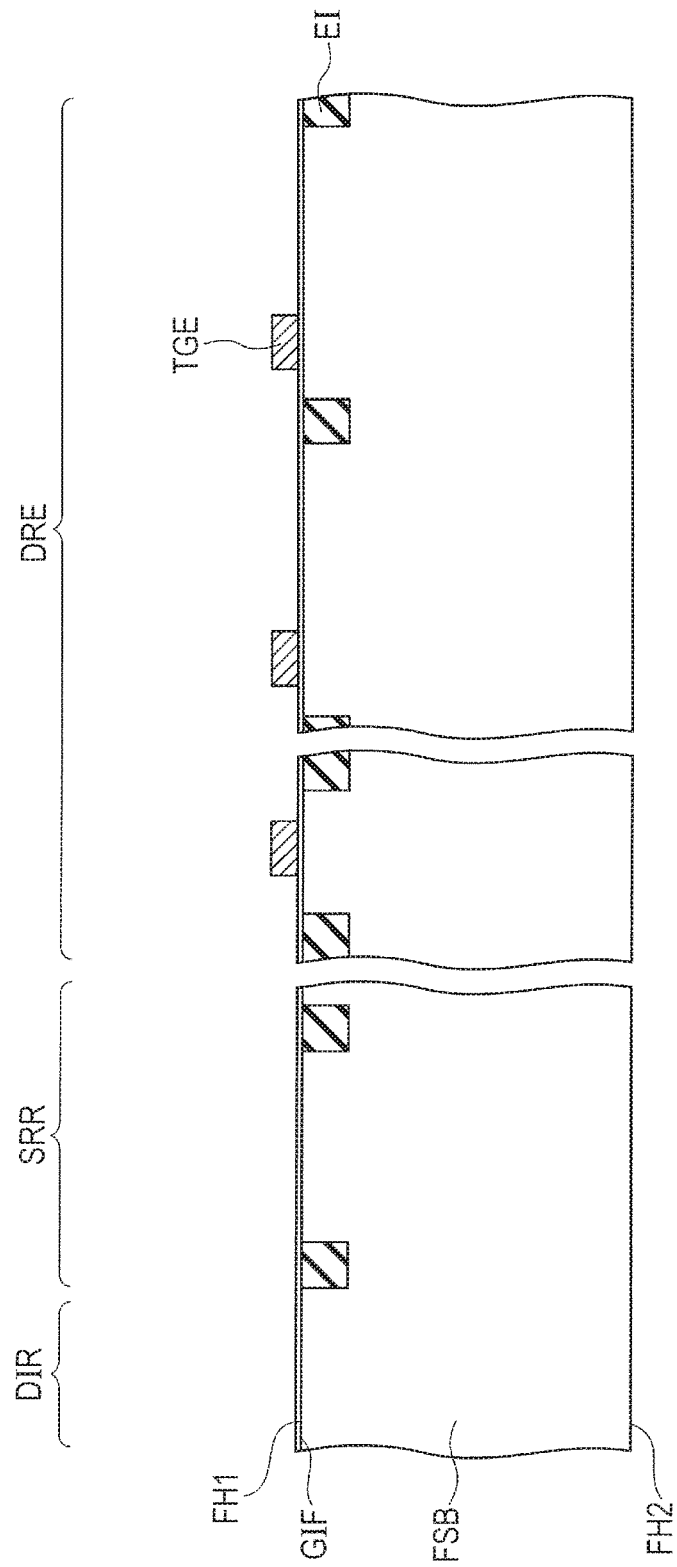
FIG. 6 is a cross-sectional view showing a process step subsequent to the process step shown in FIG. 5 in the first embodiment.
Figure 7:
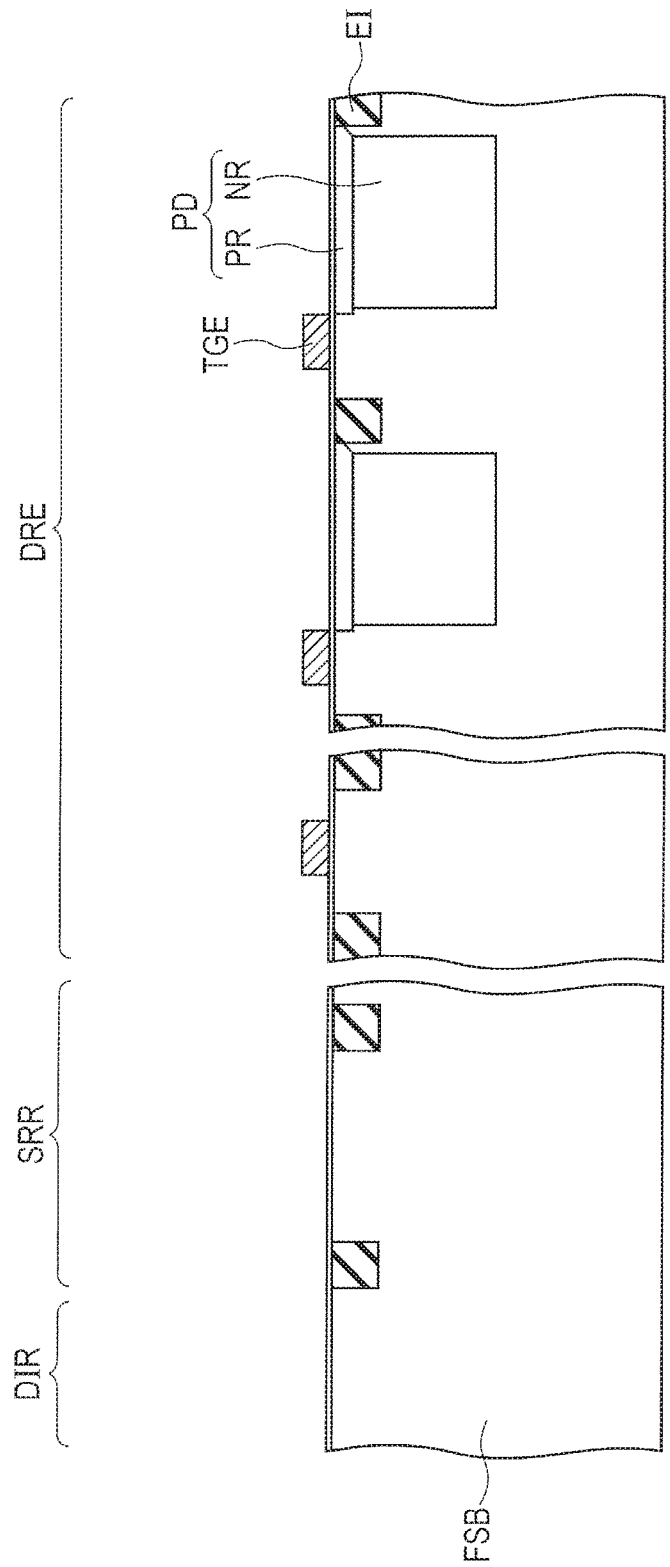
FIG. 7 is a cross-sectional view showing a process step subsequent to the process step shown in FIG. 6 in the first embodiment.

Next, as shown in FIG. 6, a gate insulating film GIF is formed over the first main surface FH1 of the first semiconductor substrate FSB by, for example, a thermal oxidation method. Then, for example, a polysilicon film (not shown) is formed so as to cover the gate insulating film GIF. The polysilicon film is then subjected to a photolithographic process and etching process to form gate electrodes TGE and some other components. Subsequently, as shown in FIG. 7, a predetermined photolithographic process and ion implantation process are performed to form photodiodes PD each including an n-type region NR and a p-type region PR.

Figure 8:
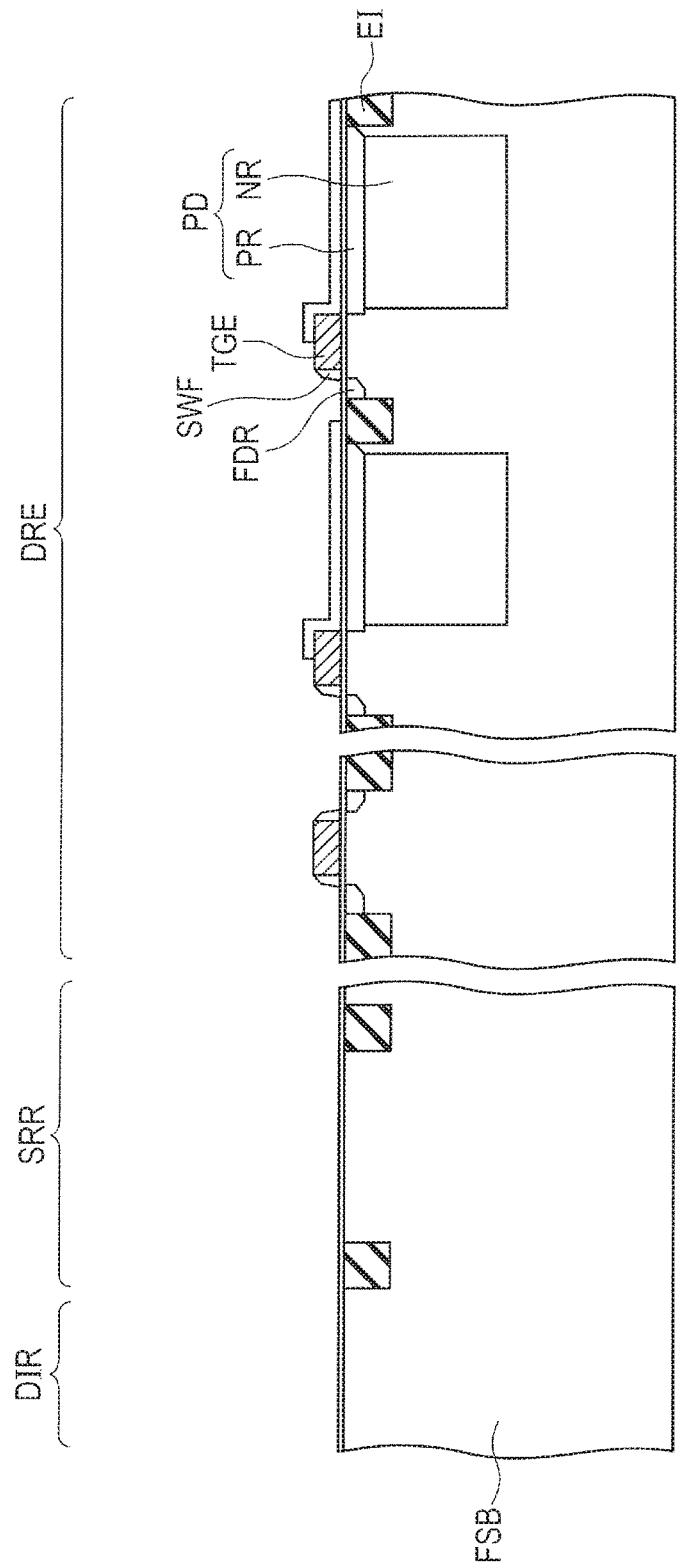
FIG. 8 is a cross-sectional view showing a process step subsequent to the process step shown in FIG. 7 in the first embodiment.

Next, as shown in FIG. 8, sidewall insulating films SWF are formed so as to cover sidewall surfaces and some other parts of the gate electrodes TGE. Then, an ion implantation process is performed using the gate electrodes TGE, sidewall insulating films SWF, and other components as implantation masks to form source/drain diffusion layers FDR each including a floating diffusion. Through these processes, intended transistors including transfer transistors having the gate electrode TGE and floating diffusion are formed.

Figure 9:
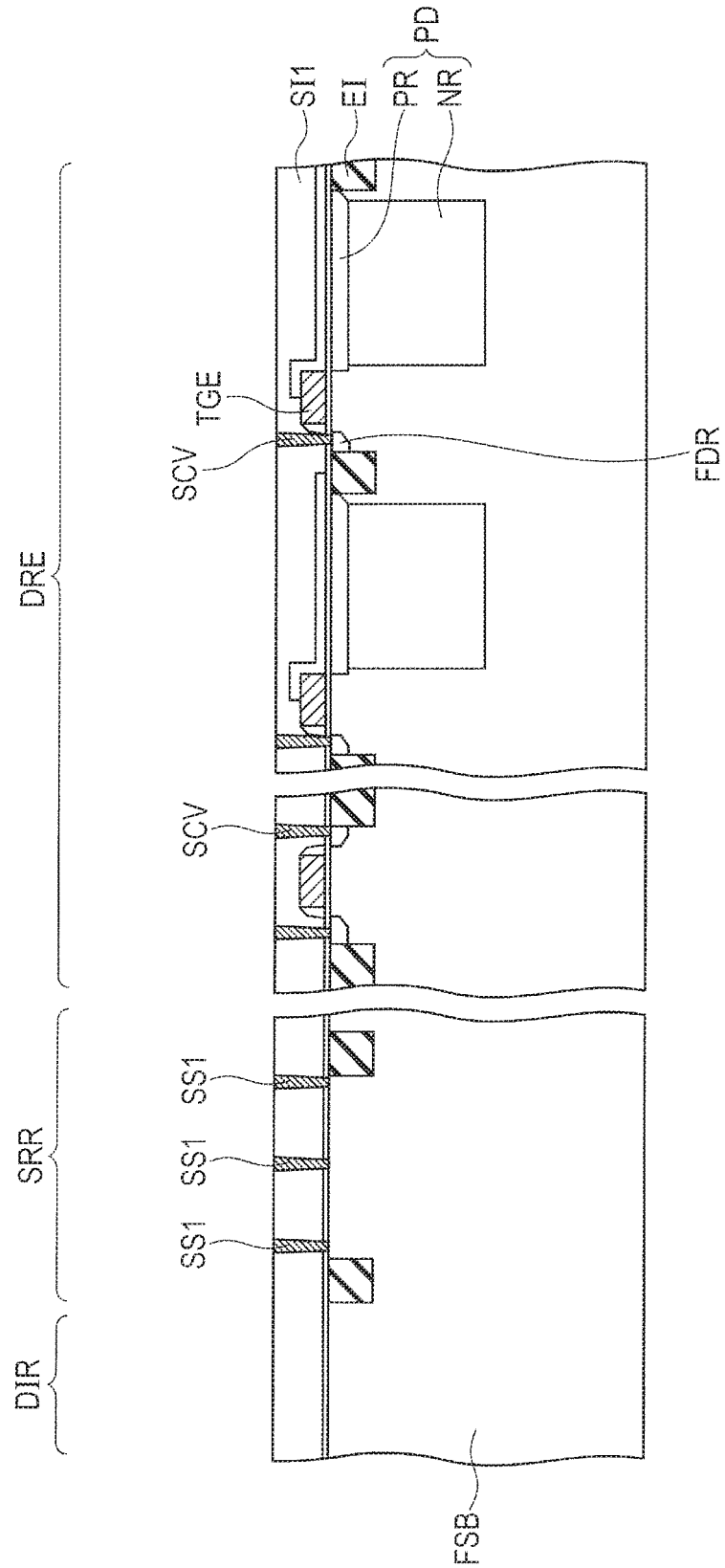
FIG. 9 is a cross-sectional view showing a process step subsequent to the process step shown in FIG. 8 in the first embodiment.

Next, as shown in FIG. 9, a first interlayer insulating film SI1 is formed so as to cover the photodiodes PD, transfer transistors, and other components. Then, the first interlayer insulating film SI1 is subjected to a predetermined photolithographic process and etching process to form contact holes (not shown) in the device region DRE. In the first seal ring region SRR, seal ring openings (not shown) are formed so as to enclose the device region DRE.

Next, a conductive film (not shown) is formed so as to cover the first interlayer insulating film SI1 while filling the contact holes and seal ring openings. Then, the conductive film positioned only over the upper surface of the first interlayer insulating film SI1 is removed through an etching process, or other removal methods. The conductive film parts remaining in the contact holes form contact vias SCV in the device region DRE. In the first seal ring region SRR, the conductive film parts remaining in the seal ring openings form first layer portions SS1 of the seal ring.

Figure 10:
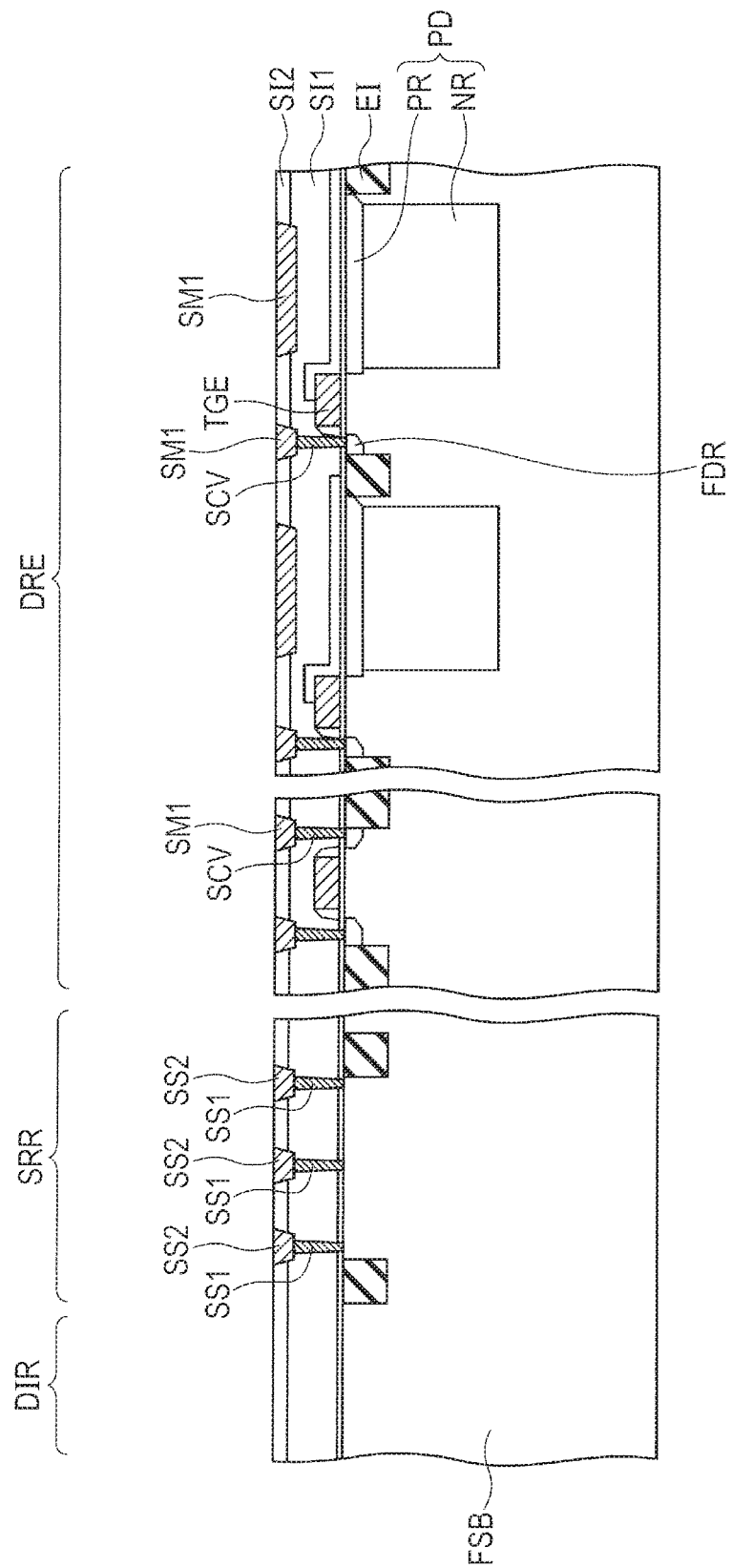
FIG. 10 is a cross-sectional view showing a process step subsequent to the process step shown in FIG. 9 in the first embodiment.

Next, as shown in FIG. 10, a second interlayer insulating film SI2 is formed so as to cover the first interlayer insulating film SI1. Then, in the device region DRE, first metal interconnect lines SM1 are formed with a metal material including, for example, a copper film, by, for example, a damascene method. In the first seal ring region SRR, the metal material including the copper film forms second layer portions SS2 of the seal ring. The second layer portions SS2 are coupled to the first layer portions SS1.

Figure 11:
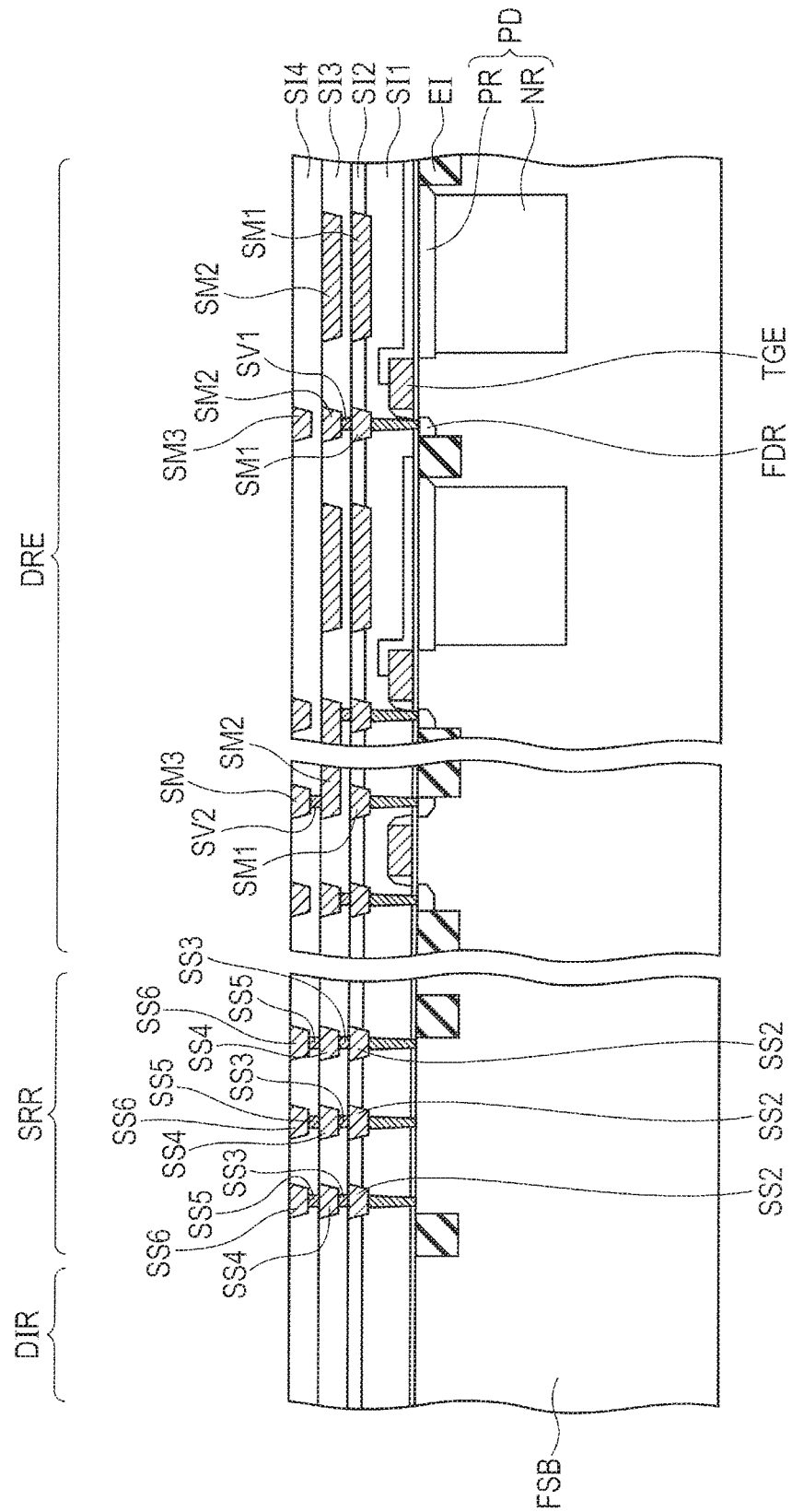
FIG. 11 is a cross-sectional view showing a process step subsequent to the process step shown in FIG. 10 in the first embodiment.

Next, as shown in FIG. 11, a third interlayer insulating film SI3 is formed so as to cover the second interlayer insulating film SI2. Then, in the device region DRE, first vias SV1 and second metal interconnect lines SM2 are formed by, for example, a damascene method. In the first seal ring region SRR, third layer portions SS3 and fourth layer portions SS4 of the seal ring are formed. The third layer portions SS3 are coupled to the second layer portions SS2. The fourth layer portions SS4 are coupled to the third layer portions SS3.

Next, a fourth interlayer insulating film SI4 is formed so as to cover the third interlayer insulating film SI3. Then, in the device region DRE, second vias SV2 and third metal interconnect lines SM3 are formed by, for example, a damascene method. In the first seal ring region SRR, fifth layer portions SS5 and sixth layer portions SS6 of the seal ring are formed. The fifth layer portions SS5 are coupled to the fourth layer portions SS4. The sixth layer portions SS6 are coupled to the fifth layer portions SS5.

Figure 12:
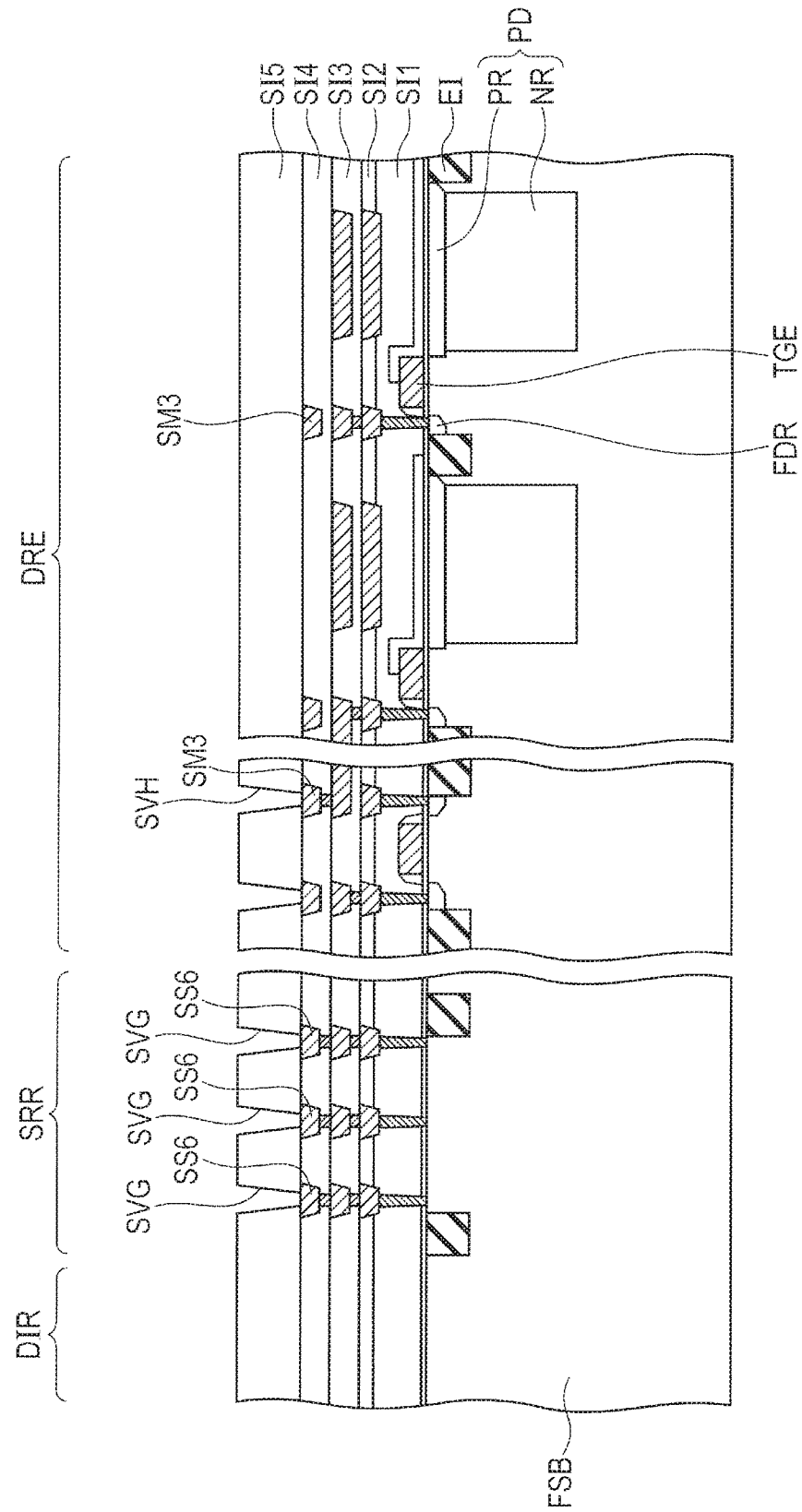
FIG. 12 is a cross-sectional view showing a process step subsequent to the process step shown in FIG. 11 in the first embodiment.
Figure 13:
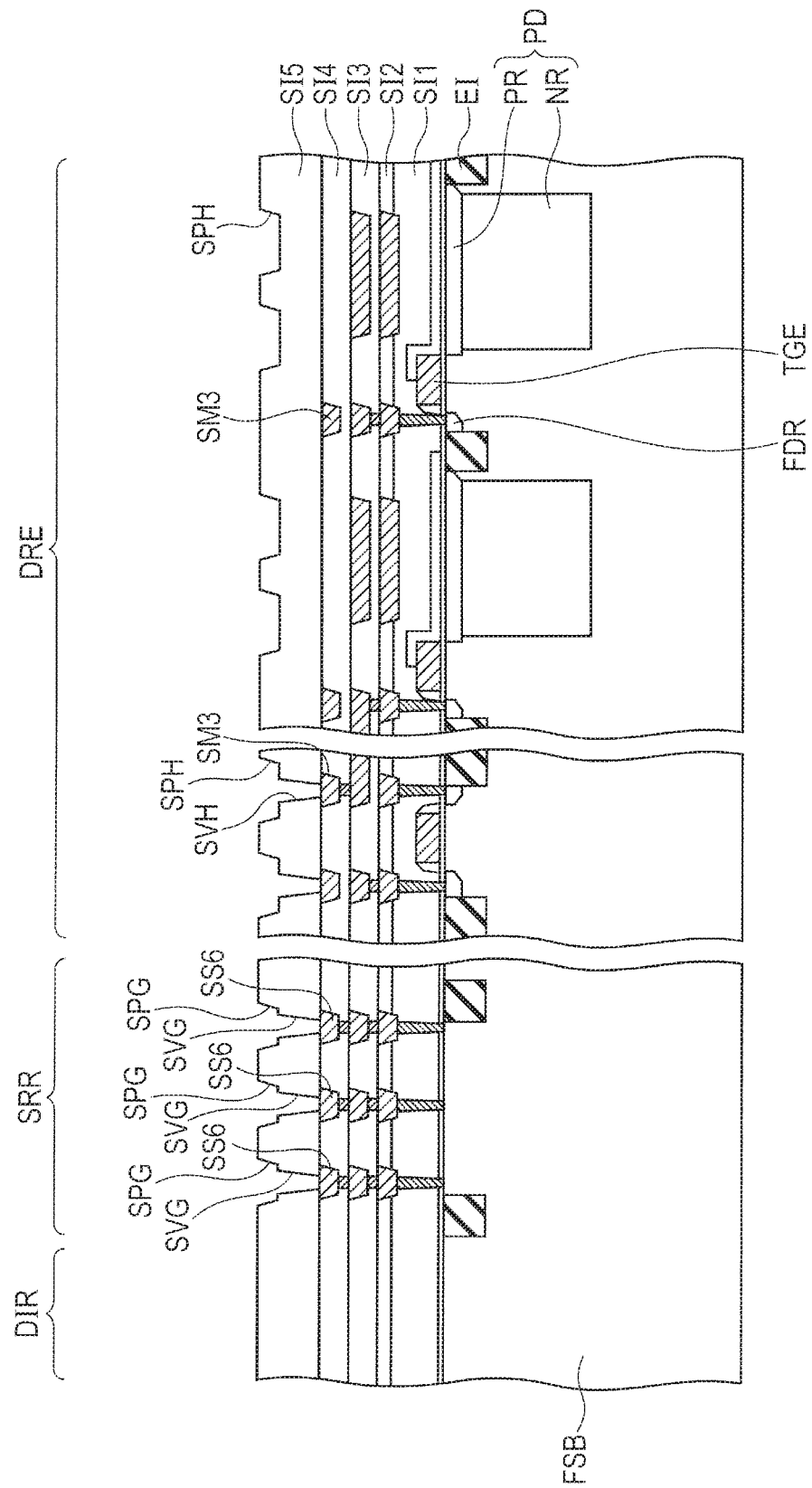
FIG. 13 is a cross-sectional view showing a process step subsequent to the process step shown in FIG. 12 in the first embodiment.

Next, as shown in FIG. 12, a fifth interlayer insulating film SI5 is formed so as to cover the fourth interlayer insulating film SI4. Then, vias SPV for bonding pads and bonding pads SPD are formed by, for example, a damascene method (see FIG. 15). To form the vias SPV and bonding pads SPD, the fifth interlayer insulating film SI5 is firstly subjected to a predetermined photolithographic process and etching process to form via holes SVH for the pads in the device region DRE. In the first seal ring region SRR, seal ring openings SVG are formed. Next, as shown in FIG. 13, the fifth interlayer insulating film SI5 is again subjected to a predetermined photolithographic process and etching process to form openings SPH for the pads in the device region DRE. In the first seal ring region SRR, seal ring openings SPG are formed. The width of the seal ring openings SPG is greater than the width of the seal ring openings SVG.

Figure 14:
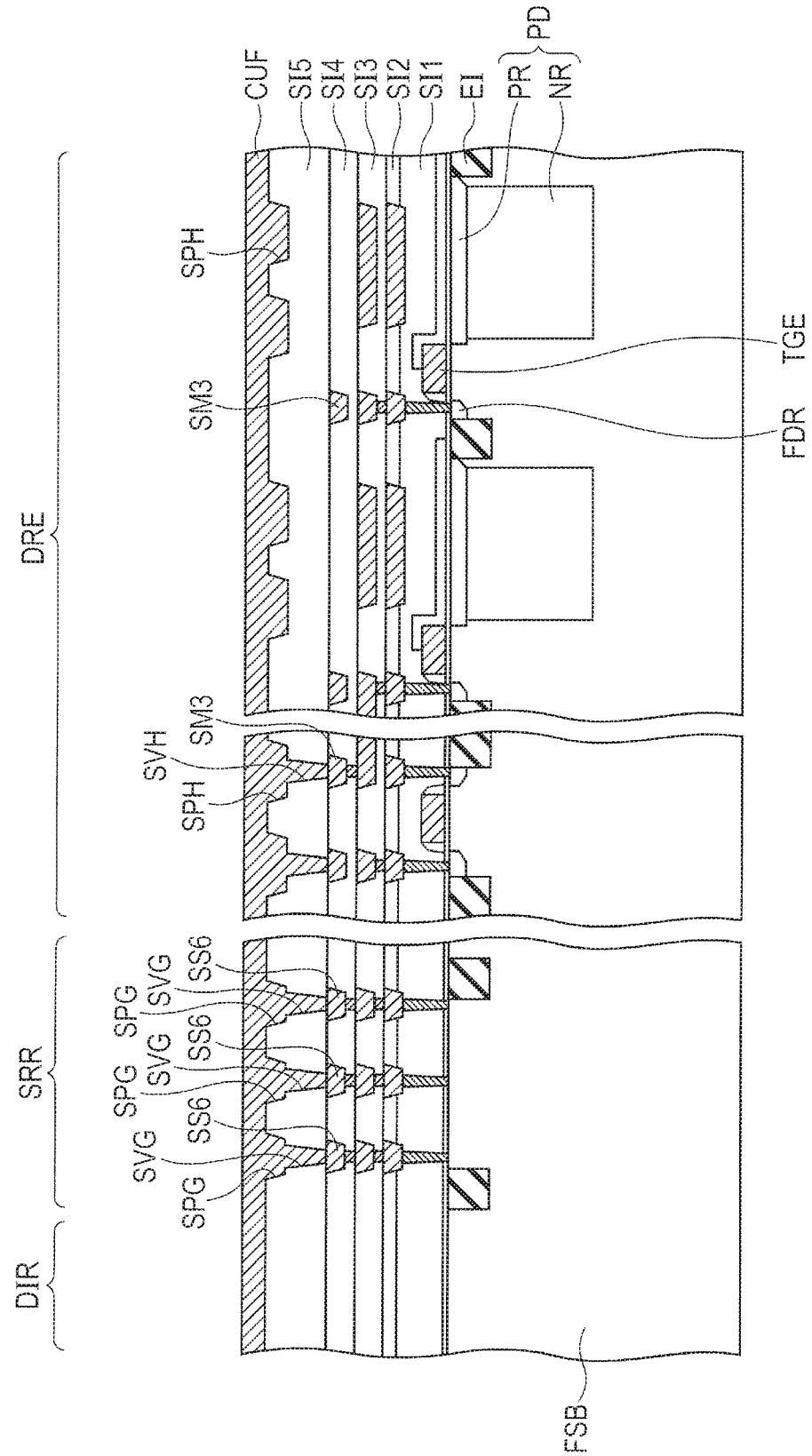
FIG. 14 is a cross-sectional view showing a process step subsequent to the process step shown in FIG. 13 in the first embodiment.
Figure 15:
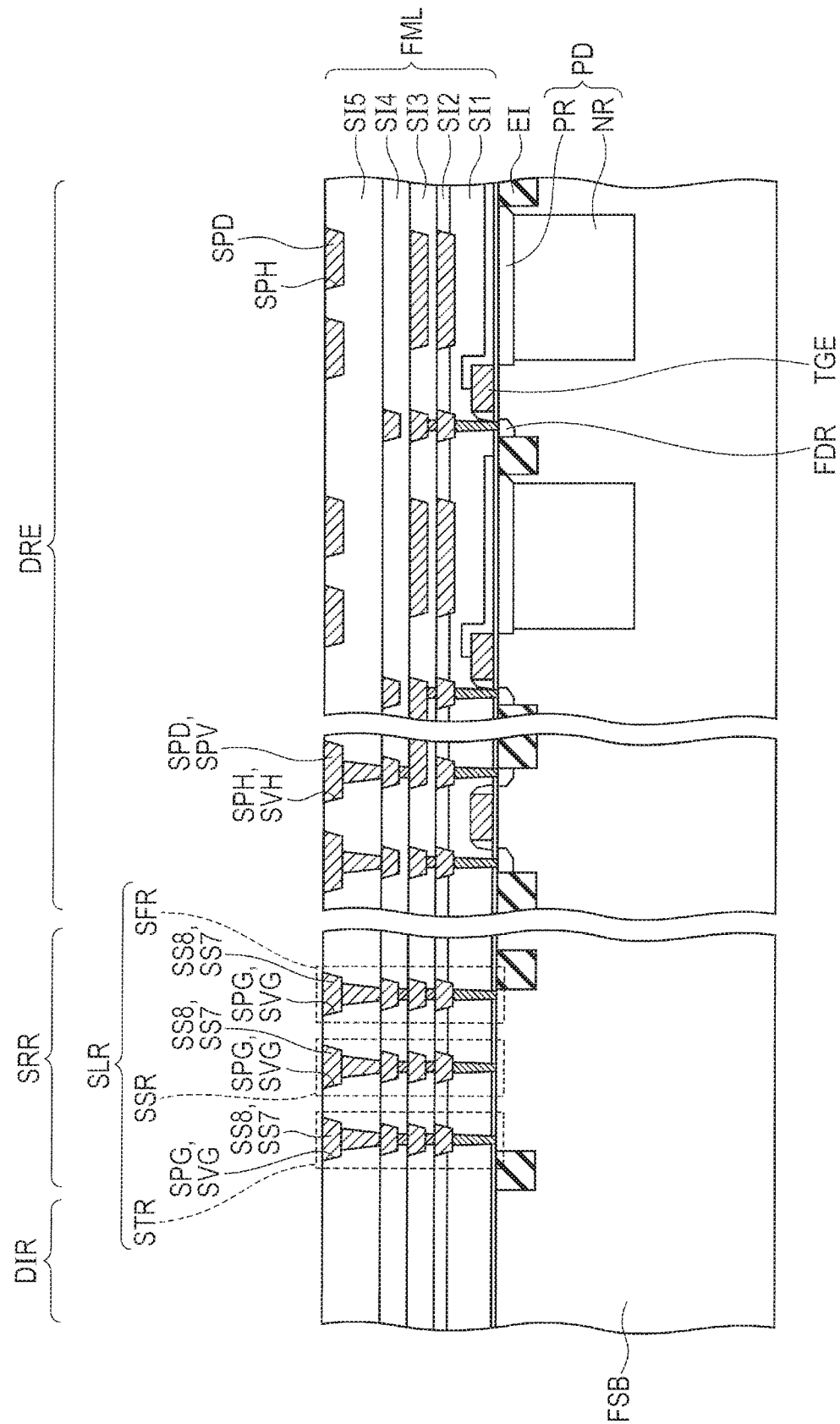
FIG. 15 is a cross-sectional view showing a process step subsequent to the process step shown in FIG. 14 in the first embodiment.

Next, as shown in FIG. 14, a metal film CUF including a copper film is formed so as to cover the fifth interlayer insulating film SI5 while filling the via holes SVH, openings SPH, seal ring openings SVG, and seal ring openings SPG. Then, as shown in FIG. 15, a chemical mechanical polishing process is performed to remove the metal film CUF over the upper surface of the fifth interlayer insulating film SI5 while leaving the metal film CUF in the via holes SVH, openings SPH, seal ring openings SVG, and seal ring openings SPG.

The metal film parts CUF remaining in the via holes SVH form vias SPV for bonding pads. The metal film parts CUF remaining in the openings SPH form bonding pads SPD. The metal film parts CUF remaining in the seal ring openings SVG form the seventh layer portions SS7 of the seal ring. The metal film parts CUF remaining in the seal ring openings SPG form the eighth layer portions SS8 of the seal ring. The eighth layer portions SS8 are coupled to the seventh layer portions SS7.

Through these processes, the main part of the sensor substrate including the first interconnect structure FML is formed. The first interconnect structure FML has the first seal ring SLR in the first seal ring region SRR so as to continuously enclose the device region DRE in plan view. The first seal ring SLR is made up of the first seal ring's first section SFR, first seal ring's second section SSR, and first seal ring's third section STR. Each of the first seal ring's first section SFR, first seal ring's second section SSR, and first seal ring's third section STR includes the first layer portion SS1 to eighth layer portion SS8 coupled to one another.

In addition, the first interconnect structure FML has the contact vias SCV, first metal interconnect lines SM1, first vias SV1, second metal interconnect lines SM2, second vias SV2, third metal interconnect lines SM3, vias SPV, and bonding pads SPD in the device region DRE.

Figure 16:
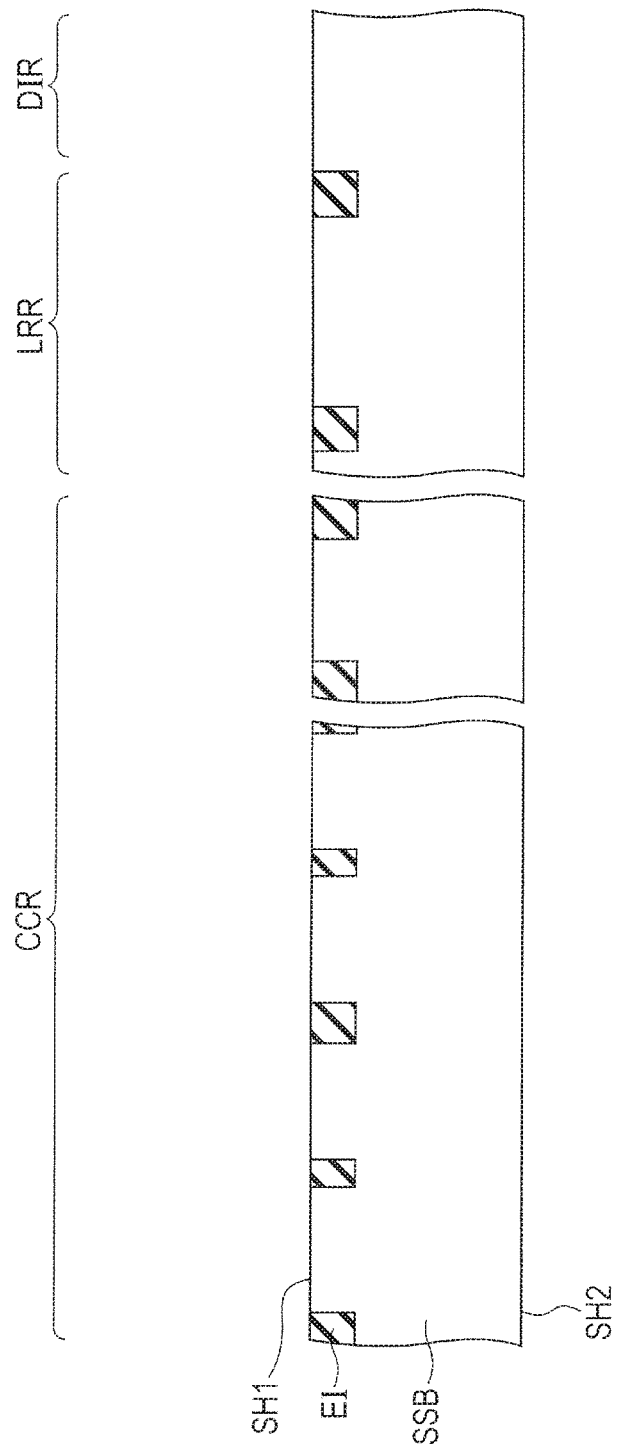
FIG. 16 is a cross-sectional view showing a process step subsequent to the process step shown in FIG. 15 in the first embodiment.
Figure 17:
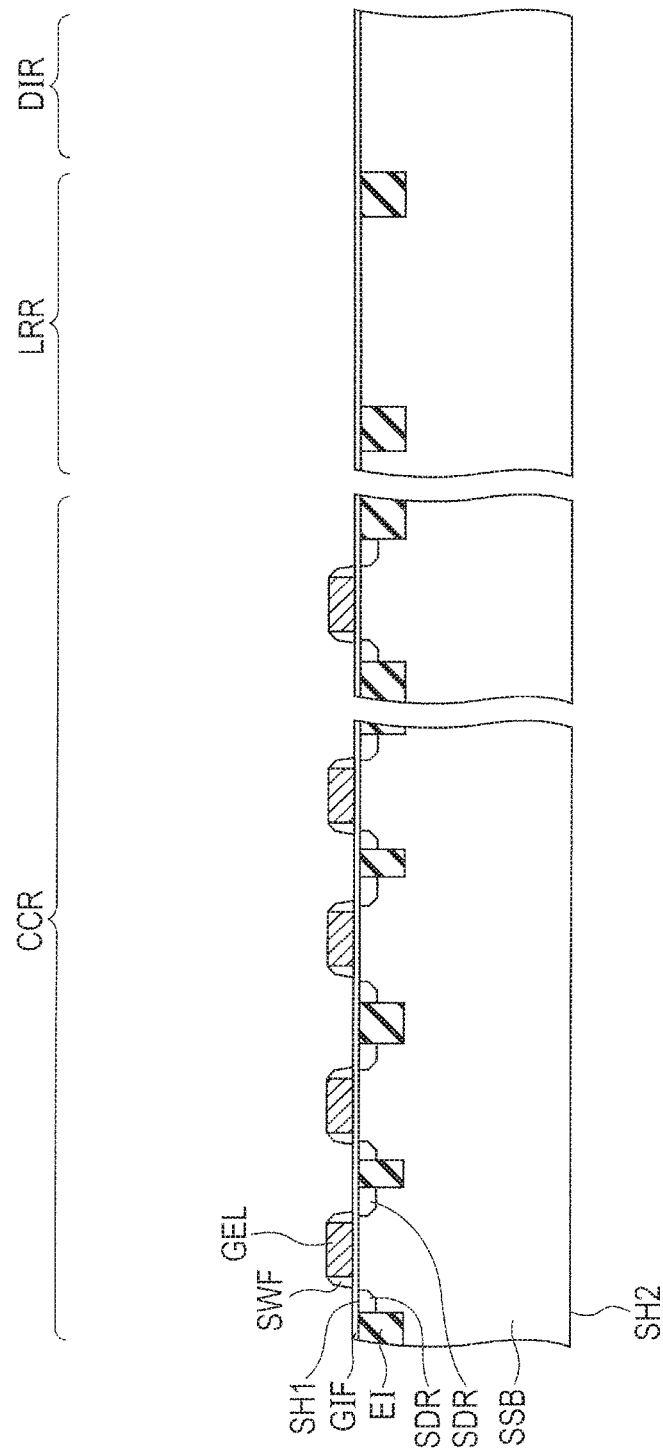
FIG. 17 is a cross-sectional view showing a process step subsequent to the process step shown in FIG. 16 in the first embodiment.

Next, a method for manufacturing a logic substrate will be described. As shown in FIG. 16, a second semiconductor substrate SSB having a first main surface SH1 and a second main surface SH2 opposed to each other is provided. Then, device isolation insulating films EI are formed on the first main surface SH1 side of the second semiconductor substrate SSB to define a circuit region CCR, a second seal ring region LRR, and a dicing region DIR. Next, as shown in FIG. 17, a gate insulating film GIF is formed over the first main surface SH1 of the second semiconductor substrate SSB by, for example, a thermal oxidation method. Then, for example, a polysilicon film (not shown) is formed so as to cover the gate insulating film GIF.

The polysilicon film is then subjected to a photolithographic process and etching process to form gate electrodes GEL and some other components. Sidewall insulating films SWF are formed so as to cover sidewall surfaces and some other parts of the gate electrodes GEL. Then, an ion implantation process is performed using the gate electrodes GEL, sidewall insulating films SWF, and other components as implantation masks to form source/drain diffusion layers SDR. Through these processes, intended transistors including the gate electrode GEL and source/drain diffusion layer SDR are formed.

Figure 18:
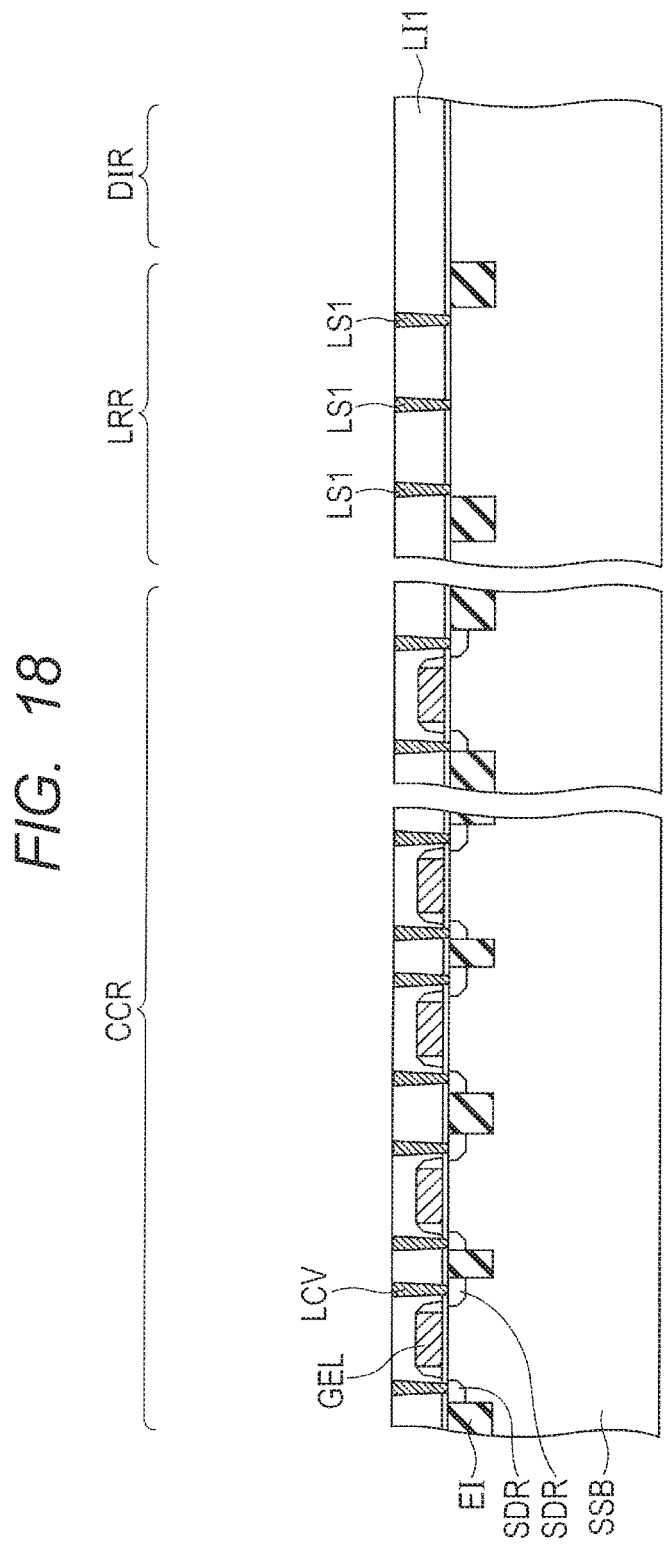
FIG. 18 is a cross-sectional view showing a process step subsequent to the process step shown in FIG. 17 in the first embodiment.

Next, as shown in FIG. 18, a first interlayer insulating film LI1 is formed so as to cover the transistors and other components. Then, the first interlayer insulating film LI1 is subjected to a predetermined photolithographic process and etching process to form contact holes (not shown) in the circuit region CCR. In the second seal ring region LRR, seal ring openings (not shown) are formed so as to enclose the circuit region CCR.

Next, a conductive film (not shown) is formed so as to cover the first interlayer insulating film LI1 while filling the contact holes and seal ring openings. Then, the conductive film positioned only over the upper surface of the first interlayer insulating film LI1 is removed through an etching process, or other removal methods. The conductive film parts remaining in the contact holes form contact vias LCV in the circuit region CCR. In the second seal ring region LRR, the conductive film parts remaining in the seal ring openings form first layer portions LS1 of a seal ring.

Figure 19:
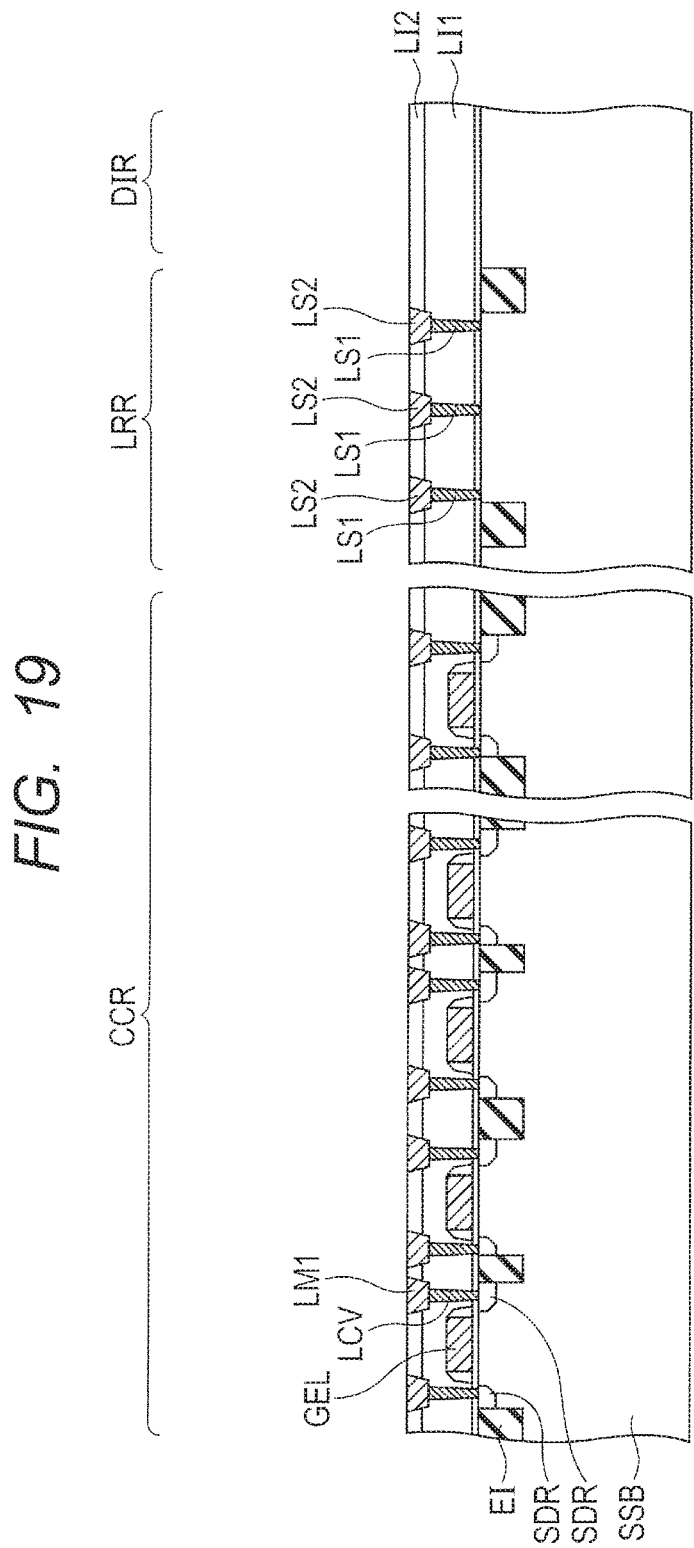
FIG. 19 is a cross-sectional view showing a process step subsequent to the process step shown in FIG. 18 in the first embodiment.

Next, as shown in FIG. 19, a second interlayer insulating film LI2 is formed so as to cover the first interlayer insulating film LI1. Then, in the circuit region CCR, first metal interconnect lines LM1 are formed with a metal material including, for example, a copper film, by, for example, a damascene method. In the second seal ring region LRR, the metal material including the copper film forms second layer portions LS2 of the seal ring. The second layer portions LS2 are coupled to the first layer portions LS1.

Figure 20:
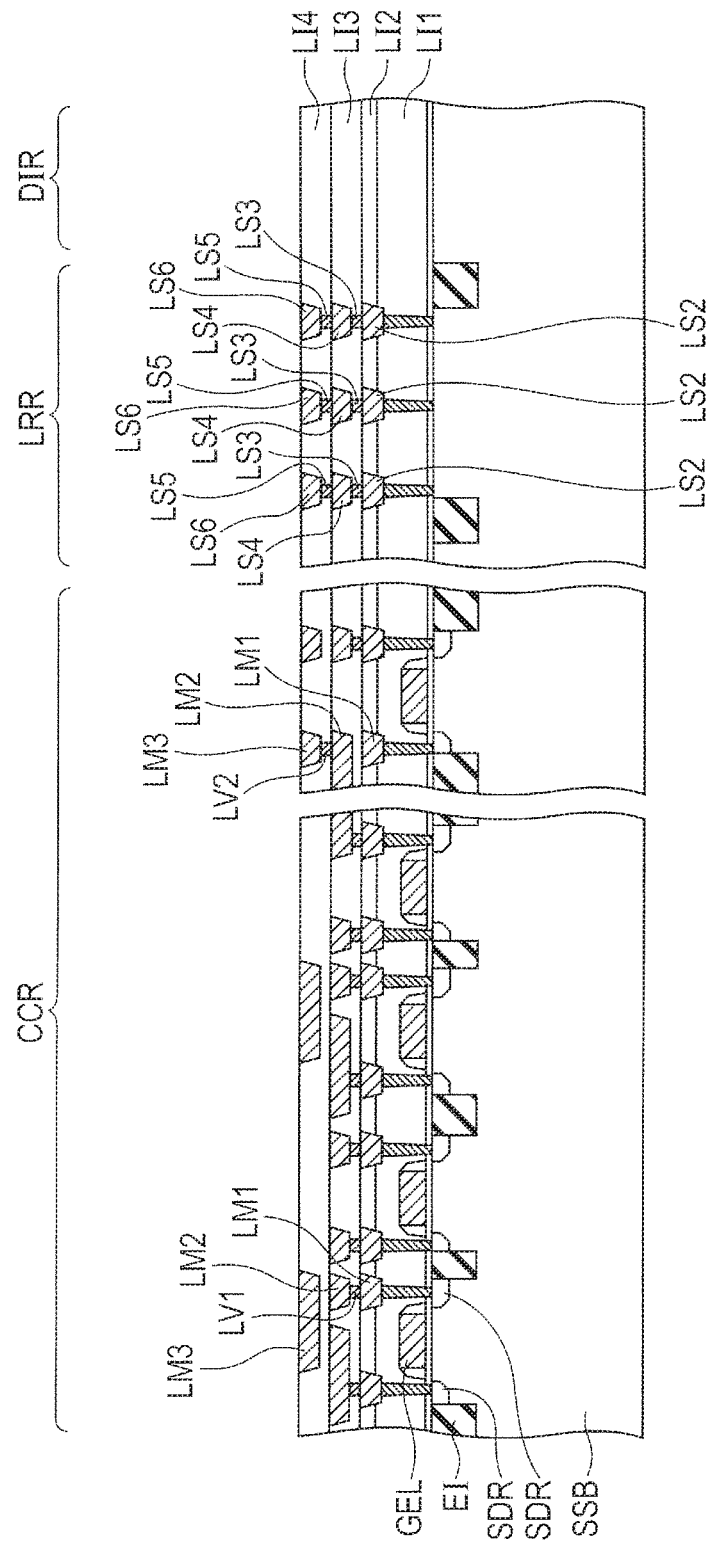
FIG. 20 is a cross-sectional view showing a process step subsequent to the process step shown in FIG. 19 in the first embodiment.

Next, as shown in FIG. 20, a third interlayer insulating film LI3 is formed so as to cover the second interlayer insulating film LI2. Then, in the circuit region CCR, first vias LV1 and second metal interconnect lines LM2 are formed by, for example, a damascene method. In the second seal ring region LRR, third layer portions LS3 and fourth layer portions LS4 of the seal ring are formed. The third layer portions LS3 are coupled to the second layer portions LS2. The fourth layer portions LS4 are coupled to the third layer portions LS3.

Next, a fourth interlayer insulating film LI4 is formed so as to cover the third interlayer insulating film LI3. Then, in the circuit region CCR, second vias LV2 and third metal interconnect lines LM3 are formed by, for example, a damascene method. In the second seal ring region LRR, fifth layer portions LS5 and sixth layer portions LS6 of the seal ring are formed. The fifth layer portions LS5 are coupled to the fourth layer portions LS4. The sixth layer portions LS6 are coupled to the fifth layer portions LS5.

Figure 21:
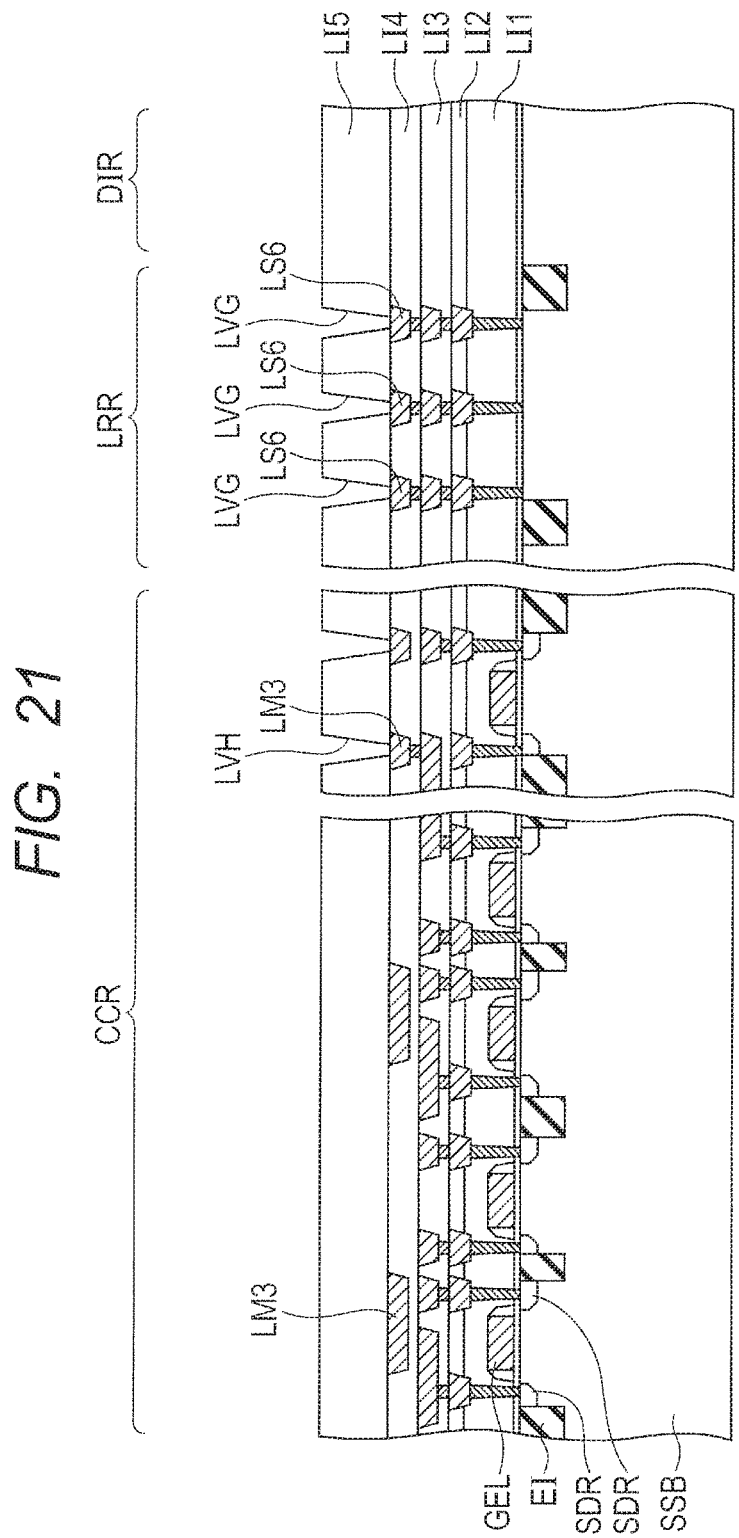
FIG. 21 is a cross-sectional view showing a process step subsequent to the process step shown in FIG. 20 in the first embodiment.
Figure 22:
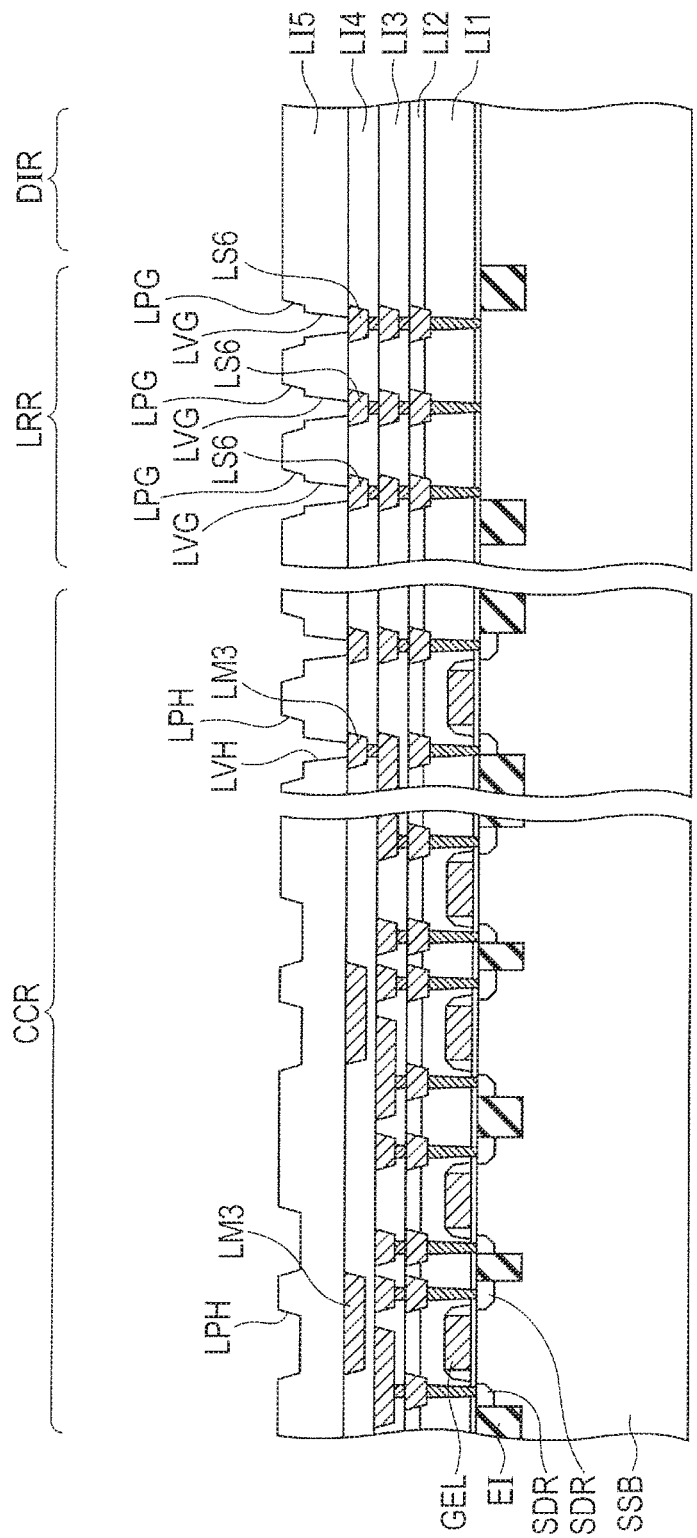
FIG. 22 is a cross-sectional view showing a process step subsequent to the process step shown in FIG. 21 in the first embodiment.

Next, as shown in FIG. 21, a fifth interlayer insulating film LI5 is formed so as to cover the fourth interlayer insulating film LI4. Then, vias LPV for bonding pads and bonding pads LPD are formed by, for example, a damascene method (see FIG. 24). To form the vias LPV and bonding pads LPD, the fifth interlayer insulating film LI5 is firstly subjected to a predetermined photolithographic process and etching process to form via holes LVH for the pads in the circuit region CCR. In the second seal ring region LRR, seal ring openings LVG are formed. Next, as shown in FIG. 22, the fifth interlayer insulating film LI5 is again subjected to a predetermined photolithographic process and etching process to form openings LPH for the pads in the circuit region CCR. In the second seal ring region LRR, seal ring openings LPG are formed. The width of the seal ring openings LPG is greater than the width of the seal ring openings LVG.

Figure 23:
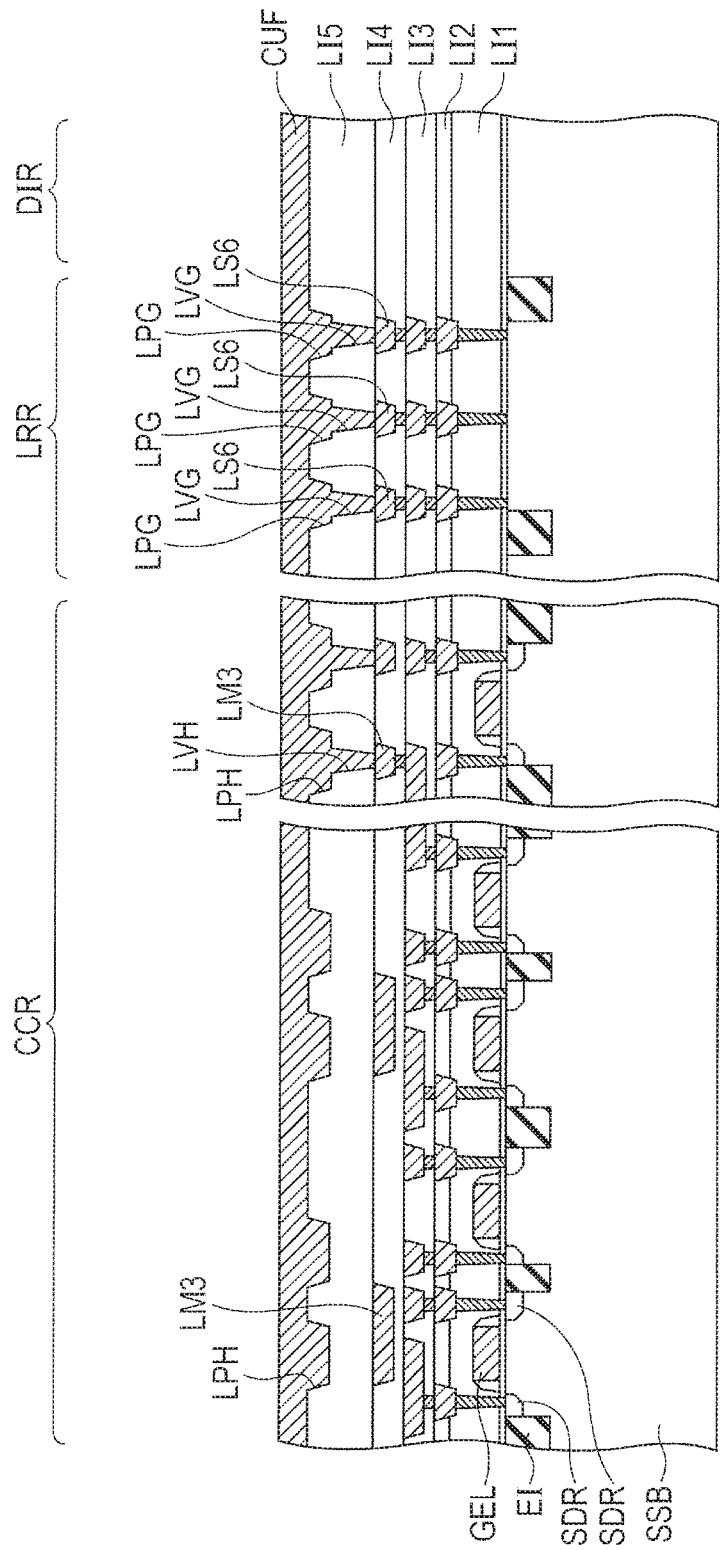
FIG. 23 is a cross-sectional view showing a process step subsequent to the process step shown in FIG. 22 in the first embodiment.
Figure 24:
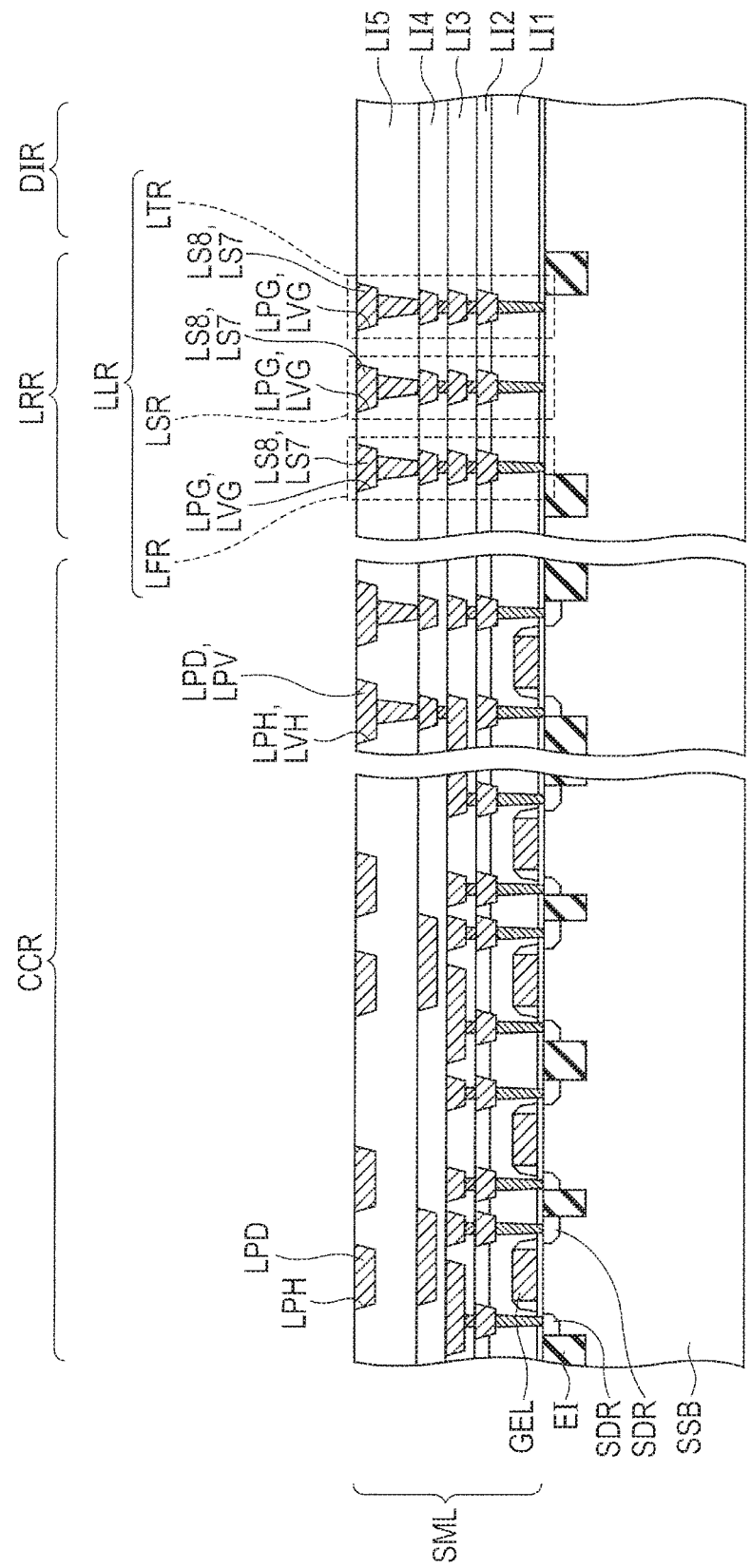
FIG. 24 is a cross-sectional view showing a process step subsequent to the process step shown in FIG. 23 in the first embodiment.

Next, as shown in FIG. 23, a metal film CUF including a copper film is formed so as to cover the fifth interlayer insulating film LI5 while filling the via holes LVH, openings LPH, seal ring openings LVG, and seal ring openings LPG. Then, as shown in FIG. 24, a chemical mechanical polishing process is performed to remove the metal film CUF over the upper surface of the fifth interlayer insulating film LI5 while leaving the metal film CUF in the via holes LVH, openings LPH, seal ring openings LVG, and seal ring openings LPG.

The metal film parts CUF remaining in the via holes LVH form vias LPV for bonding pads. The metal film parts CUF remaining in the openings LPH form bonding pads LPD. The metal film parts CUF remaining in the seal ring openings LVG form the seventh layer portions LS7 of the seal ring. The metal film parts CUF remaining in the seal ring openings LPG form the eighth layer portions LS8 of the seal ring. The eighth layer portions LS8 are coupled to the seventh layer portions LS7.

Through these processes, the main part of the logic substrate including the second interconnect structure SML is formed. The second interconnect structure SML has the second seal ring LLR in the second seal ring region LRR so as to continuously enclose the circuit region CCR in plan view. The second seal ring LLR is made up of the second seal ring's first section LFR, second seal ring's second section LSR, and second seal ring's third section LTR. Each of the second seal ring's first section LFR, second seal ring's second section LSR, and second seal ring's third section LTR includes the first layer portion LS1 to eighth layer portion LS8 coupled to one another.

In addition, the second interconnect structure SML has the contact vias LCV, first metal interconnect lines LM1, first vias LV1, second metal interconnect lines LM2, second vias LV2, third metal interconnect lines LM3, vias LPV, and bonding pads LPD in the circuit region CCR.

Next, the sensor substrate and logic substrate are bonded to each other. The sensor substrate has the bonding pads SPD and the eighth layer portions SS8 of the first seal ring SLR that are exposed on a surface of the first interconnect structure FML, and the surface undergoes pretreatment, such as a planarization process and a plasma treatment. The logic substrate also has the bonding pads LPD and the eighth layer portions LS8 of the second seal ring LLR that are exposed on a surface of the second interconnect structure SML, and the surface undergoes pretreatment, such as a planarization process and a plasma treatment.

Figure 25:
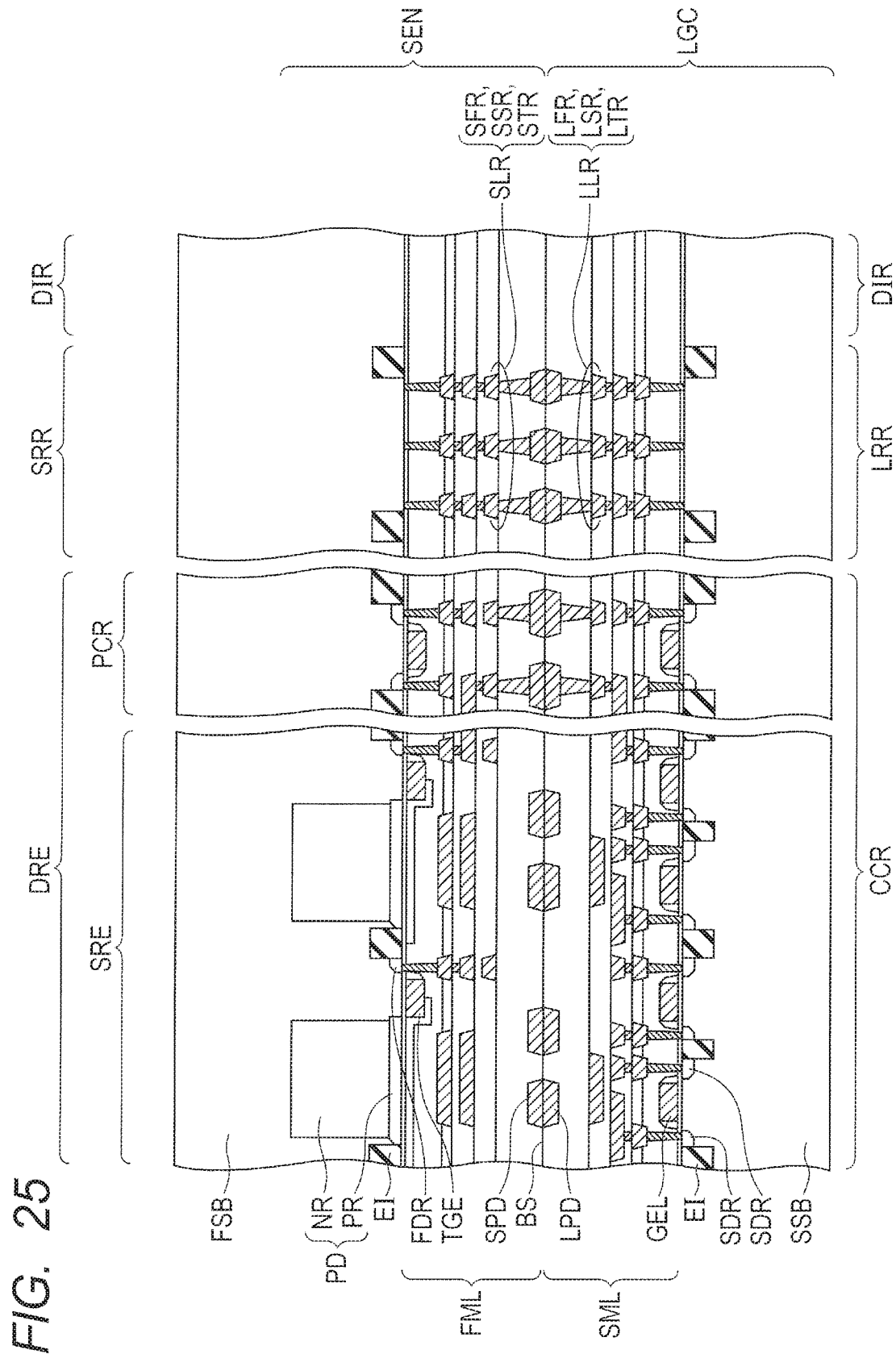
FIG. 25 is a cross-sectional view showing a process step subsequent to the process step shown in FIG. 24 in the first embodiment.

Next, as shown in FIG. 25, the pretreated surface of the first interconnect structure FML of the sensor substrate SEN is laid over the pretreated surface of the second interconnect structure SML of the logic substrate LGC. At this point, the bonding pads SPD and bonding pads LPD are aligned with each other. The eighth layer portions SS8 (see FIG. 15) and the eighth layer portions LS8 (see FIG. 24) are aligned with each other. While the bonding pads and eighth layer portions are in alignment, a thermal treatment is performed under a temperature condition, for example, at 400° C. or lower, thereby bonding the sensor substrate SEN and logic substrate LGC together.

Figure 26:
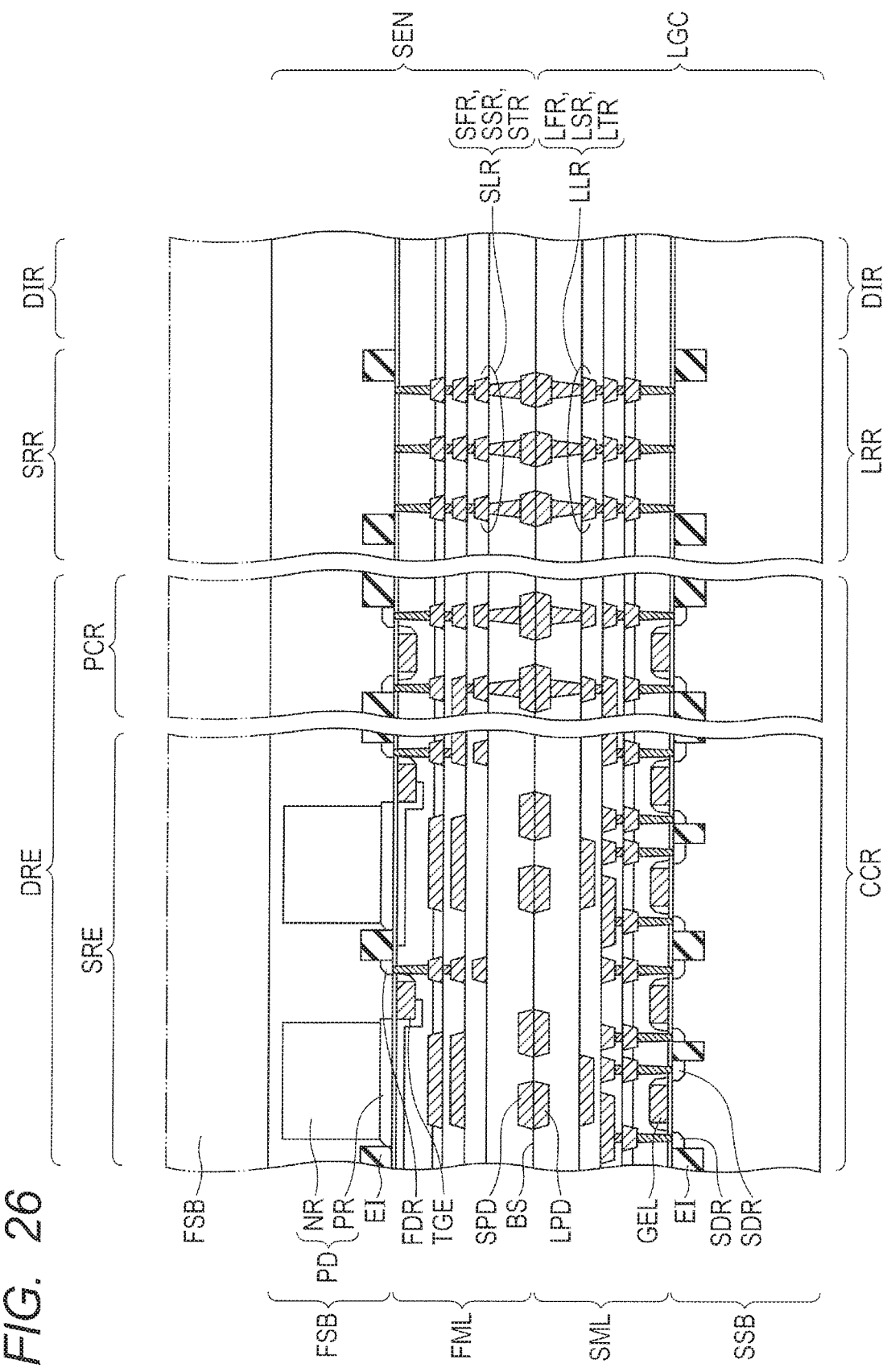
FIG. 26 is a cross-sectional view showing a process step subsequent to the process step shown in FIG. 25 in the first embodiment.
Figure 27:
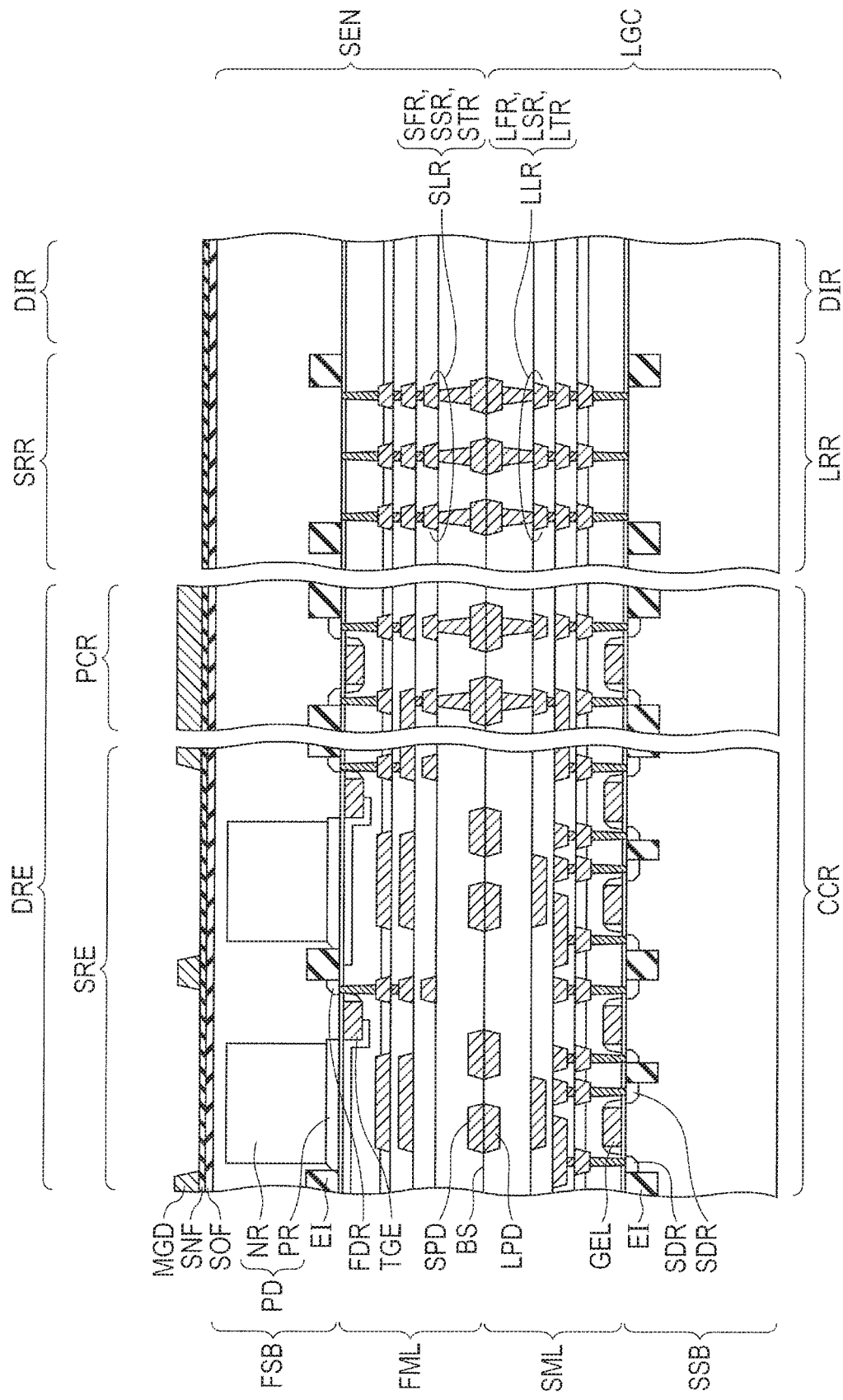
FIG. 27 is a cross-sectional view showing a process step subsequent to the process step shown in FIG. 26 in the first embodiment.

Next, as shown in FIG. 26, the second main surface FH2 (see FIG. 5) of the first semiconductor substrate FSB is ground or subjected to other thinning techniques to reduce the thickness of the first semiconductor substrate FSB. Then, as shown in FIG. 27, the ground surface of the first semiconductor substrate FSB is covered with, for example, a silicon oxide film SOF and a silicon nitride film SNF. Then, a metal film, such as a tungsten film, is formed so as to cover a surface of the silicon nitride film SNF and is then etched to form metal grids MGD.

Figure 28:
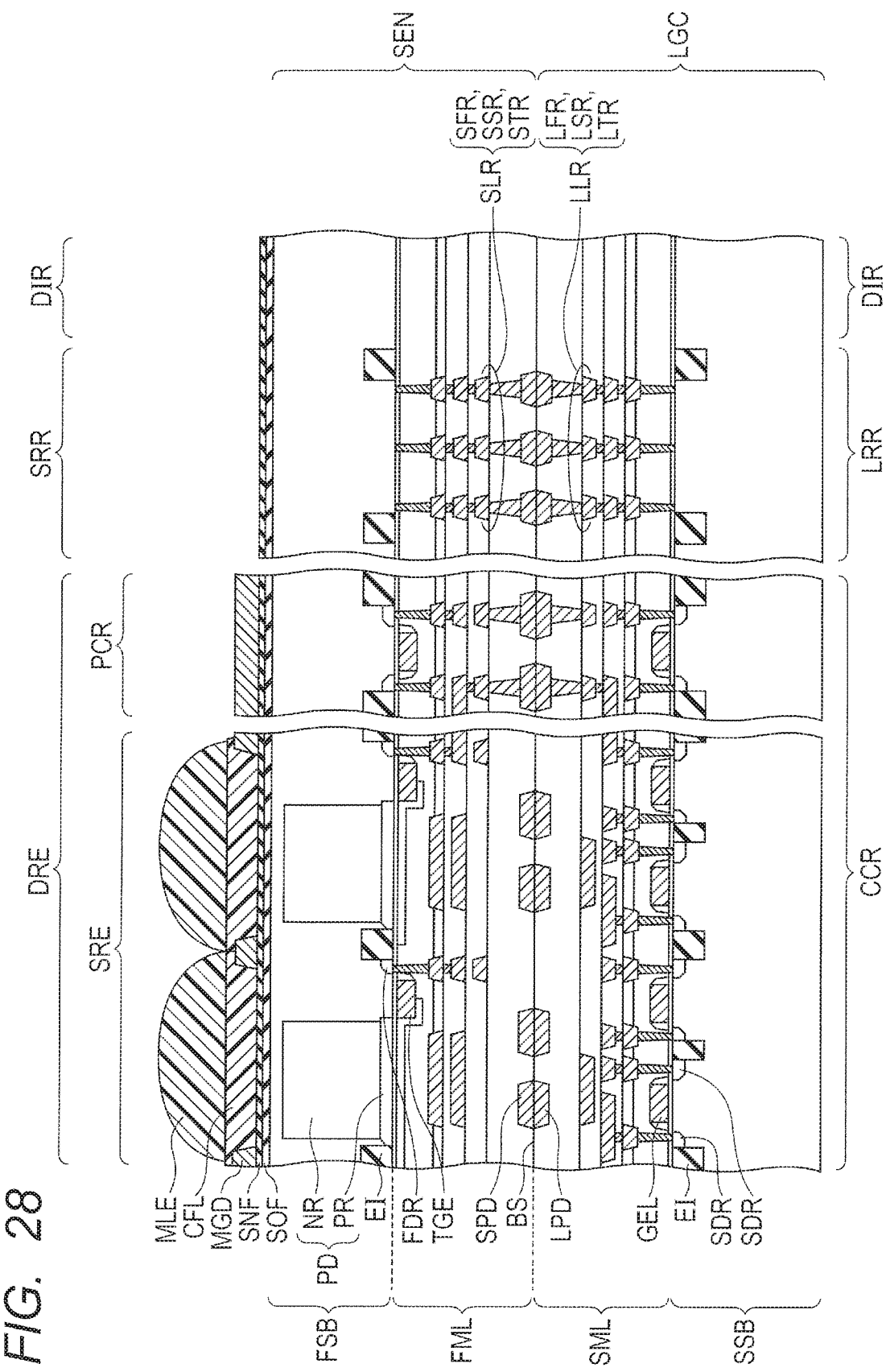
FIG. 28 is a cross-sectional view showing a process step subsequent to the process step shown in FIG. 27 in the first embodiment.

Next, as shown in FIG. 28, color filters CFL and microlenses MLE are formed in the sensor region SRE of the first semiconductor substrate FSB. In addition, bonding pads (not shown) are formed in a predetermined area of the first semiconductor substrate FSB. In this manner, the main part of the solid-state imaging device is formed. Subsequently, the wafer is diced along the dicing regions DIR to take out solid-state imaging devices in the form of chips.

In the above-described solid-state imaging device, the first interconnect structure FML has the interconnects including from the contact vias SCV to the bonding pads SPD in the device region DRE. The second interconnect structure SML has the interconnects including from the contact vias LCV to the bonding pads LPD in the circuit region CCR.

Unlike the device region DRE, the first seal ring SLR is formed in the first seal ring region SRR of the first interconnect structure FML so as to continuously enclose the device region DRE in plan view. The first seal ring SLR is made up of the first layer portions SS1 to eighth layer portions SS8 stacked on top of each other.

Unlike the circuit region CCR, the second seal ring LLR is formed in the second seal ring region LRR of the second interconnect structure SML so as to continuously enclose the circuit region CCR in plan view. The second seal ring LLR is made up of the first layer portions LS1 to eighth layer portions LS8 stacked on top of each other.

In the solid-state imaging device, the first interconnect structure FML and second interconnect structure SML are bonded through a hybrid bonding technique with the bonding pads SPD and the bonding pads LPD bonded together and the eighth layer portions SS8 and the eighth layer portions LS8 bonded together. Especially, the first seal ring SLR and the second seal ring LLR are continuously metal-bonded to each other along the entire perimeter of the first seal ring regions SRR and LRR, respectively.

In comparison with, for example, a solid-state imaging device (e.g., PTL 1), which is a comparative example having an insulating film, with an uncontrolled thickness, interposed between a seal ring formed in one of the semiconductor substrates and a seal ring formed in the other semiconductor substrate, the solid-state imaging device according to this embodiment can reliably prevent moisture from entering the device region DRE and circuit region CCR. In addition, even if a crack is produced while the wafer is being diced along the dicing regions DIR, the first seal ring SLR and the second seal ring LLR can reliably prevent the crack from extending into the device region DRE and circuit region CCR.

Furthermore, the first seal ring SLR is formed by successively stacking the first layer portions SS1 to eighth layer portions SS8 that are formed simultaneously with formation of the interconnects including from the contact vias SCV to bonding pads SPD in the same process. The second seal ring LLR is formed by successively stacking the first layer portions LS1 to eighth layer portions LS8 that are formed simultaneously with formation of the interconnects including from the contact vias LCV to bonding pads LPD in the same process. Thus, the first seal ring SLR and second seal ring LLR can be formed without additional processes.

To accurately form the first seal ring SLR and second seal ring LLR, the width W2 of the first seal ring SLR (second seal ring LLR) is preferably set not to exceed the size W1 of the bonding pads SPD (bonding pads LPD) (size W1≥width W2). In addition, the distance P2 between the sections of the first seal ring SLR (second seal ring LLR) is preferably set to be equal to or greater than the pitch P1 of the bonding pads SPD (bonding pads LPD) (distance P2≥pitch P1).

(Modification)

The above-described solid-state imaging device is presented as an example in which the first seal ring SLR (second seal ring LLR), which is made up of three sections, namely, the first seal ring's first section SFR, first seal ring's second section SSR, and first seal ring's third section STR (second seal ring's first section LFR, second seal ring's second section LSR, and second seal ring's third section LTR), has eighth layer portions SS8 (eighth layer portions LS8) of the same widths at the bonded interface. A modification of the solid-state imaging device will be described below.

Figure 29:
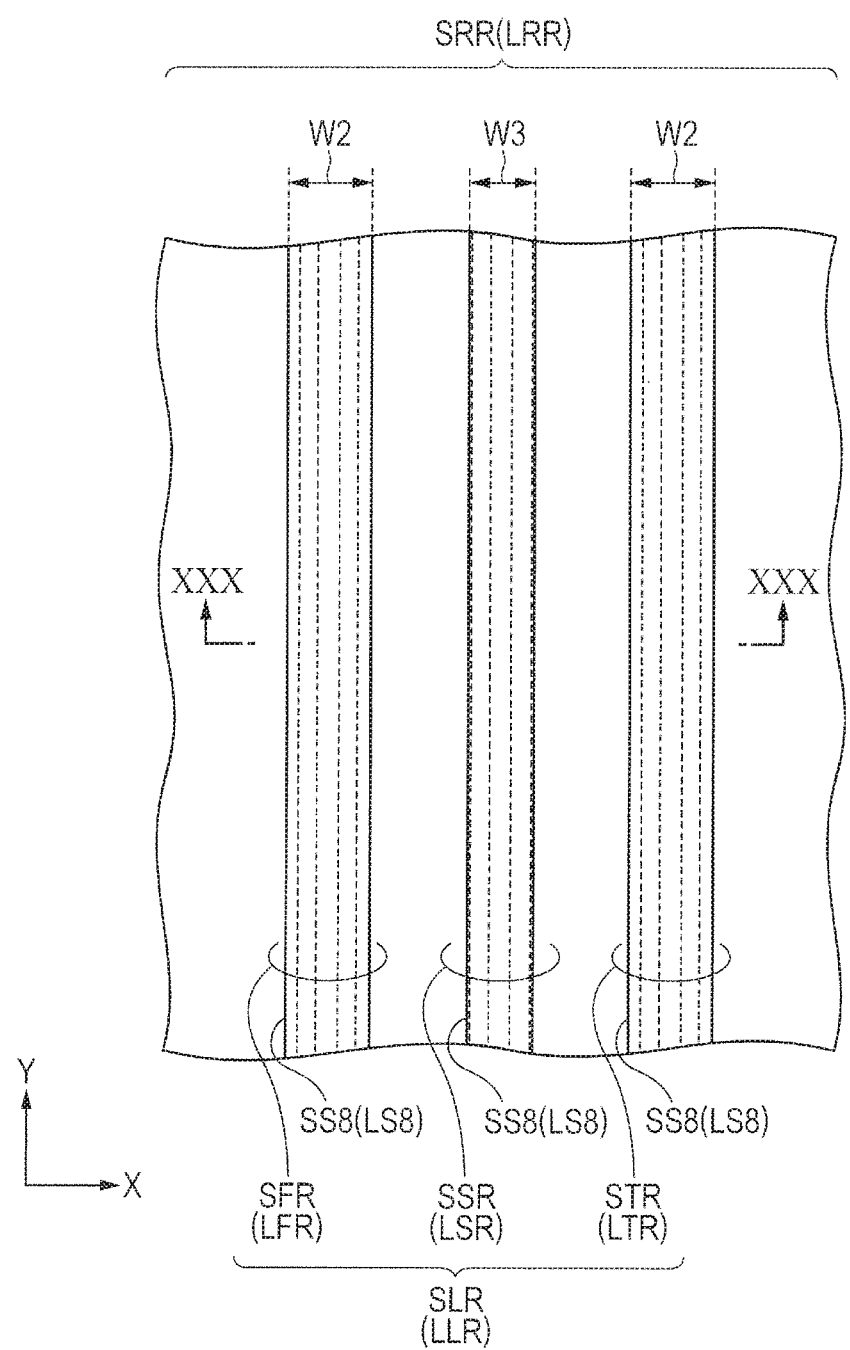
FIG. 29 is a partially-enlarged plan view showing an exemplary planar pattern of a seal ring at a bonded interface of a modified solid-state imaging device in the first embodiment.
Figure 30:
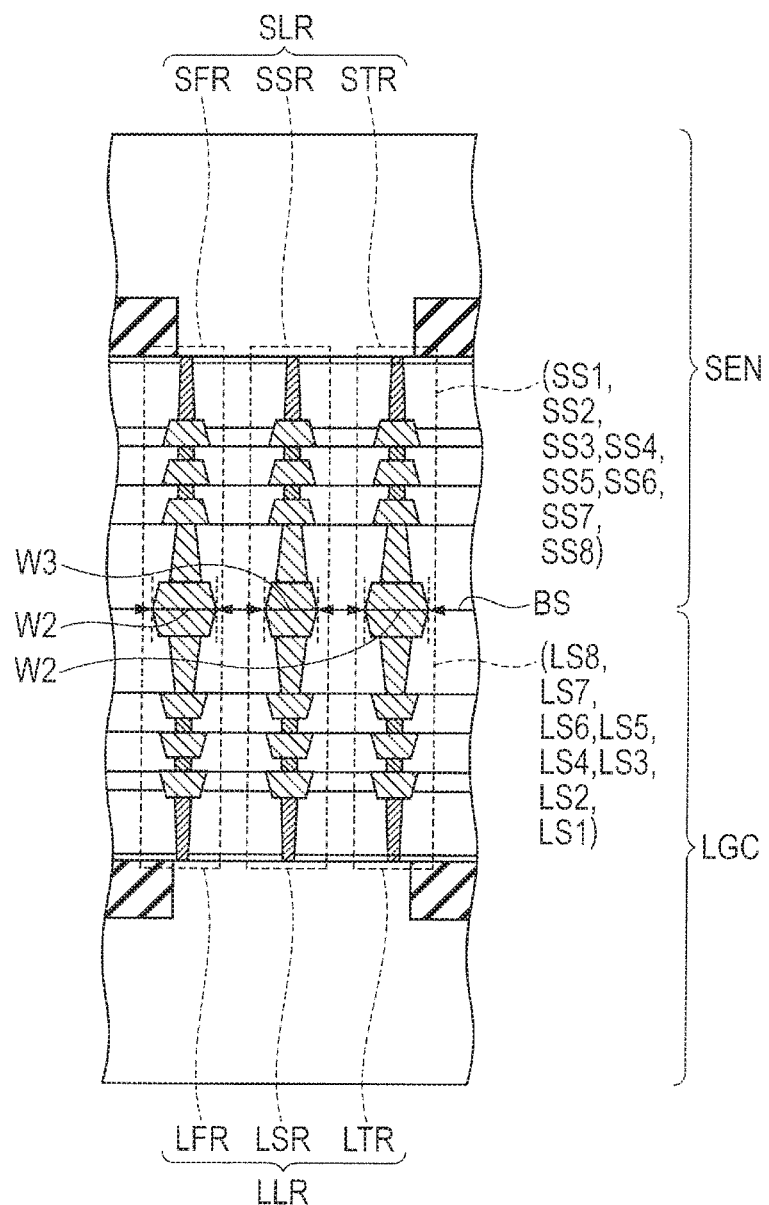
FIG. 30 is a partial cross-sectional view of the modified solid-state imaging device, taken along a cross-sectional line XXX-XXX in FIG. 29, according to the first embodiment.

As shown in FIGS. 29 and 30, the solid-state imaging device according to the modification is configured such that the width W3 of the eighth layer portion SS8 (eighth layer portion LS8) of the first seal ring's second section SSR (second seal ring's second section LSR) is set to be less than the width W2 of the eighth layer portion SS8 (eighth layer portion LS8) of the first seal ring's first section SFR (second seal ring's first section LFR) and the width W2 of the eighth layer portion SS8 (eighth layer portion LS8) of the first seal ring's third section STR (second seal ring's third section LTR). This configuration can enhance the bonding between the sensor substrate (first interconnect structure) and the logic substrate (second interconnect structure). The following describes the details.

As described above, the first seal ring SLR is formed by successively stacking the first layer portions SS1 to eighth layer portions SS8 that are formed simultaneously with formation of the interconnects including from the contact vias SCV to bonding pads SPD in the same process by a damascene method. However, the damascene method involves a chemical mechanical polishing process that is presumed to cause dishing during formation of a dense metal-film pattern area where metal films including copper films are patterned at high densities (ratio of the metal film pattern per unit area). In manufacture of solid-state imaging devices, the conditions of the chemical mechanical polishing process are set within the bounds of not causing dishing in consideration of the pattern density of the metal films, which are metal interconnect lines or the like, formed in the device region DRE (circuit region CCR).

Since the first seal ring region SRR has the first seal ring SLR formed in contiguous stripes, the metal-film pattern density of the first seal ring region SRR is higher than that of the device region DRE where the bonding pads SPD are formed apart from each other (see FIG. 2). Because of this, the first seal ring region SRR has a higher possibility to induce dishing. The occurrence of dishing makes polishing at a center area of the region, where the metal films are patterned at a high density, faster than the peripheral area, thereby lowering the center area surface more than the peripheral area surface.

Figure 31:
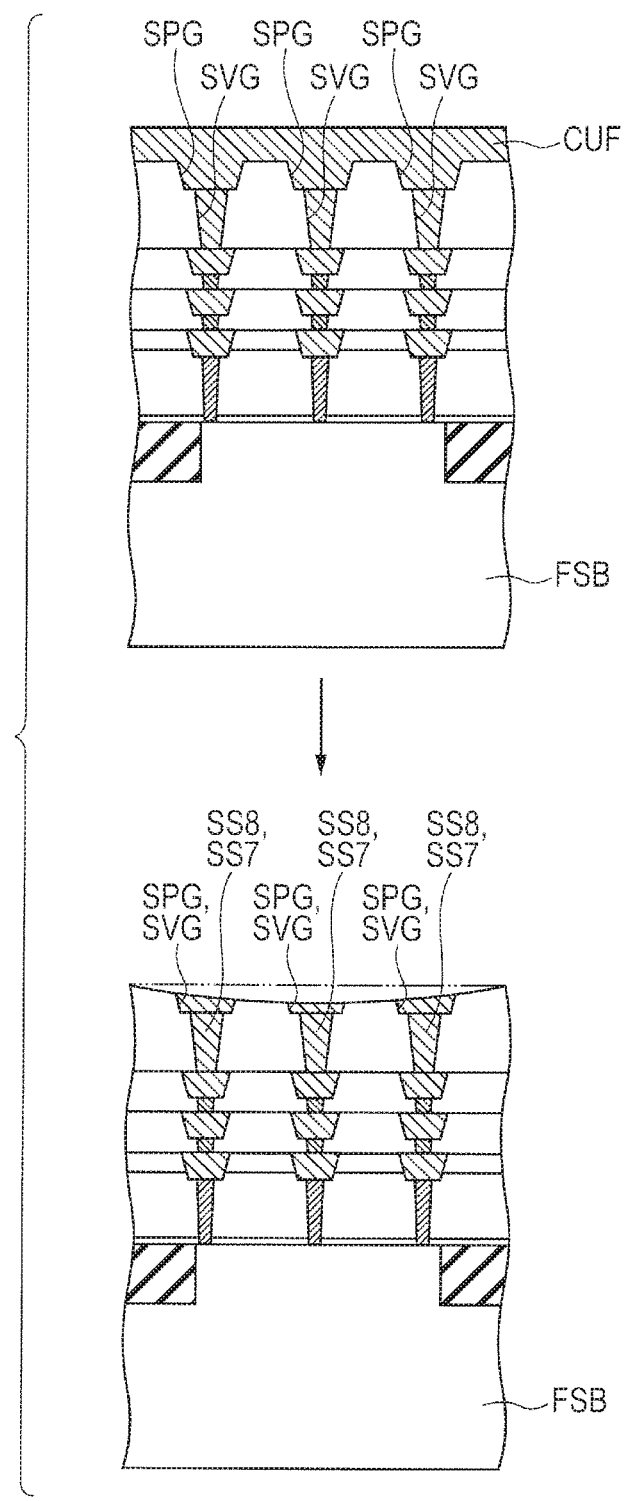
FIG. 31 is the first partially-enlarged cross-sectional view to describe the effect of the modified solid-state imaging device according to the first embodiment.

Assume that dishing has occurred during formation of the eighth layer portions SS8 of the first seal ring SLR at the bonded interface. In this case, as shown in FIG. 31, it is predicted that, the surface of the eighth layer portion SS8 of the first seal ring's second section in the middle of the three seal ring sections is positioned lower than the surfaces of the eighth layer portions SS8 of the first seal ring's first section and first seal ring's third section. Note that FIG. 31 exaggeratedly indicates the dished surface for purposes of illustration. This also occurs to the second seal ring LLR.

If the sensor substrate and logic substrate having the dished surfaces are bonded together, a gap caused by the dishing is produced at the bonded interface, and probably cannot provide desired bonding strength between the sensor substrate and logic substrate.

As shown in FIG. 29, the width W3 of the eighth layer portion SS8 of the first seal ring's second section SSR, which is positioned in the middle of the three sections of the first seal ring SLR, is set less than the width W2 of the eighth layer portions SS8 of the first seal ring's first section SFR and first seal ring's third section STR positioned on the opposite sides.

Figure 32:
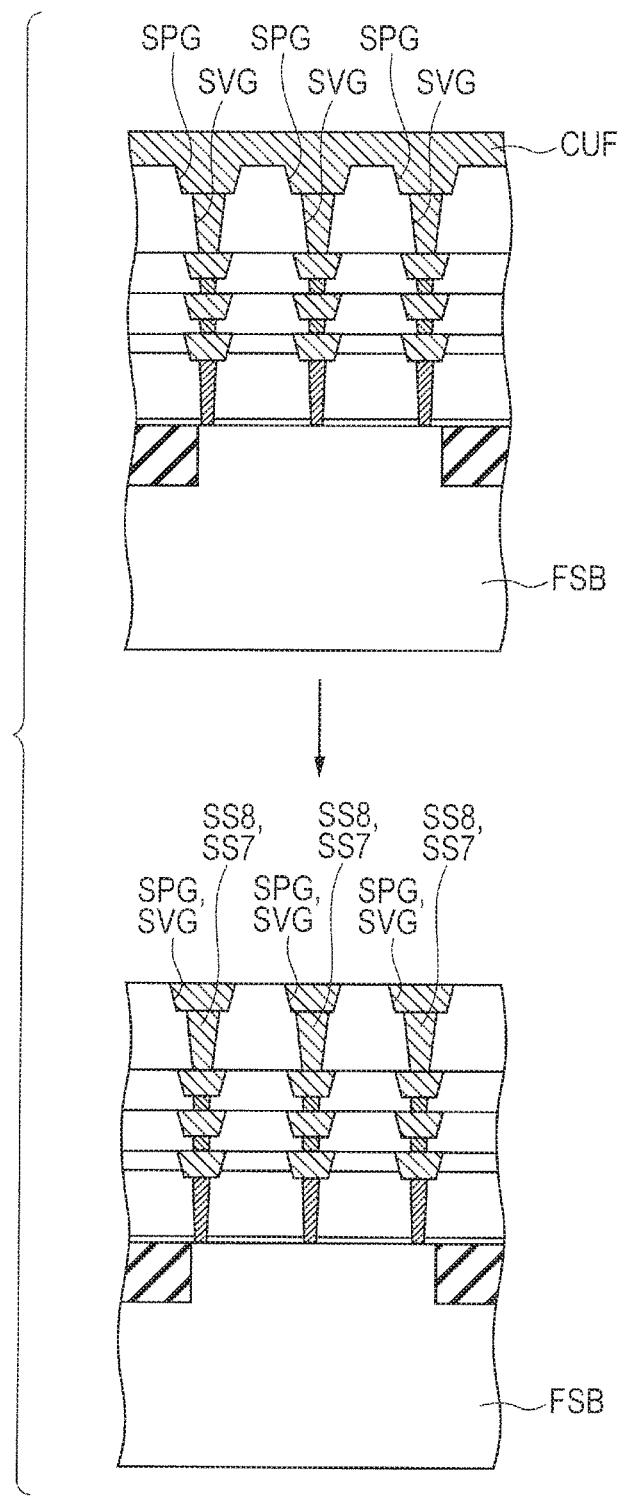
FIG. 32 is the second partially-enlarged cross-sectional view to describe the effect of the modified solid-state imaging device according to the first embodiment.

Setting such a dimensional correlation decreases the density of the metal film pattern at the center area of the dense metal-film pattern region. The decrease in the density reduces dishing during formation of the eighth layer portions SS8 as shown in FIG. 32, and therefore the surface of the eighth layer portion SS8 of the first seal ring's second section LSR in the middle is almost equal in level with the surfaces of the eighth layer portions SS8 of the first seal ring's first section LFR and first seal ring's third section LTR. This also occurs to the second seal ring LLR. The reduction in dishing allows the sensor substrate SEN and logic substrate LGC to bond to each other without a gap, which can provide desired bonding strength between the sensor substrate SEN and logic substrate LGC.

Second Embodiment

Figure 33:
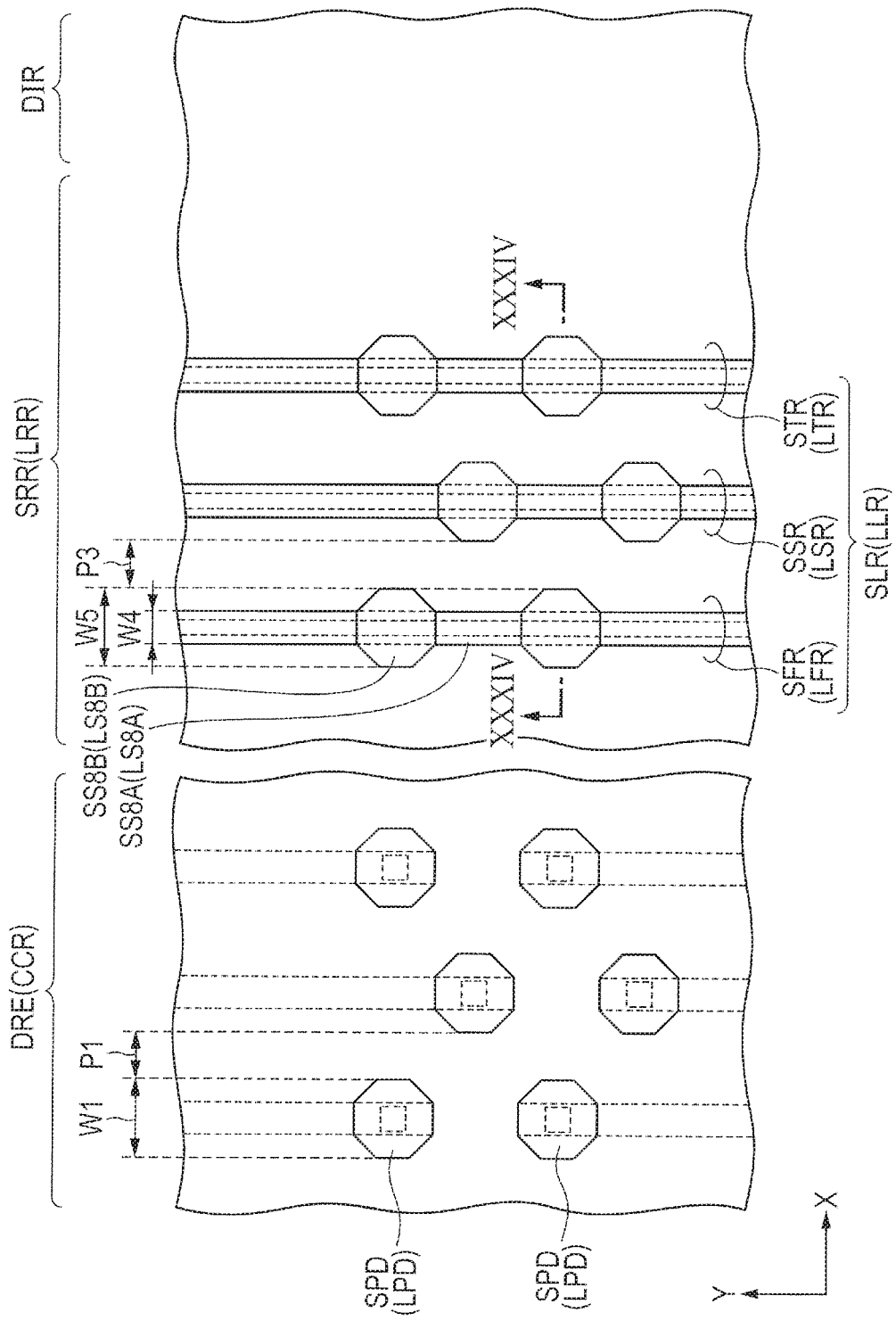
FIG. 33 is a partially-enlarged plan view showing an exemplary planar pattern at a bonded interface of a solid-state imaging device according to the second embodiment, the bonded interface being cut out along a dotted frame A shown in FIG. 1.
Figure 34:
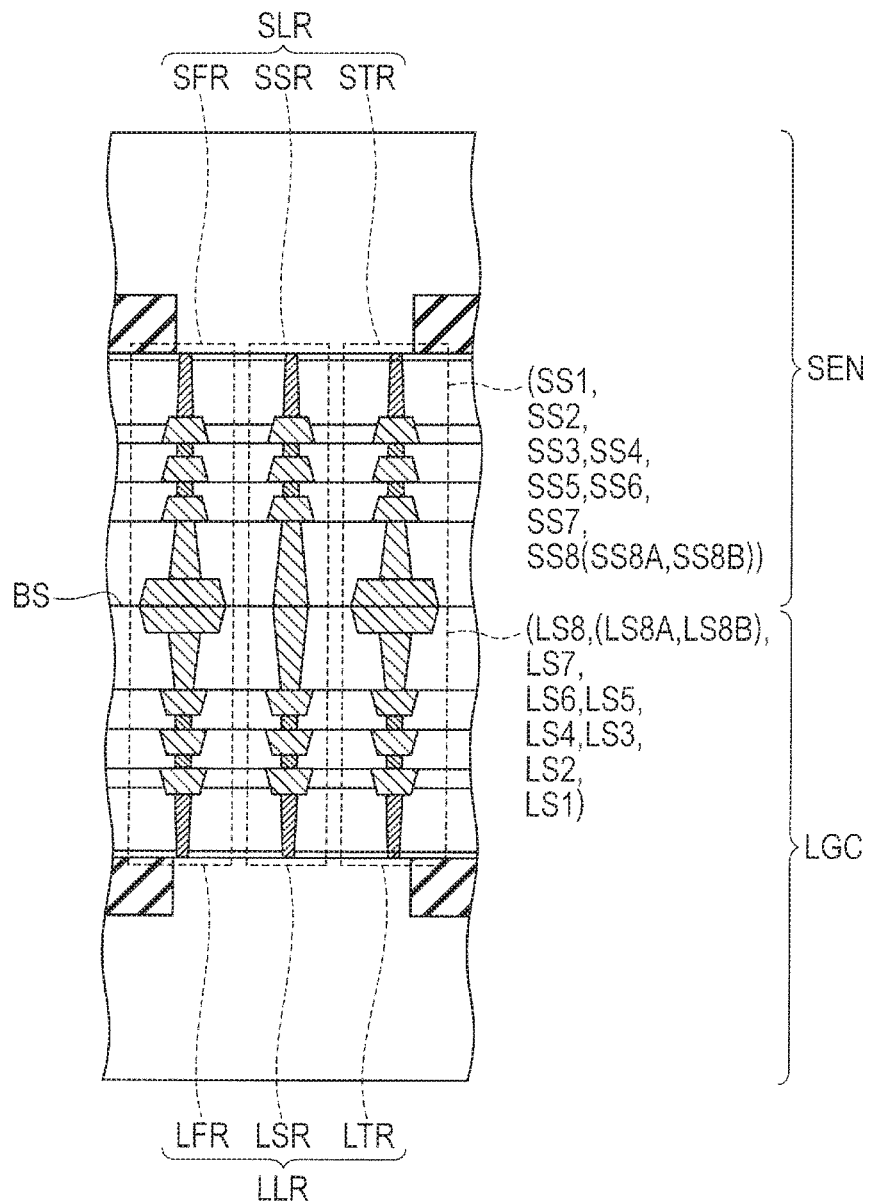
FIG. 34 is a partial cross-sectional view of the solid-state imaging device, taken along a cross-sectional line XXXIV-XXXIV in FIG. 33, according to the second embodiment.

An exemplary solid-state imaging device according to the second embodiment will be described. As shown in FIGS. 33 and 34, the size (X direction) of the bonding pads SPD (bonding pads LPD) in the device region DRE (circuit region CCR) is set to size W1. The pitch (X direction) between the bonding pads LPD (bonding pads LPD) is set to pitch P1.

In the first seal ring region SRR, each of the first seal ring's first section SFR, first seal ring's second section SSR, and first seal ring's third section STR is made up of a first layer portion SS1, a second layer portion SS2, a third layer portion SS3, a fourth layer portion SS4, a fifth layer portion SS5, a sixth layer portion SS6, a seventh layer portion SS7, and an eighth layer portion SS8. The eighth layer portions SS8 include wall-like portions SS8A having a width W4 (X direction) and extending in the form of a wall, and pad-like portions SS8B having a width W5 (X direction).

In the second seal ring region LRR, each of the second seal ring's first section LFR, second seal ring's second section LSR, and second seal ring's third section LTR is made up of a first layer portion LS1, a second layer portion LS2, a third layer portion LS3, a fourth layer portion LS4, a fifth layer portion LS5, a sixth layer portion LS6, a seventh layer portion LS7, and an eighth layer portion LS8. The eighth layer portions LS8 include wall-like portions LS8A having a width W4 (X direction) and extending in the form of a wall, and pad-like portions LS8B having a width W5 (X direction).

The width W5 of the pad-like portions SS8B (pad-like portions LS8B) is set to be greater than the width W4 of the wall-like portions SS8A (wall-like portions LS8A). The width W5 of the pad-like portions SS8B (pad-like portions LS8B) is set not to exceed the size W1 (X direction) of the bonding pads SPD (bonding pads LPD). The pitch between the pad-like portions SS8B (pad-like portions LS8B) in a direction (X direction) is set to pitch P3. The pitch P3 is set to be equal to or greater than the pitch P1. The pad-like portions SS8B (pad-like portions LS8B) may be shaped similar to the bonding pads SPD (bonding pads LPD).

In addition, the pad-like portions SS8B (pad-like portions LS8B) are arranged such that part of the pad-like portions SS8B (pad-like portions LS8B) is always present in the directions intersecting with the directions along which the first seal ring SLR (second seal ring LLR) extends. For instance, in the arrangement shown in FIG. 33, the pad-like portions SS8B (pad-like portions LS8B) are arranged such that any line segments in parallel with the axis X intersect with part of the pad-like portions SS8B (pad-like portions LS8B).

The bonding pads SPD and bonding pads LPD are bonded to each other at the bonded interface BS within the device region DRE and circuit region CCR (see FIG. 2). The pad-like portions SS8B and pad-like portions LS8B are bonded to each other at the bonded interface BS within the first seal ring region SRR and second seal ring region LRR. The wall-like portions SS8A and wall-like portions LS8A are bonded to each other. Note that the other configurations are the same as the configurations of the solid-state imaging device shown in FIG. 2 and other figures, and therefore the same components are denoted by the same reference symbols or reference numerals and the description thereof will not be reiterated except as required.

The above-described solid-state imaging device has the pad-like portions SS8B (pad-like portions LS8B) with the width W5 that is set to be greater than the width W4 of the wall-like portions SS8A (wall-like portions LS8A), but not to exceed the size W1 (X direction) of the bonding pads SPD (bonding pads LPD) (width W4≤width W5≤size W1). In addition, the width W4 of the wall-like portions SS8A (wall-like portions LS8A) is set to be less than the width W2 (see FIG. 3).

Furthermore, the pitch P3 between the pad-like portions SS8B (pad-like portions LS8B) in a direction (X-axis direction) is set to be equal to or greater than the pitch P1 between the bonding pads SPD (bonding pads LPD) in the direction (X-axis direction) (pitch P3≥pitch P1).

This makes the density of the metal film pattern in the first seal ring region SRR (second seal ring region LRR) closer to the density of the metal film pattern in the device region DRE (circuit region CCR). Making the densities closer can reliably reduce the occurrence of dishing during formation of the eighth layer portions SS8 (LS8) at the bonded interface through the chemical mechanical polishing process. Consequently, the sensor substrate SEN and logic substrate LGC can be tightly bonded to each other without leaving a gap at the bonded interface in the first seal ring region SRR (second seal ring LRR), thereby preventing entry of moisture.

In addition, since part of the pad-like portions SS8B (pad-like portions LS8B) is always present in the directions intersecting with the directions along which the first seal ring SLR (second seal ring LLR) extends, the first seal ring SLR (second seal ring LLR) and the pad-like portions SS8B (pad-like portions LS8B) can prevent possible cracks produced while the wafer is diced along the dicing regions DIR from extending into the device region DRE and circuit region CCR.

Third Embodiment

Figure 35:
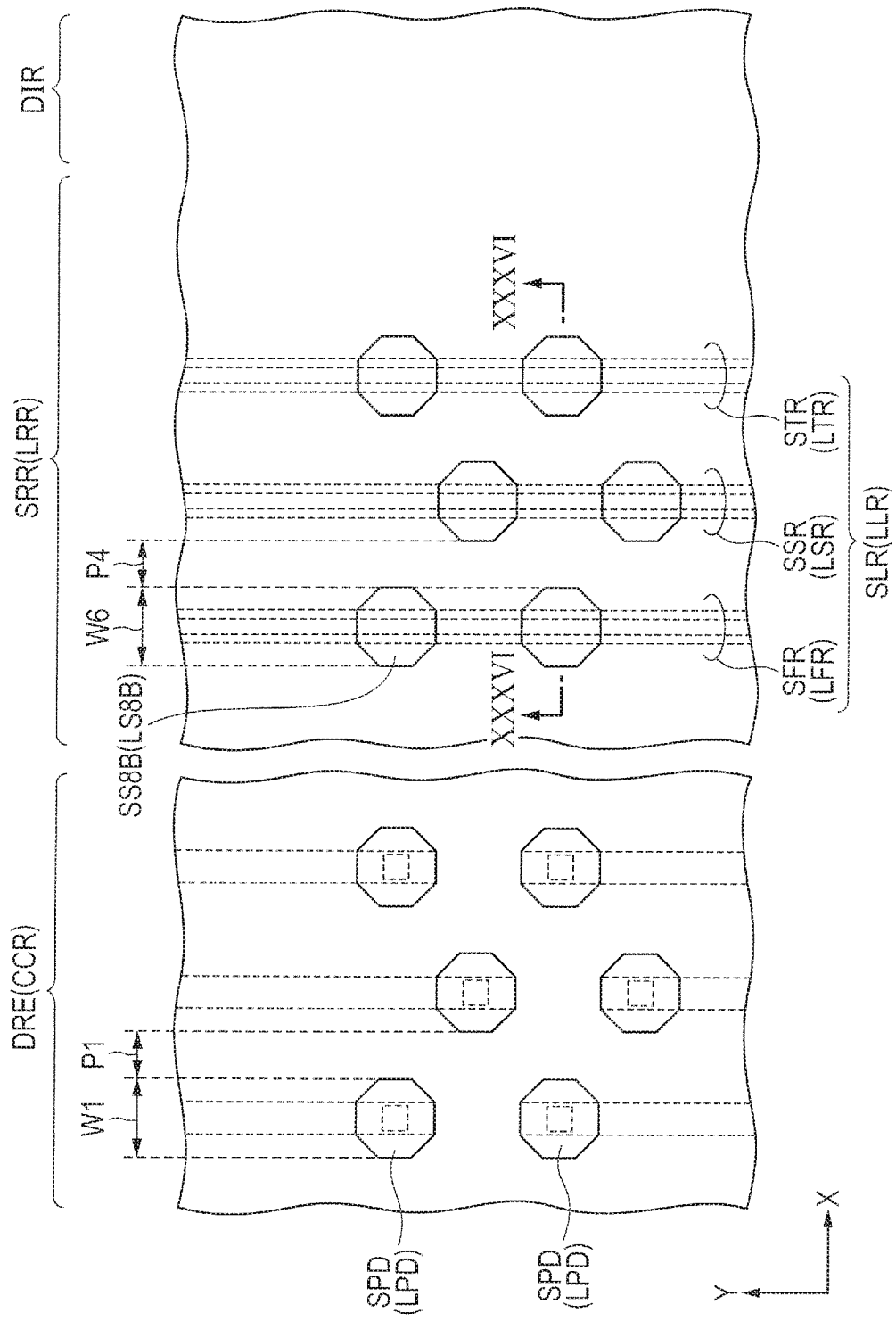
FIG. 35 is a partially-enlarged plan view showing an exemplary planar pattern at a bonded interface of a solid-state imaging device according to the third embodiment, the bonded interface being cut out along a dotted frame A shown in FIG. 1.
Figure 36:
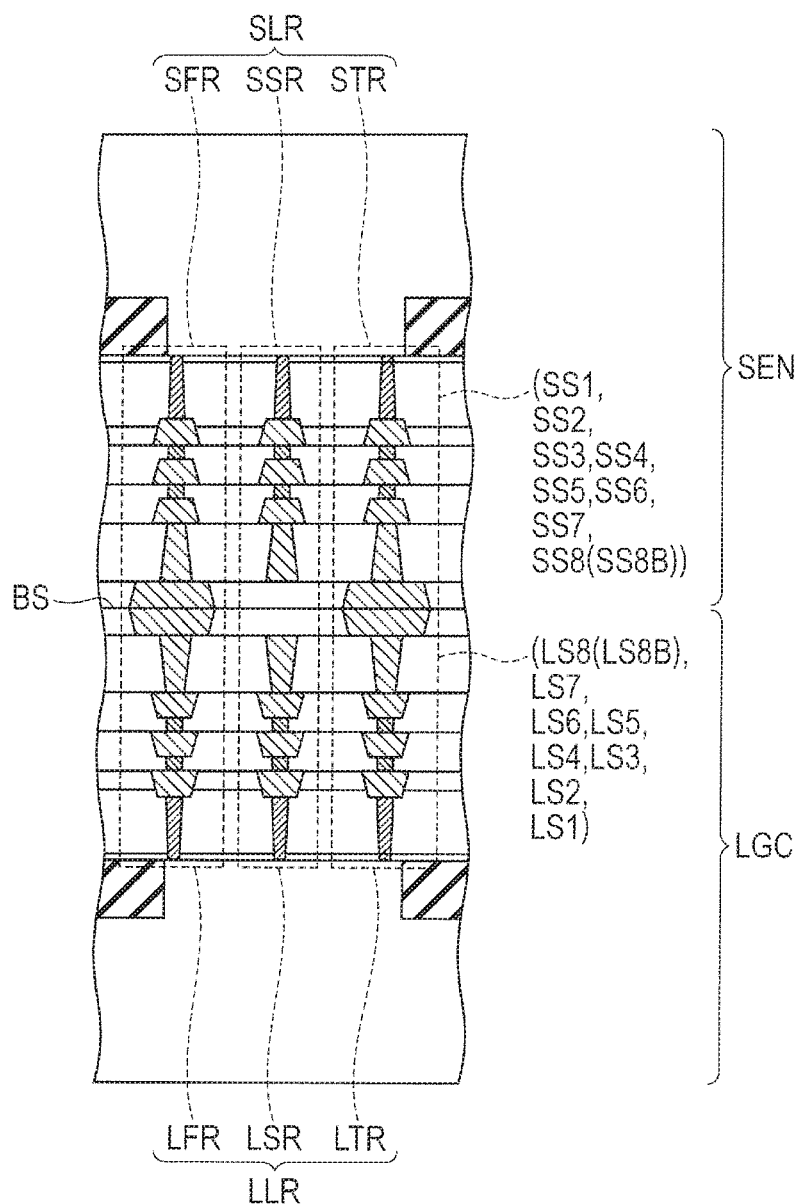
FIG. 36 is a partial cross-sectional view of the solid-state imaging device, taken along a cross-sectional line XXXVI-XXXVI in FIG. 35, according to the third embodiment.

An exemplary solid-state imaging device according to the third embodiment will be described. As shown in FIGS. 35 and 36, the size (X direction) of the bonding pads SPD (bonding pads LPD) in the device region DRE (circuit region CCR) is set to size W1. The pitch (X direction) between the bonding pads LPD (bonding pads LPD) is set to pitch P1.

In the first seal ring region SRR, each of the first seal ring's first section SFR, first seal ring's second section SSR, and first seal ring's third section STR is made up of a first layer portion SS1, a second layer portion SS2, a third layer portion SS3, a fourth layer portion SS4, a fifth layer portion SS5, a sixth layer portion SS6, a seventh layer portion SS7, and an eighth layer portion SS8. The eighth layer portions SS8 correspond to pad-like portions SS8B having a width W6 (X direction).

In the second seal ring region LRR, each of the second seal ring's first section LFR, second seal ring's second section LSR, and second seal ring's third section LTR is made up of a first layer portion LS1, a second layer portion LS2, a third layer portion LS3, a fourth layer portion LS4, a fifth layer portion LS5, a sixth layer portion LS6, a seventh layer portion LS7, and an eighth layer portion LS8. The eighth layer portions LS8 correspond to pad-like portions LS8B having a width W6 (X direction).

The width W6 of the pad-like portions SS8B (pad-like portions LS8B) is set not to exceed the size W1 (X direction) of the bonding pads SPD (bonding pads LPD). The pitch between the pad-like portions SS8B (pad-like portions LS8B) in a direction (X direction) is set to pitch P4. The pitch P4 is set to be equal to or greater than the pitch P1.

In addition, the pad-like portions SS8B (pad-like portions LS8B) are arranged such that part of the pad-like portions SS8B (pad-like portions LS8B) is always present in the directions intersecting with the directions along which the first seal ring SLR (second seal ring LLR) extends. For instance, in the arrangement shown in the FIG. 35, the pad-like portions SS8B (pad-like portions LS8B) are arranged such that any line segments in parallel with the axis X intersect with part of the pad-like portions SS8B (pad-like portions LS8B).

The bonding pads SPD and bonding pads LPD are bonded to each other at the bonded interface BS within the device region DRE and circuit region CCR (see FIG. 2). The pad-like portions SS8B and pad-like portions LS8B are bonded to each other at the bonded interface BS within the first seal ring region SRR and second seal ring region LRR. Note that the other configurations are the same as the configurations of the solid-state imaging device shown in FIG. 2 and other figures, and therefore the same components are denoted by the same reference symbols or reference numerals and the description thereof will not be reiterated except as required.

The eighth layer portions SS8 (eighth layer portions LS8) positioned at the bonded surface BS in the solid-state imaging devices according to the first and second embodiments are formed using a dual damascene method; however, the eighth layer portions SS8 (eighth layer portions LS8) in the aforementioned solid-state imaging device are formed using a single damascene method. An example of the manufacturing method will be described.

Figure 37:
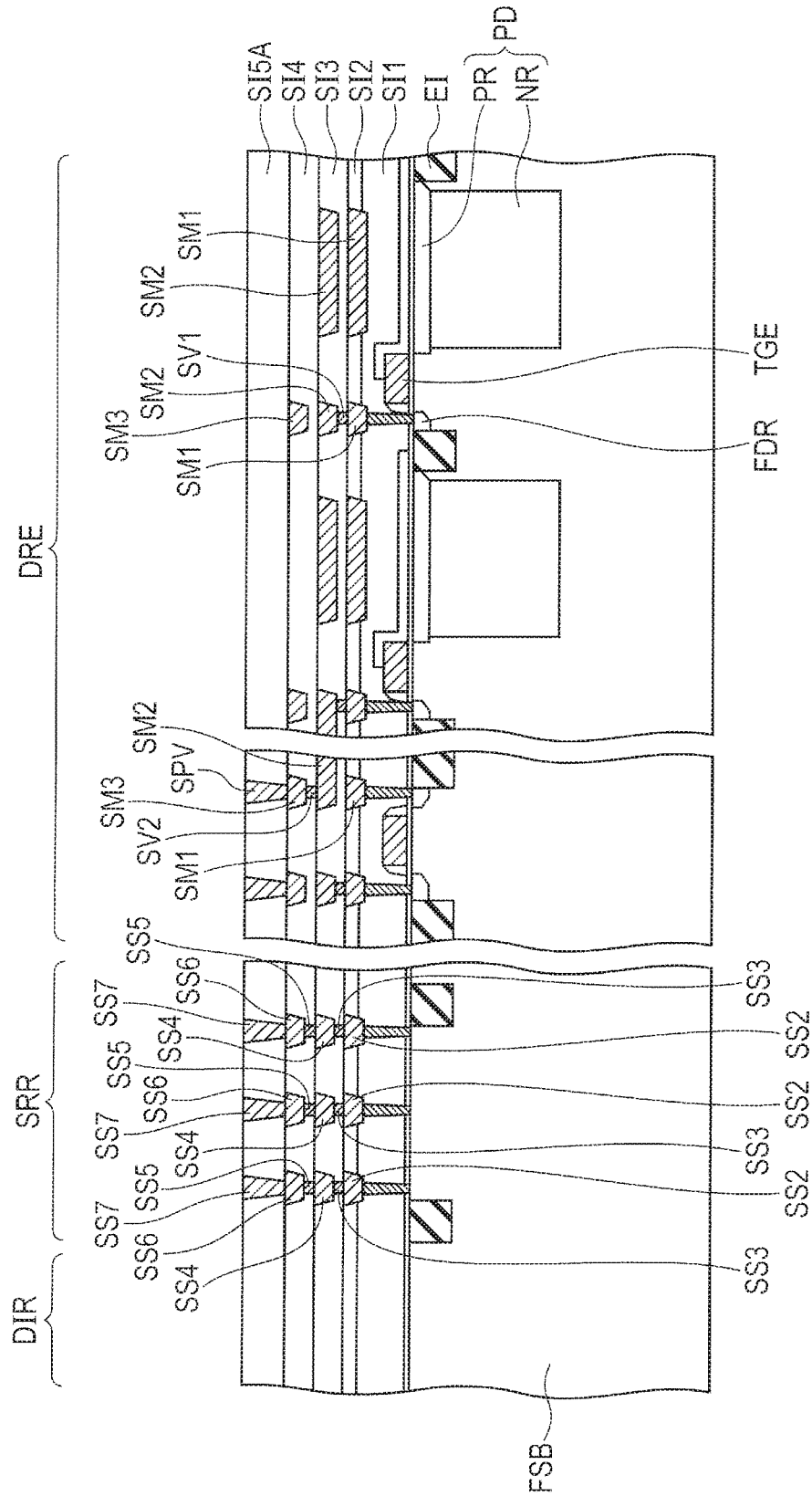
FIG. 37 is a cross-sectional view showing a process step for manufacturing the solid-state imaging device according to the third embodiment.

Firstly, a method for manufacturing a sensor substrate will be described. After the processes in common with the processes shown in FIGS. 5 to 11, a fifth interlayer insulating film's first portion SI5A is formed so as to cover the fourth interlayer insulating film SI4 as shown in FIG. 37. Then, vias SPV for bonding pads are formed in the device region DRE by a single damascene method. In the first seal ring region SRR, seventh layer portions SS7 of a seal ring are formed.

Figure 38:
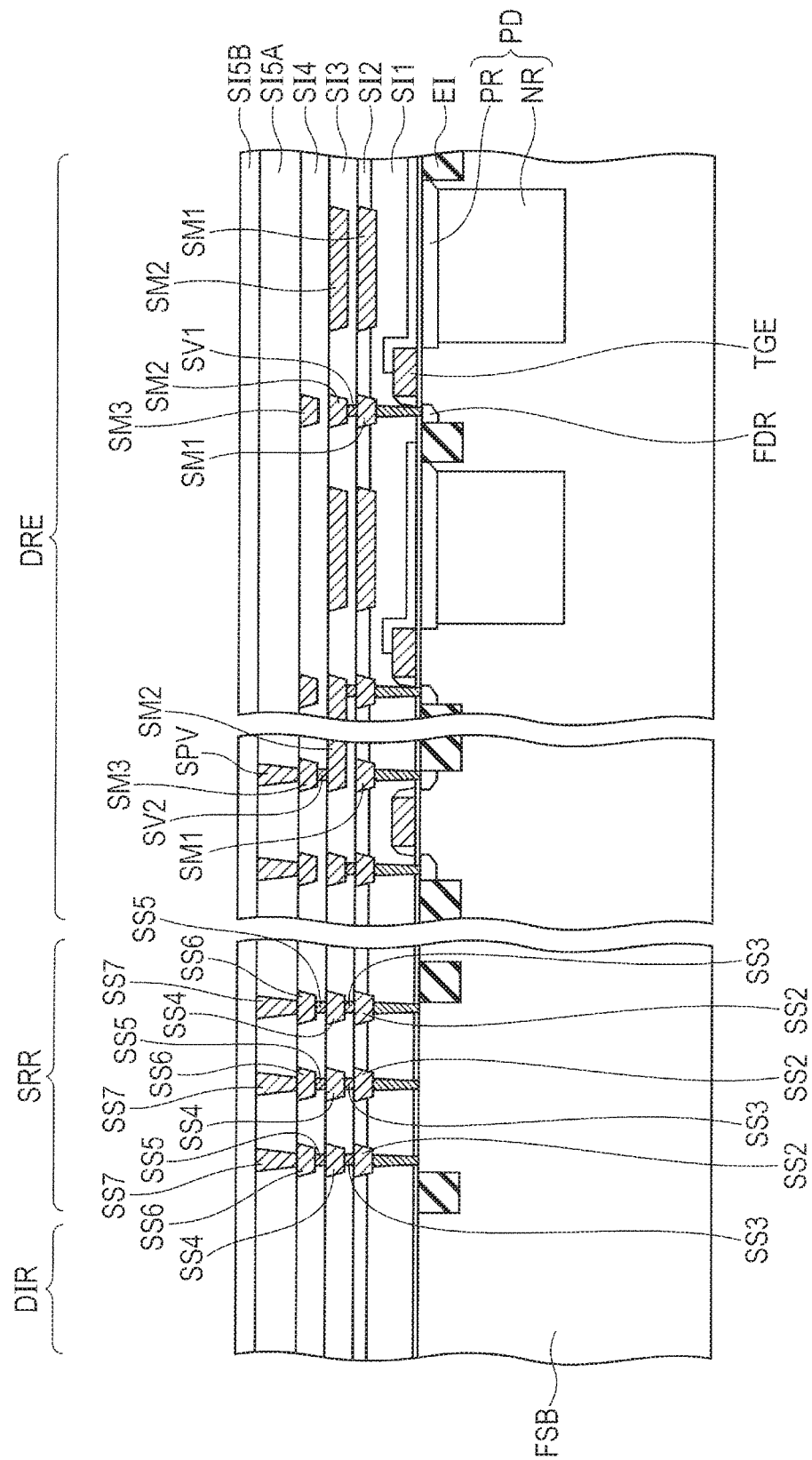
FIG. 38 is a cross-sectional view showing a process step subsequent to the process step shown in FIG. 37 in the third embodiment.
Figure 39:
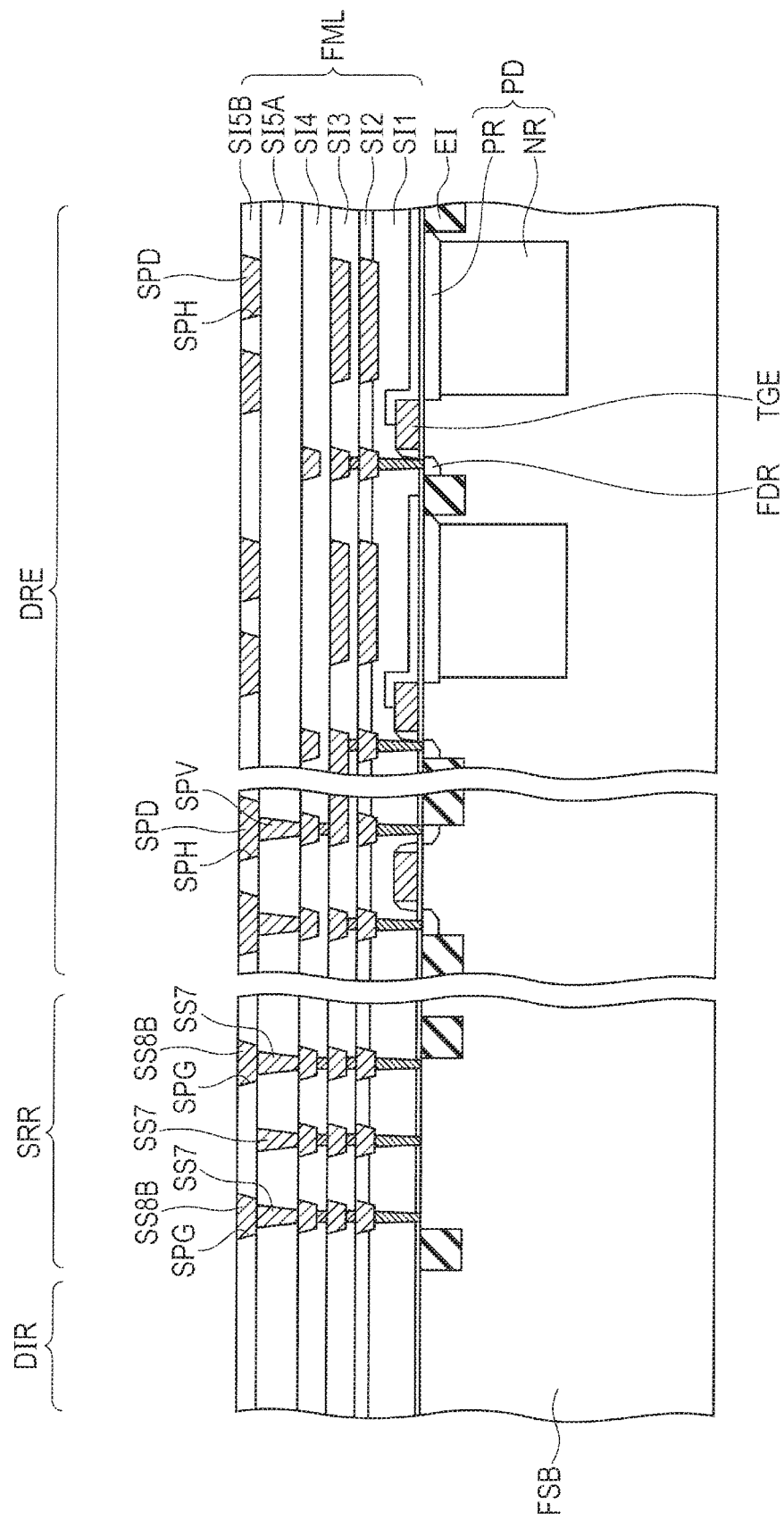
FIG. 39 is a cross-sectional view showing a process step subsequent to the process step shown in FIG. 38 in the third embodiment.

Next, as shown in FIG. 38, a fifth interlayer insulating film's second portion SI5B is formed so as to cover the fifth interlayer insulating film's first portion SI5A. Then, as shown in FIG. 39, bonding pads SPD are formed in pad openings SPH in the device region DRE by a single damascene method. In the first seal ring region SRR, pad-like portions SS8B, which serve as eighth layer portions SS8 of the seal ring, are formed in seal ring openings SPG.

Figure 40:
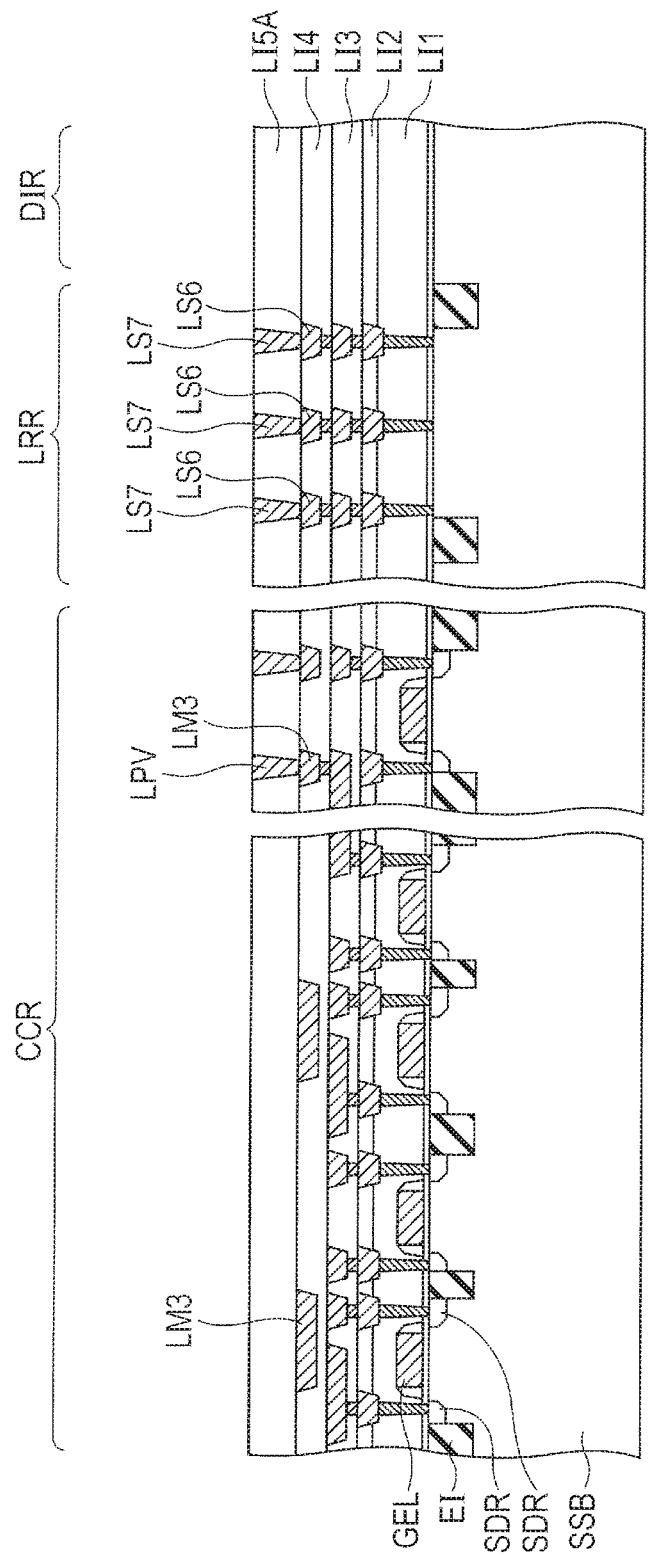
FIG. 40 is a cross-sectional view showing a process step subsequent to the process step shown in FIG. 39 in the third embodiment.

Next, a method for manufacturing a logic substrate will be described. After the processes in common with the processes shown in FIGS. 16 to 20, a fifth interlayer insulating film's first portion LI5A is formed so as to cover the fourth interlayer insulating film LI4 as shown in FIG. 40. Then, vias LPV for bonding pads are formed in the circuit region CCR by a single damascene method. In the second seal ring region LRR, seventh layer portions LS7 of a seal ring are formed.

Figure 41:
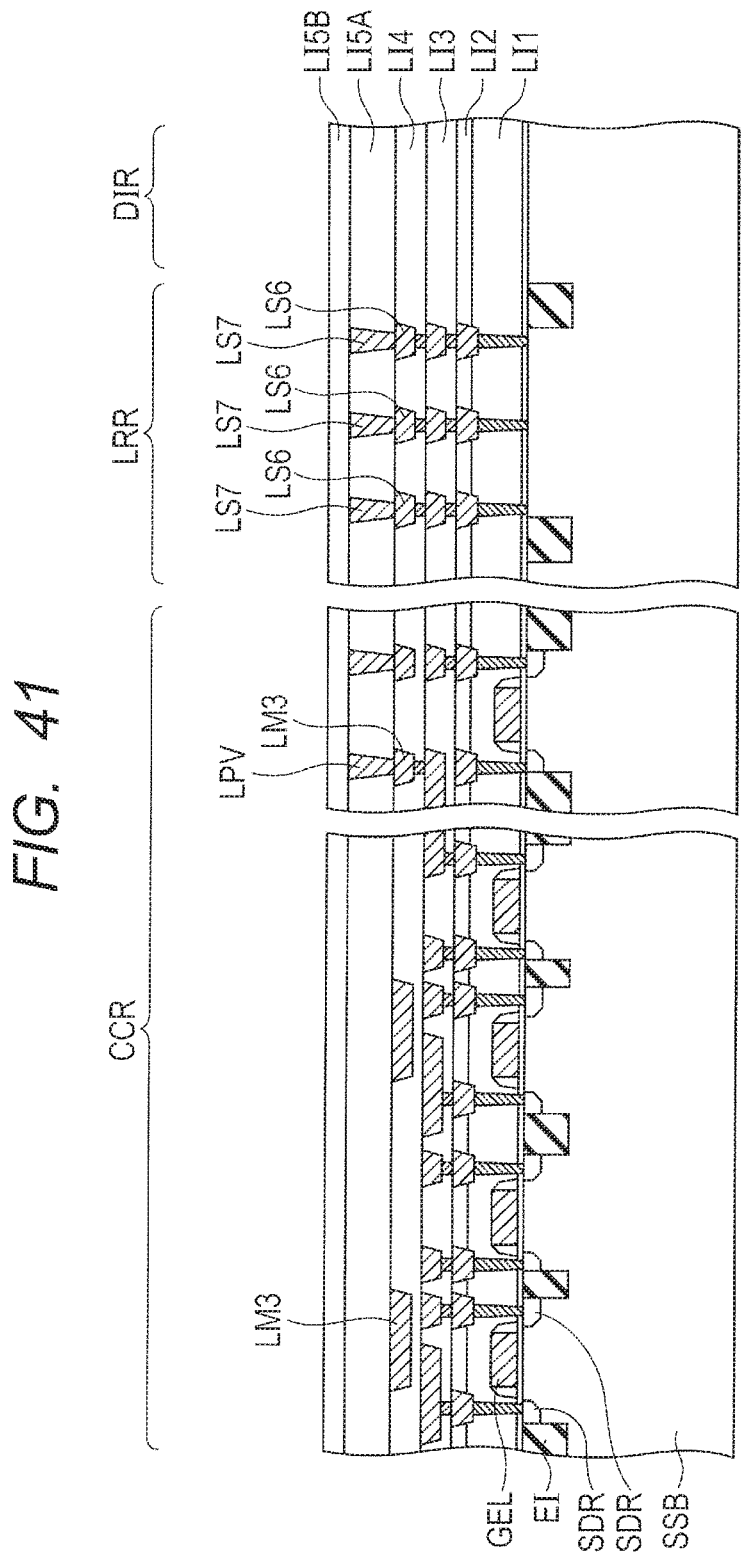
FIG. 41 is a cross-sectional view showing a process step subsequent to the process step shown in FIG. 40 in the third embodiment.
Figure 42:
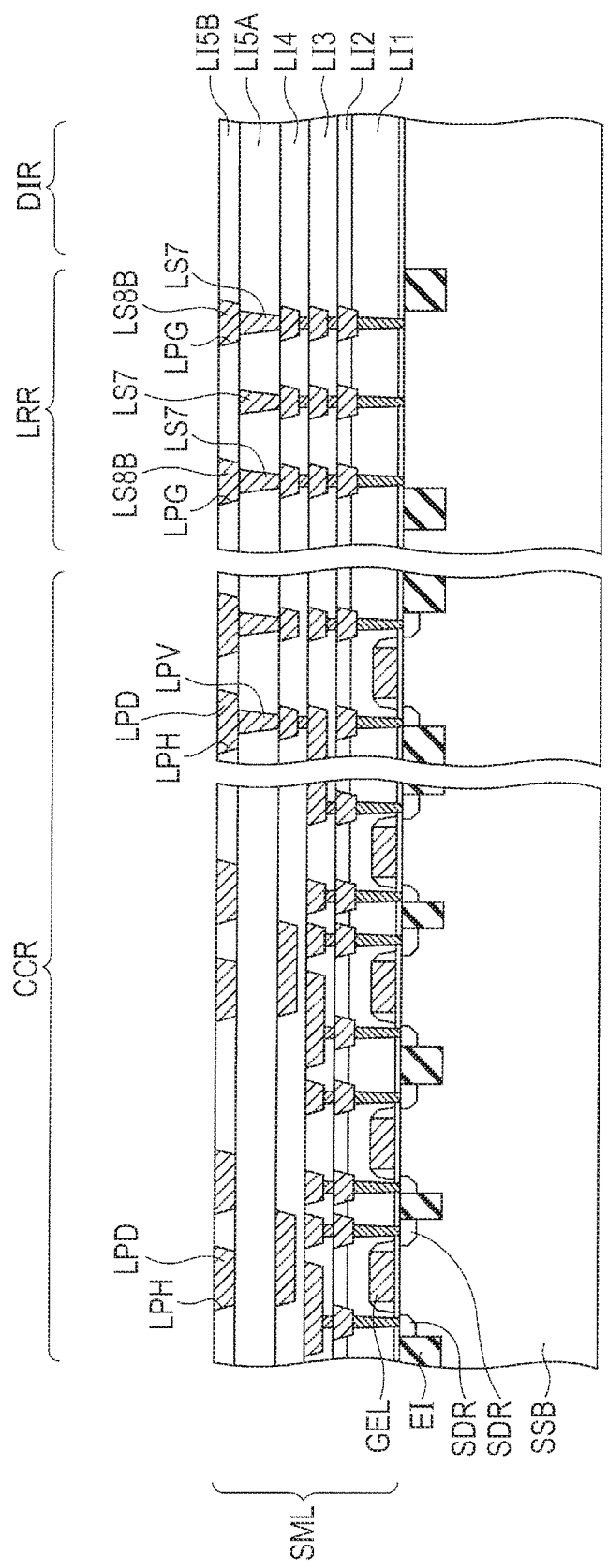
FIG. 42 is a cross-sectional view showing a process step subsequent to the process step shown in FIG. 41 in the third embodiment.

Next, as shown in FIG. 41, a fifth interlayer insulating film's second portion LI5B is formed so as to cover the fifth interlayer insulating film's first portion LI5A. Then, as shown in FIG. 42, bonding pads LPD are formed in pad openings LPH in the circuit region CCR by a single damascene method. In the second seal ring region LRR, pad-like portions LS8B, which serve as eighth layer portions LS8 of the seal ring, are formed in seal ring openings LPG.

Figure 43:
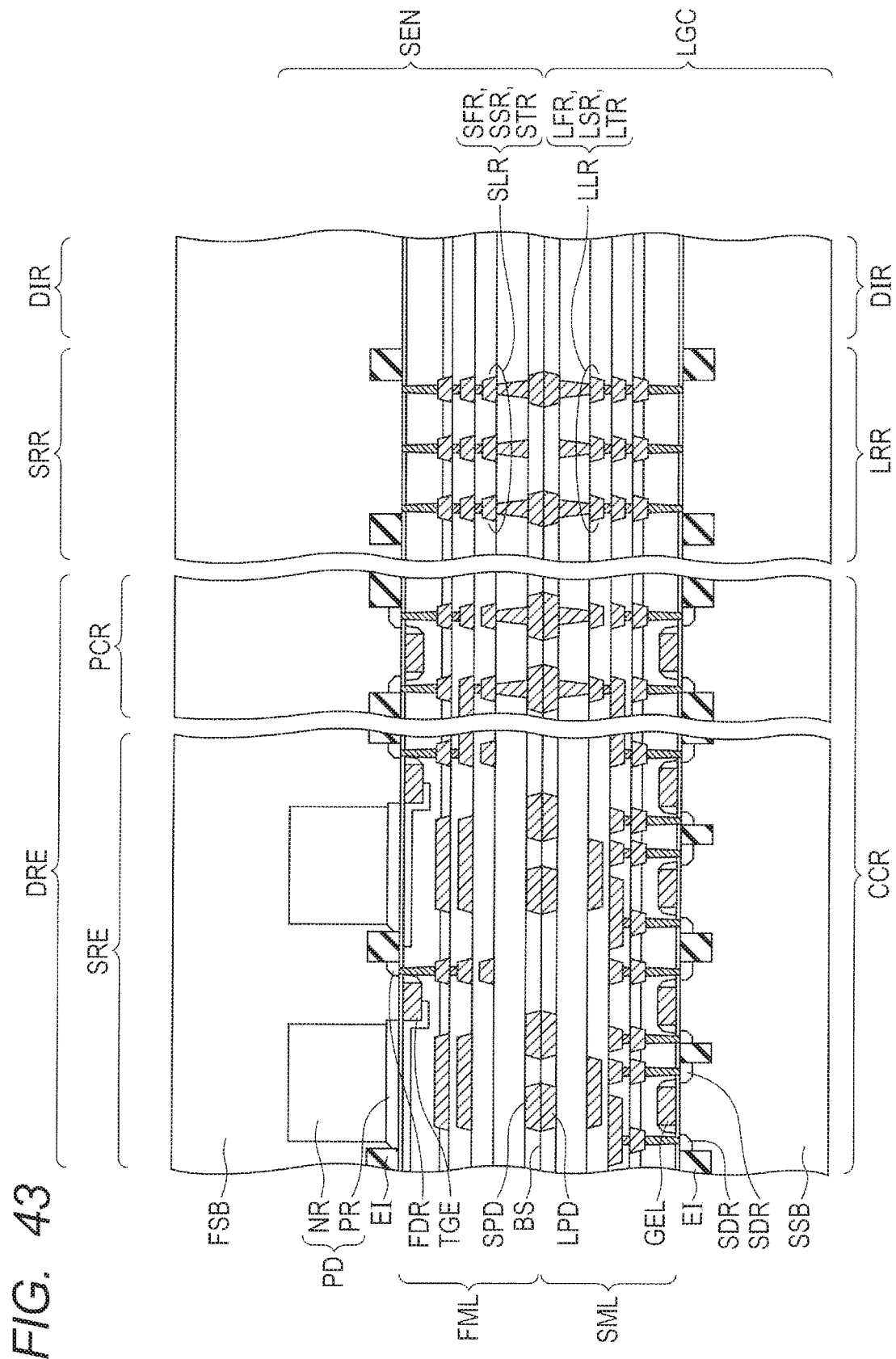
FIG. 43 is a cross-sectional view showing a process step subsequent to the process step shown in FIG. 42 in the third embodiment.

Through the process in common with the process shown in FIG. 25, the sensor substrate SEN and logic substrate LGC are bonded together as shown in FIG. 43. At this point, the bonding pads SPD and bonding pads LPD are aligned with each other. The pad-like portions SS8B (see FIG. 39) and pad-like portions LS8B (see FIG. 42) are aligned with each other.

Figure 44:
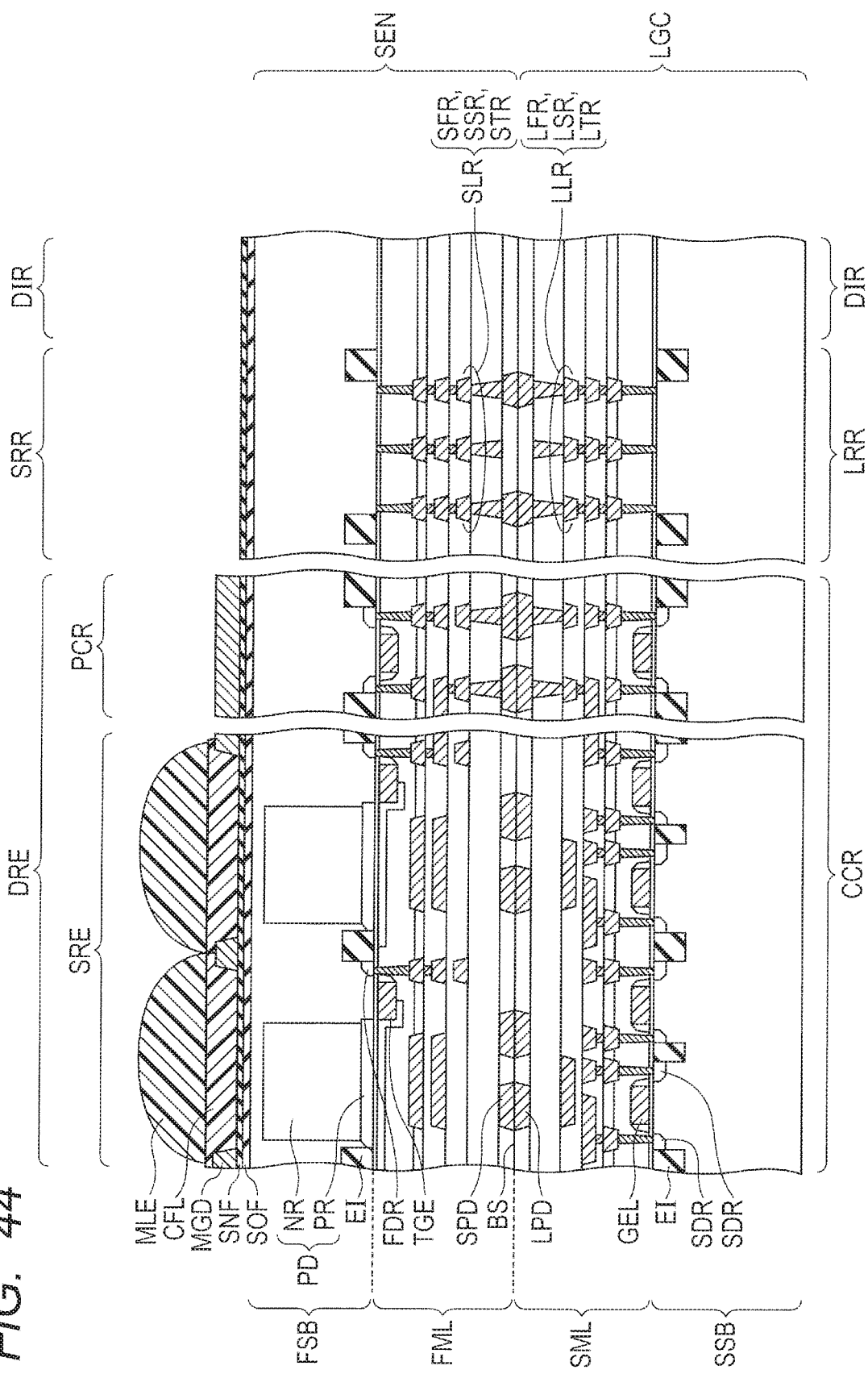
FIG. 44 is a cross-sectional view showing a process step subsequent to the process step shown in FIG. 43 in the third embodiment.

Through the processes in common with the processes shown in FIGS. 26 to 28, the main part of the solid-state imaging device is formed as shown in FIG. 44. Subsequently, the wafer is diced along the dicing regions DIR to take out solid-state imaging devices in the form of chips.

The width W6 of the pad-like portions SS8B (pad-like portions LS8B) of the above-described solid-state imaging device is set not to exceed the size W1 (X direction) of the bonding pads SPD (bonding pads LPD) (width W6≤size W1). Furthermore, the pitch P4 between the pad-like portions SS8B (pad-like portions LS8B) in a direction (X-axis direction) is set to be equal to or greater than the pitch P1 between the bonding pads SPD (bonding pads LPD) in a direction (X-axis direction) (pitch P4≥pitch P1).

Setting such a dimensional correlation makes the density of the metal film pattern in the first seal ring region SRR (second seal ring region LRR) closer to the density of the metal film pattern in the device region DRE (circuit region CCR). Making the densities closer can reliably reduce the occurrence of dishing during formation of the pad-like portions SS8B (LS8B) at the bonded interface through the chemical mechanical polishing process. Consequently, the sensor substrate SEN and logic substrate LGC can be properly bonded to each other without leaving a gap at the bonded interface in the first seal ring region SRR (second seal ring LRR), thereby preventing entry of moisture.

In addition, since part of the pad-like portions SS8B (pad-like portions LS8B) is always present in the directions intersecting with the directions along which the first seal ring SLR (second seal ring LLR) extends, the first seal ring SLR (second seal ring LLR) and the pad-like portions SS8B (pad-like portions LS8B) can prevent possible cracks produced while the wafer is diced along the dicing regions DIR from extending into the device region DRE and circuit region CCR.

(Modification)

The above-described solid-state imaging device is presented as an example in which the pad-like portions SS8B (pad-like portions LS8B) are coupled to the seventh layer portions SS7 (seventh layer portions LS7) in the first seal ring region SRR (second seal ring region LRR). A modification of the solid-state imaging device will be described below.

Figure 45:
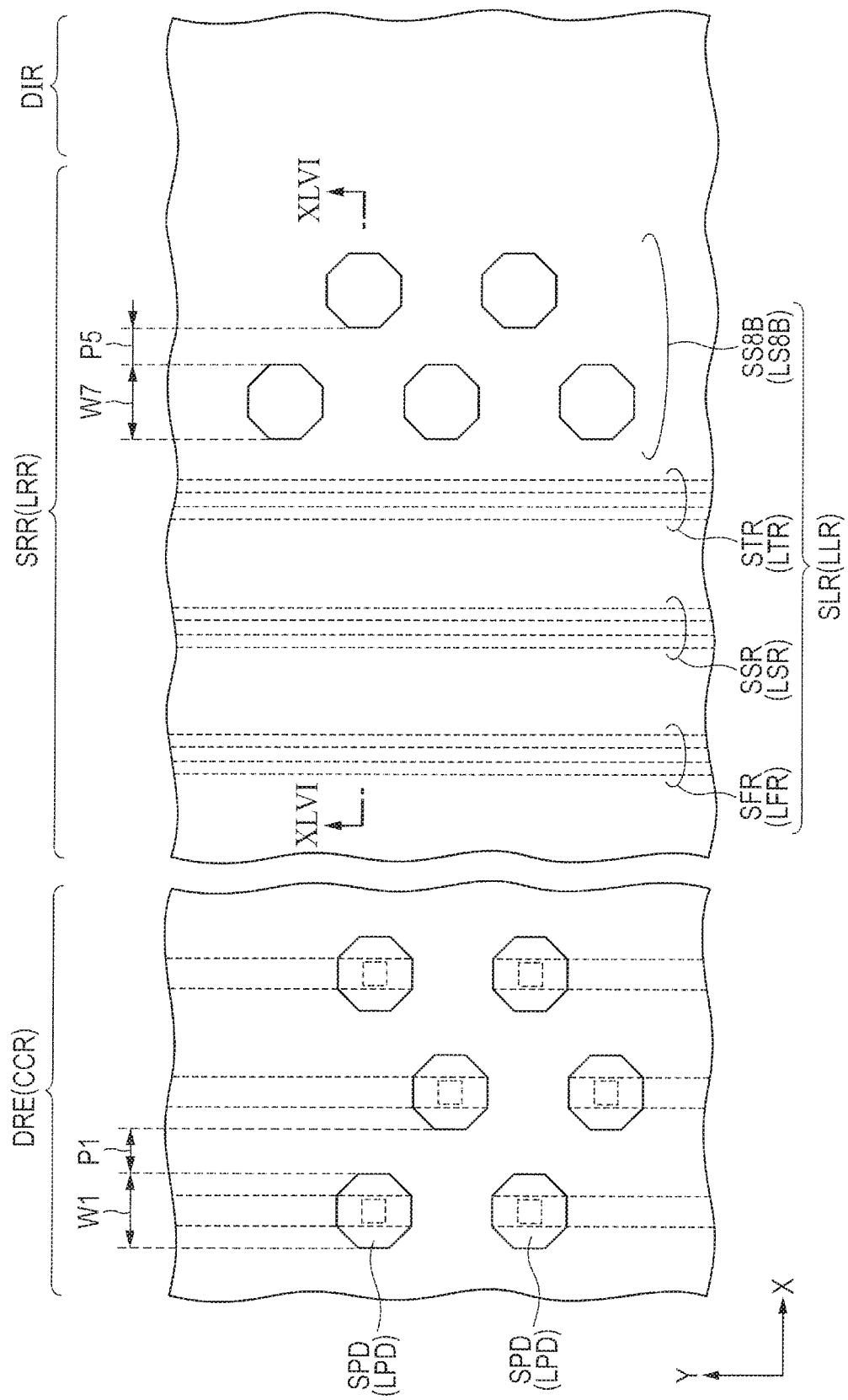
FIG. 45 is a partially-enlarged plan view showing an exemplary planar pattern of a seal ring at a bonded interface of a modified solid-state imaging device in the third embodiment.
Figure 46:
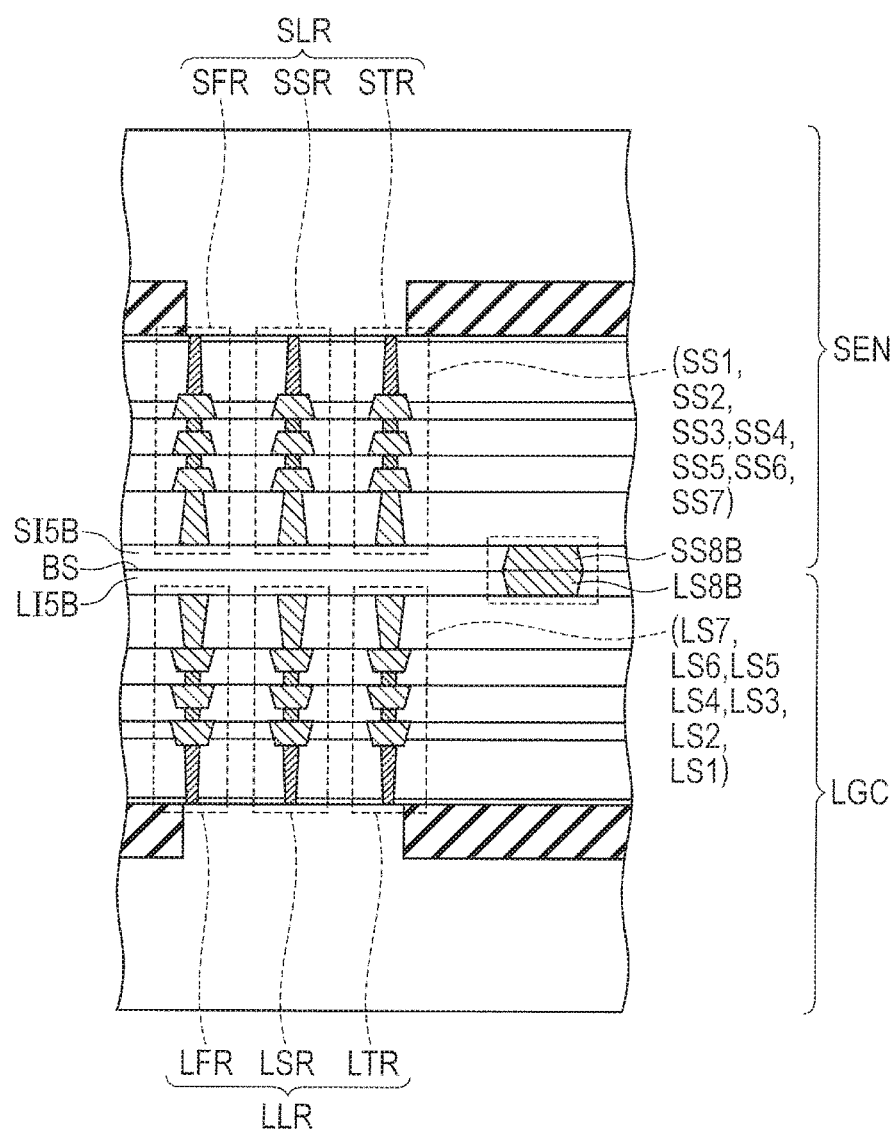
FIG. 46 is a partial cross-sectional view of the modified solid-state imaging device, taken along a cross-sectional line XLVI-XLVI in FIG. 45, according to the third embodiment.

As shown in FIGS. 45 and 46, the solid-state imaging device according to this modification includes pad-like portions SS8B (pad-like portions LS8B) that are not coupled to the seventh layer portions SS7 (seventh layer portions LS7), and are disposed in the first seal ring region SRR (second seal ring region LRR) in proximity to the dicing region DIR. The pad-like portions SS8B (pad-like portions LS8B) are spaced out in the Y direction. The pad-like portions SS8B (pad-like portions LS8B) spaced out in the Y direction are arranged in two rows in the X direction.

The width W7 of the pad-like portions SS8B (pad-like portions LS8B) is set not to exceed the size W1 (X direction) of the bonding pads SPD (bonding pads LPD) (width W7≤size W1). In addition, the pitch P5 between the pad-like portions SS8B (pad-like portions LS8B) in a direction (X-axis direction) is set to be equal to or greater than the pitch P1 between the bonding pads SPD (bonding pads LPD) in a direction (X-axis direction) (pitch P5≥pitch P1).

Note that the other configurations are the same as the configurations of the solid-state imaging device shown in FIGS. 35 and 36, and therefore the same components are denoted by the same reference symbols or reference numerals, and the description thereof will not be reiterated except as required.

The solid-state imaging device according to the modification can be manufactured through the same method (single damascene method) as that for the solid-state imaging device shown in FIG. 35 and other figures by only changing the pattern of the pad-like portions SS8B (pad-like portions LS8B) to be formed.

In the above-described solid-state imaging device, the pad-like portions SS8B (pad-like portions LS8B) are arranged in the first seal ring region SRR (second seal ring region LRR) in proximity to the dicing region DIR. This arrangement allows a fifth interlayer insulating film's second portion SI5B and fifth interlayer insulating film's second portion LI5B to be interposed between the seventh layer portions SS7 of the first seal ring SLR and seventh layer portions LS7 of the second seal ring LLR. The interposition prevents the area where the first seal ring SLR (second seal ring LLR) is present from being dished. As a result, the sensor substrate SEN and logic substrate LGC are properly bonded together, and therefore can prevent entry of moisture.

In addition, the pad-like portions SS8B (pad-like portions LS8B) are arranged in the first seal ring region SRR (second seal ring region LRR) in proximity to the dicing region DIR. Furthermore, the pad-like portions SS8B (pad-like portions LS8B) are arranged such that part of the pad-like portions SS8B (pad-like portions LS8B) is always present in the directions intersecting with the directions along which the first seal ring SLR (second seal ring LLR) extends. Even if a crack is produced in the wafer while the wafer is diced along the dicing regions DIR, the first seal ring SLR (second seal ring LLR) and the pad-like portions SS8B (pad-like portions LS8B) can prevent the crack from extending into the device region DRE and circuit region CCR.

Fourth Embodiment

Figure 47:
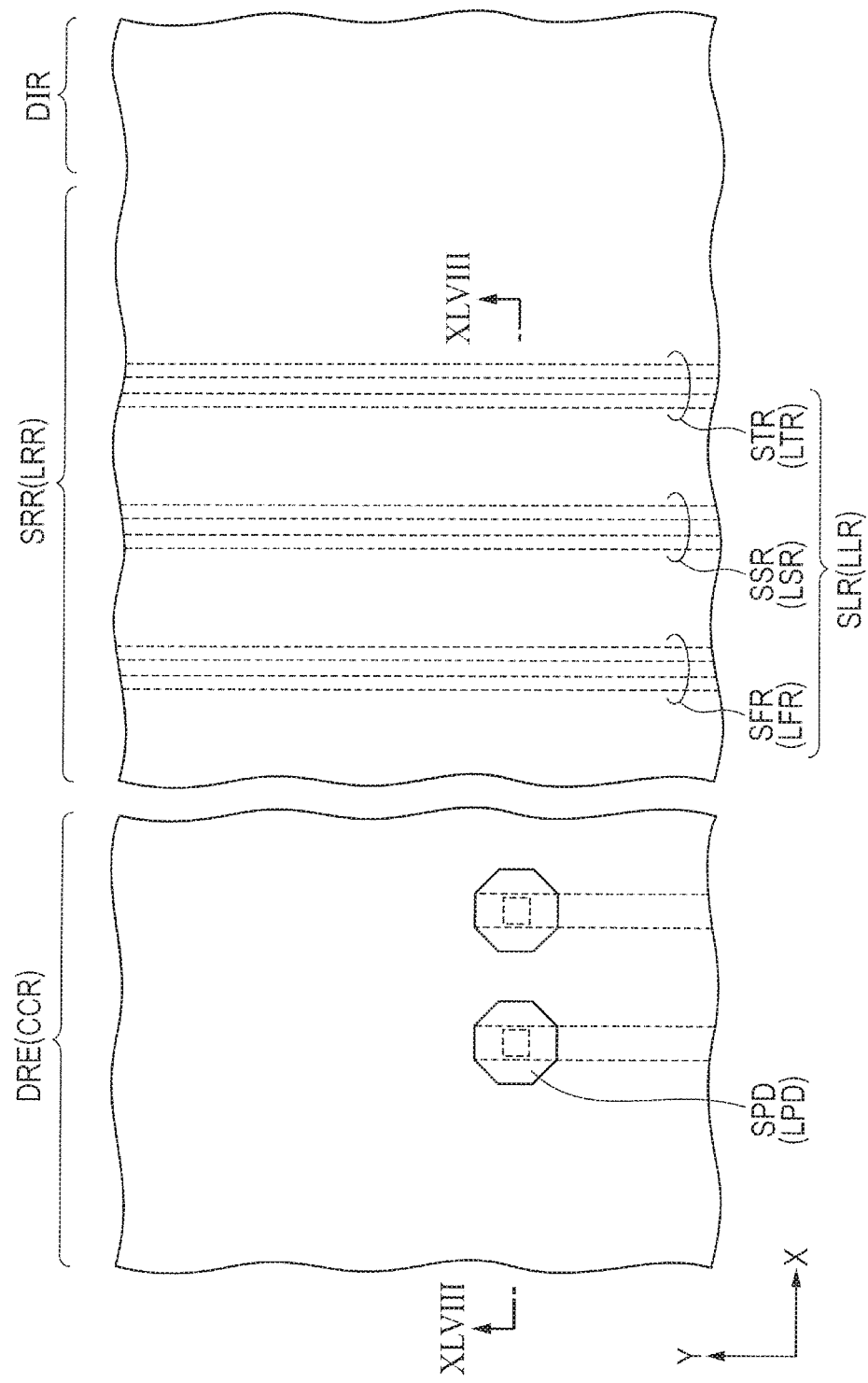
FIG. 47 is a partially-enlarged plan view showing an exemplary planar pattern at a bonded interface of a solid-state imaging device according to the fourth embodiment, the bonded interface being cut out along a dotted frame A shown in FIG. 1.
Figure 48:
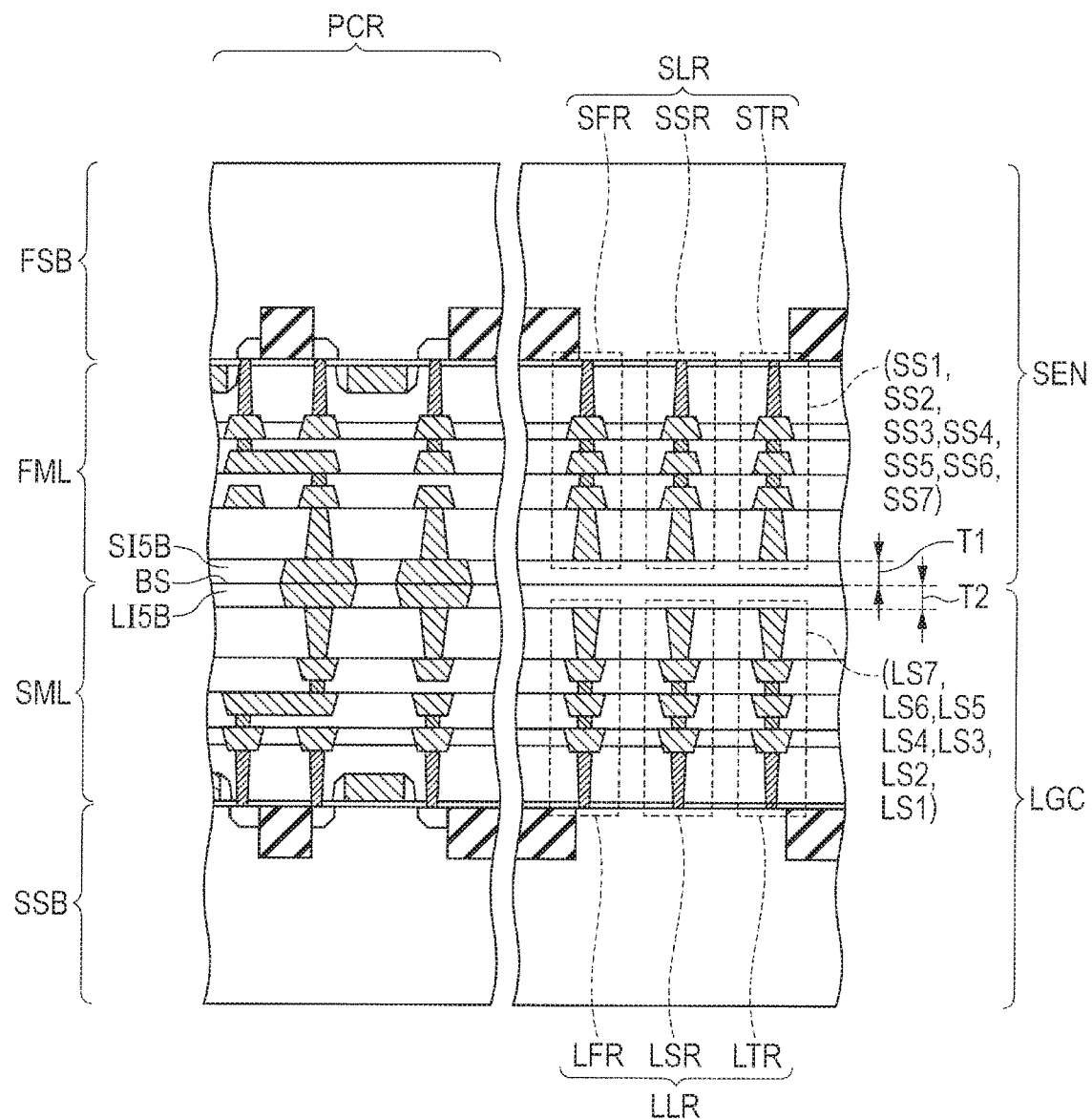
FIG. 48 is a partial cross-sectional view of the solid-state imaging device, taken along a cross-sectional line XLVIII-XLVIII in FIG. 47, according to the fourth embodiment.

An exemplary solid-state imaging device according to the fourth embodiment will be described. As shown in FIGS. 47 and 48, bonding pads SPD (bonding pad LPD) are formed in the device region DRE (circuit region CCR).

In the first seal ring region SRR, each of a first seal ring's first section SFR, a first seal ring's second section SSR, and a first seal ring's third section STR is made up of a first layer portion SS1, a second layer portion SS2, a third layer portion SS3, a fourth layer portion SS4, a fifth layer portion SS5, a sixth layer portion SS6, a seventh layer portion SS7, and an eighth layer portion SS8.

In the second seal ring region LRR, each of a second seal ring's first section LFR, a second seal ring's second section LSR, and a second seal ring's third section LTR is made up of a first layer portion LS1, a second layer portion LS2, a third layer portion LS3, a fourth layer portion LS4, a fifth layer portion LS5, a sixth layer portion LS6, a seventh layer portion LS7, and an eighth layer portion LS8.

A fifth interlayer insulating film's second portion SI5B and a fifth interlayer insulating film's second portion LI5B are interposed between the seventh layer portions SS7 of the first seal ring SLR and seventh layer portions LS7 of the second seal ring LLR. The thickness T1 of the fifth interlayer insulating film's second portion SI5B is equal to the thickness of the bonding pads SPD. The thickness T2 of the fifth interlayer insulating film's second portion LI5B is equal to the thickness of the bonding pads LPD.

Note that the other configurations are the same as the configurations of the solid-state imaging device shown in FIGS. 35 and 36, and therefore the same components are denoted by the same reference symbols or reference numerals, and the description thereof will not be reiterated except as required.

The solid-state imaging device according to the fourth embodiment can be manufactured through the same method (single damascene method) as that for the solid-state imaging device shown in FIG. 35 and other figures, except that it does not have pad-like portions SS8B (pad-like portions LS8B).

In the above-described solid-state imaging device, the fifth interlayer insulating film's second portion SI5B is located in the first seal ring region SRR, while the fifth interlayer insulating film LI5B is located in the second seal ring region LRR. This configuration prevents the area where the first seal ring SLR (second seal ring LLR) is present from being dished. As a result, the sensor substrate SEN and logic substrate LGC can be properly bonded together with improved bonding strength at the bonded interface.

The above-described embodiments have been described in the form of solid-state imaging devices as an example, but can be applied to semiconductor devices with a first substrate and a second substrate, each having predetermined semiconductor elements and other components, bonded together to perform predetermined functions. In addition, the solid-state imaging devices described according to the respective embodiments can be combined in various ways as needed.

It should be further understood by those skilled in the art that although the foregoing description has been made on embodiments of the invention, the invention is not limited thereto and various changes and modifications may be made without departing from the spirit of the invention and the scope of the appended claims.

The first to third embodiments include the following configurations.

(Supplementary Note 1)

A semiconductor device comprising:

a first substrate having a first main surface and a second main surface opposed to each other;

a first region defined over the first main surface of the first substrate;

a first seal ring region defined over the first main surface of the first substrate so as to enclose the first region;

a first structure formed over the first main surface of the first substrate, and including a first seal ring disposed in the first seal ring region so as to enclose the first region in plan view;

a second substrate having a third main surface and a fourth main surface opposed to each other;

a second region defined over the third main surface of the second substrate;

a second seal ring region defined over the third main surface of the second substrate so as to enclose the second region; and a second structure formed over the third main surface of the second substrate, and including a second seal ring disposed in the second seal ring region so as to enclose the second region in plan view, wherein the first structure and the second structure are bonded to each other with the first seal ring and the second seal ring bonded to each other.

The fourth embodiment includes the following configurations.

(Supplementary Note 2)

A method for manufacturing a solid-state imaging device comprising the steps of:

defining a device region including a pixel region and a first seal ring region enclosing the device region over a first main surface of a first substrate having the first main surface and a second main surface opposed to each other;

forming photoelectric conversion units in the pixel region of the first substrate, the photoelectric conversion units performing photoelectric conversion on incident light to generate pixel signals;

forming a first interconnect structure over the first main surface of the first substrate and forming a first seal ring in the first seal ring region, the first interconnect structure including first interconnects and first bonding pads electrically coupled to the photoelectric conversion units;

defining a circuit region and a second seal ring region enclosing the circuit region over a third main surface of a second substrate having the third main surface and a fourth main surface opposed to each other;

forming signal processing circuit units in the circuit region, the signal processing circuit units processing the pixel signals;

forming a second interconnect structure over the third main surface of the second substrate and forming a second seal ring in the second seal ring region, the second interconnect structure including second interconnects and second bonding pads electrically coupled to the signal processing circuit units; and bonding the first interconnect structure and the second interconnect structure to each other with the first bonding pads and the second bonding pads bonded to each other, wherein the step of forming the first interconnect structure including the steps of:

forming a first interlayer insulating film so as to enclose the first seal ring;

forming first pad openings in the first interlayer insulating film; and forming the first bonding pads in the first pad openings, wherein the step of forming the second interconnect structure including the steps of:

forming a second interlayer insulating film so as to enclose the second seal ring;

forming second pad openings in the second interlayer insulating film, and forming the second bonding pads in the second pad openings, and wherein, in the step of bonding the first interconnect structure and the second interconnect structure, the first interconnect structure and the second interconnect structure are bonded to each other with the first interlayer insulating film and the second interlayer insulating film interposed between the first seal ring and the second seal ring.

What is claimed is:

1. A solid-state imaging device comprising:
a first substrate having a first main surface and a second main surface opposed to each other;
a first interconnect structure formed over the first main surface of the first substrate, wherein
a device region and a first seal ring region are defined over the first main surface of the first substrate such that the first seal ring region encloses the device region in plan view,
a pixel region is disposed in the device region in plan view, the pixel region including photoelectric conversion units that perform photoelectric conversion on light incident from the second main surface of the first substrate to generate pixel signals, and
a first seal ring is disposed in the first seal ring region in plan view such that the first seal ring encloses the device region in plan view, the first seal ring being disposed in the first interconnect structure;
a second substrate having a third main surface and a fourth main surface opposed to each other; and
a second interconnect structure formed over the third main surface of the second substrate, wherein
a circuit region and a second seal ring region are defined over the third main surface of the second substrate such that the second seal ring region encloses the circuit region in plan view,
signal processing circuit units formed in the circuit region, the signal processing circuit units processing the pixel signals, and
a second seal ring is disposed in the second seal ring region in plan view so that the second seal ring encloses the circuit region in plan view, the second seal ring being disposed in the second interconnect structure, wherein the first seal ring includes 1) a first section enclosing the device region and 2) a second section disposed such that the first seal ring's second section encloses the first seal ring's first section, wherein the first seal ring's first section includes a first bonding portion to be bonded to the second seal ring, wherein the first seal ring's second section includes a second bonding portion to be bonded to the second seal ring, wherein the first interconnect structure and the second interconnect structure are bonded to each other by bonding the first seal ring and the second seal ring to each other via the first seal ring's first bonding portion and the first seal ring's second bonding portion, wherein the first interconnect structure includes first bonding pads, the first bonding pads being disposed in the device region in plan view, wherein the second interconnect structure includes second bonding pads, the second bonding pads being disposed in the circuit region in plan view, wherein the first bonding pads and the second bonding pads are respectively bonded to electrically couple the photoelectric conversion units to the signal processing circuit units to transmit the pixel signals to the signal processing circuit units, wherein the first bonding pads include a first section and second section, the first bonding pads' first section being spaced apart from the first bonding pad's second section by a first pitch in a first direction, wherein the first seal ring's first bonding portion is spaced apart from the first seal ring's second bonding portion by a first distance in the first direction, and wherein the first distance is set equal to or greater than the first pitch.

2. The solid-state imaging device according to claim 1, wherein the first seal ring's first bonding portion has a first width, wherein each of the first bonding pads has a first size, and wherein the first width is set not to exceed the first size.

3. The solid-state imaging device according to claim 1, wherein the first seal ring includes a third section such that the first seal ring's third section encloses both the first seal ring's first section and the first seal ring's second section, wherein the first seal ring's third section includes a third bonding portion to be bonded to the second seal ring, wherein the first seal ring's first bonding portion has a first width, wherein the first seal ring's second bonding portion has a second width, wherein the first seal ring's third bonding portion has a third width, and wherein the second width is set not to exceed the first width and the third width.

4. The solid-state imaging device according to claim 1, wherein the first seal ring's first bonding portion includes:
first wall-like portions extending and having a first width; and
first pad-like portions disposed with the first wall-like portions and having a first size greater than the first width.

5. The solid-state imaging device according to claim 4, wherein each of the first bonding pads has a second size, and wherein the first size of the first pad-like portions is set not to exceed the second size.

6. The solid-state imaging device according to claim 4, wherein the first pad-like portions are shaped similar to the first bonding pads.

7. The solid-state imaging device according to claim 1, wherein the first seal ring's eighth first bonding portion includes:
   first wall-like portions extending in the form of a wall; and
   first pad-like portions disposed with the first wall-like portions,
wherein the first seal ring's second bonding portion includes:
   second wall-like portions extending in the form of a wall; and
   second pad-like portions disposed with the second wall-like portions,
wherein the first pad-like portions are spaced apart from the second pad-like portions by a second pitch in a second direction, and
wherein the second pitch is set equal to or greater than the first pitch.

8. The solid-state imaging device according to claim 1, wherein the first seal ring's first section includes:
   first pad-like portions serving as the first seal ring's first bonding portion; and
   first wall-like portions extending in the form of a wall, and
wherein a bonded interface between the first interconnect structure and the second interconnect structure is separated from the first wall-like portions by a distance corresponding to a thickness of the first pad-like portions.

9. The solid-state imaging device according to claim 8, wherein the first pad-like portions are coupled to the first wall-like portions.

10. The solid-state imaging device according to claim 8, wherein a dicing region is defined relative to the device region over the first substrate, and
wherein the first pad-like portions are disposed in proximity to the dicing region with respect to the first wall-like portions are.

11. A solid-state imaging device comprising:
   a first substrate having a first main surface and a second main surface opposed to each other;
   a device region defined over the first main surface of the first substrate, and including a pixel region;
   a first seal ring region defined over the first main surface of the first substrate so as to enclose the pixel region;
   photoelectric conversion units formed in the pixel region, and performing photoelectric conversion on incident light to generate pixel signals;
   a first interconnect structure formed over the first main surface of the first substrate, and including first bonding pads disposed in the device region in plan view, and a first seal ring disposed in the first seal ring region so as to enclose the device region in plan view;
   a second substrate having a third main surface and a fourth main surface opposed to each other;
   a circuit region defined over the third main surface of the second substrate;
   a second seal ring region defined over the third main surface of the second substrate so as to enclose the circuit region;
   signal processing circuit units formed in the circuit region, and processing the pixel signals; and
   a second interconnect structure formed over the third main surface of the second substrate, and including second bonding pads disposed in the circuit region in plan view, and a second seal ring disposed in the second seal ring region so as to enclose the circuit region in plan view,
wherein the first interconnect structure and the second interconnect structure are bonded to each other with the first bonding pads and the second bonding pads bonded to each other,
wherein a bonded interface between the first interconnect structure and the second interconnect structure is separated from the first seal ring by a distance corresponding to a thickness of the first bonding pads, and
wherein the bonded interface is separated from a part of the second seal ring by a distance corresponding to a thickness of the second bonding pads, wherein the part of the second seal is being a part of the second seal ring that is closest to the bonded interface.

* * * * *